US00RE50280E

(19) United States
(12) Reissued Patent
Kim et al.

(10) Patent Number: US RE50,280 E
(45) **Date of Reissued Patent: *Jan. 21, 2025**

(54) SEMICONDUCTOR MEMORY DEVICE HAVING INSULATION PATTERNS AND CELL GATE PATTERNS

(71) Applicant: Samsung Electronics Co., Ltd., Suwon-si (KR)

(72) Inventors: Jingyun Kim, Yongin-si (KR); Myoungbum Lee, Seoul (KR); Kihyun Hwang, Seongnam-si (KR)

(73) Assignee: Samsung Electronics Co., Ltd. (KR)

( * ) Notice: This patent is subject to a terminal disclaimer.

(21) Appl. No.: 17/840,850

(22) Filed: Jun. 15, 2022

Related U.S. Patent Documents

Reissue of:
(64) Patent No.: 8,084,819
Issued: Dec. 27, 2011
Appl. No.: 12/650,137
Filed: Dec. 30, 2009

(30) Foreign Application Priority Data

Dec. 31, 2008 (KR) ..... 10-2008-137864

(51) Int. Cl.
*H10B 43/27* (2023.01)
*H10B 41/10* (2023.01)
*H10B 41/27* (2023.01)
*H10B 43/10* (2023.01)

(52) U.S. Cl.
CPC ..... *H10B 43/27* (2023.02); *H10B 43/10* (2023.02); *H10B 41/10* (2023.02); *H10B 41/27* (2023.02)

(58) Field of Classification Search
CPC ..... H10B 43/27; H10B 43/10; H10B 41/10; H10B 41/27
See application file for complete search history.

(56) References Cited

U.S. PATENT DOCUMENTS

| | | | | |
|---|---|---|---|---|
| 5,480,820 | A * | 1/1996 | Roth | H10B 69/00 438/257 |
| 7,271,444 | B2 * | 9/2007 | Furukawa et al. | 257/347 |
| 10,211,219 | B2 | 2/2019 | Kito et al. | |
| 2005/0127466 | A1 | 6/2005 | Furukawa et al. | |
| 2006/0186446 | A1 * | 8/2006 | Kim | H01L 29/7923 257/296 |
| 2007/0158736 | A1 | 7/2007 | Arai et al. | |
| 2008/0173928 | A1 | 7/2008 | Arai et al. | |
| 2009/0108333 | A1 * | 4/2009 | Kito | H01L 29/7881 438/591 |
| 2009/0230459 | A1 | 9/2009 | Kito et al. | |

(Continued)

FOREIGN PATENT DOCUMENTS

| | | |
|---|---|---|
| CN | 1627487 A | 6/2005 |
| JP | 10-093083 | 4/1998 |
| JP | 2003007868 A | 1/2003 |

(Continued)

*Primary Examiner* — Minh Nguyen
(74) *Attorney, Agent, or Firm* — Myers Bigel, P.A.

(57) ABSTRACT

Semiconductor memory devices and methods of forming semiconductor memory devices are provided. The methods may include forming insulation layers and cell gate layers that are alternately stacked on a substrate, forming an opening by successively patterning through the cell gate layers and the insulation layers, and forming selectively conductive barriers on sidewalls of the cell gate layers in the opening.

19 Claims, 37 Drawing Sheets

(56) References Cited

U.S. PATENT DOCUMENTS

| | | | | |
|---|---|---|---|---|
| 2010/0155810 | A1* | 6/2010 | Kim et al. | 257/316 |
| 2010/0155818 | A1* | 6/2010 | Cho | H01L 27/088<br>257/E21.21 |

FOREIGN PATENT DOCUMENTS

| | | | |
|---|---|---|---|
| JP | 2007-180389 | | 7/2007 |
| JP | 2007180389 | A | 7/2007 |
| JP | 2007266143 | A | 10/2007 |
| JP | 2007-317874 | | 12/2007 |
| JP | 2007317874 | A | 12/2007 |
| JP | 2008159699 | A | 7/2008 |
| JP | 2008171968 | A | 7/2008 |
| JP | 2009224468 | A | 10/2009 |

* cited by examiner

SEMICONDUCTOR MEMORY DEVICE HAVING INSULATION PATTERNS AND CELL GATE PATTERNS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

*This U.S. nonprovisional patent application is a reissue of U.S. patent application Ser. No. 12/650,137, filed on Dec. 30, 2009, now U.S. Pat. No. 8,084,819.* This U.S. nonprovisional patent application claims priority under 35 U.S.C. §119 of Korean Patent Application 10-2008-137864, filed on Dec. 31, 2008, the entire contents of which are hereby incorporated by reference.

BACKGROUND

Various embodiments relate to semiconductor devices and methods of forming the same, and, more particularly, to semiconductor memory devices and methods of forming the same.

In semiconductor devices, the semiconductor memory device can store digital data. As electronics industries and semiconductor industries advance, high integration of the semiconductor memory device is increasingly required. For instance, the development of mobile electronics equipment such as a laptop computer, a mobile phone, a digital camera, or MP3 player increasingly demands that the semiconductor memory device be capable of storing more data. In order to satisfy user demands, a more integrated semiconductor memory device is required.

Generally, high integration of the semiconductor memory device is achieved by decreasing a minimum line width of the fine patterns of fabricated devices. By decreasing two-dimensionally the minimum line width of the fine patterns, memory cells may be more highly integrated in a limited area. However, the ability to decrease the minimum line width is limited due to various factors (e.g., limitations of the photolithography process). Furthermore, the decrease in the line width of the fine patterns results in characteristic deterioration of the fine patterns and reliability deterioration. A semiconductor memory device that can overcome these problems is desired.

SUMMARY

Various embodiments are directed to a highly integrated semiconductor memory device and methods of forming the highly integrated semiconductor memory device.

Various embodiments are also directed to a highly integrated three-dimensional semiconductor memory device and methods of forming the highly integrated three-dimensional semiconductor memory device.

Various embodiments are also directed to a semiconductor memory device having improved reliability and methods of forming the semiconductor memory device.

Various embodiments of the present invention provide methods of forming a semiconductor memory device, including: forming insulation layers and cell gate layers that are alternately stacked on a substrate; forming an opening by successively patterning through the cell gate layers and the insulation layers; forming conductive barriers on sidewalls of the cell gate layers in the opening by carrying out a nitridation process; forming sequentially a blocking insulation layer, a charge storage layer, and a tunnel insulation layer on sidewalls of the insulation layers and sidewalls of the conductive barriers in the opening; and forming an active pattern extending upward from the substrate in the opening.

In some embodiments, the cell gate layers may contain metals, and the conductive barriers may contain metal nitrides.

In some embodiments, the methods may further include carrying out a metallization process on the cell gate layers exposed in the opening before carrying out the nitridation process. In this case, the cell gate layers may contain doped Group 4A elements, and metallized parts of the cell gate layers may be formed of Group 4A element-metal compounds.

In some embodiments, carrying out the metallization process may include: forming a metal layer coming in contact with the sidewalls of the cell gate layers exposed in the opening; reacting the metal layer to the cell gate layers; and removing an unreacted metal layer.

In some embodiments, the nitridation process may be carried out on the metallized parts of the cell gate layers, and the conductive barriers may contain Group 4A element-metal nitrides.

In some embodiments, the methods may further include forming undercut regions by recessing sideward the sidewalls of the cell gate layers in the opening as compared to the sidewalls of the insulation layers, before carrying out the nitridation process.

In some embodiments, each of the conductive barriers, at least part of the blocking insulation layer, and at least part of the charge storage layer may be formed in each undercut region.

In some embodiments, the methods may further include removing the charge storage layer outside at least the undercut region before forming the active pattern.

In some embodiments, the tunnel insulation layer may be formed after removing the charge storage layer outside the undercut region.

In some embodiments, the opening may form a hole, and the cell gate layers may be formed to have a planar surface.

In some embodiments, the opening may form a groove, and the cell gate layers may form a line extending in one direction in parallel with an upper surface of the substrate.

Other embodiments of the present invention provide a semiconductor memory device including: insulation patterns and cell gate patterns that are alternately stacked on a substrate; an active pattern disposed on the substrate and extending upward along sidewalls of the insulation patterns and sidewalls of the cell gate patterns; a charge storage layer interposed between the sidewall of the cell gate pattern and the active pattern; a blocking insulation layer interposed between the sidewall of the cell gate pattern and the charge storage layer; a tunnel insulation layer interposed between the charge storage layer and the active pattern; and a conductive barrier interposed between the blocking insulation layer and the sidewall of the cell gate pattern and containing nitrogen.

In other embodiments, the cell gate pattern may contain metals, and the conductive barrier may contain metal nitrides. In some cases, the cell gate pattern and the conductive barrier may contain the same metals.

In other embodiments, a part of at least the cell gate pattern coming in contact with the conductive barrier may contain Group 4A element-metal compounds, and the conductive barrier may contain Group 4A element-metal nitrides. In some cases, the Group 4A element-metal compounds and the conductive barrier may contain the same Group 4A elements and the same metals.

In other embodiments, the conductive barrier may be recessed sideward as compared to the sidewalls of the insulation patterns to define undercut regions. In some cases, the charge storage layers may be disposed in the undercut regions, respectively, and the charge storage layers disposed in adjacent undercut regions may be isolated from each other.

In other embodiments, the tunnel insulation layer may extend into successive undercut regions to be disposed between the charge storage layers that are isolated from each other and the active pattern.

In other embodiments, the active pattern may be disposed in a hole penetrating successively through the insulation patterns and the cell gate patterns, and the cell gate patterns may have a planar surface.

In other embodiments, the cell gate patterns may form lines extending along one direction in parallel with an upper surface of the substrate.

BRIEF DESCRIPTION OF THE DRAWINGS

The accompanying drawings are included to provide a further understanding of the various embodiments. The drawings illustrate various embodiments of the present invention and, together with the description, serve to explain principles of the present invention. In the drawings.

DETAILED DESCRIPTION OF EMBODIMENTS

Figure 1:
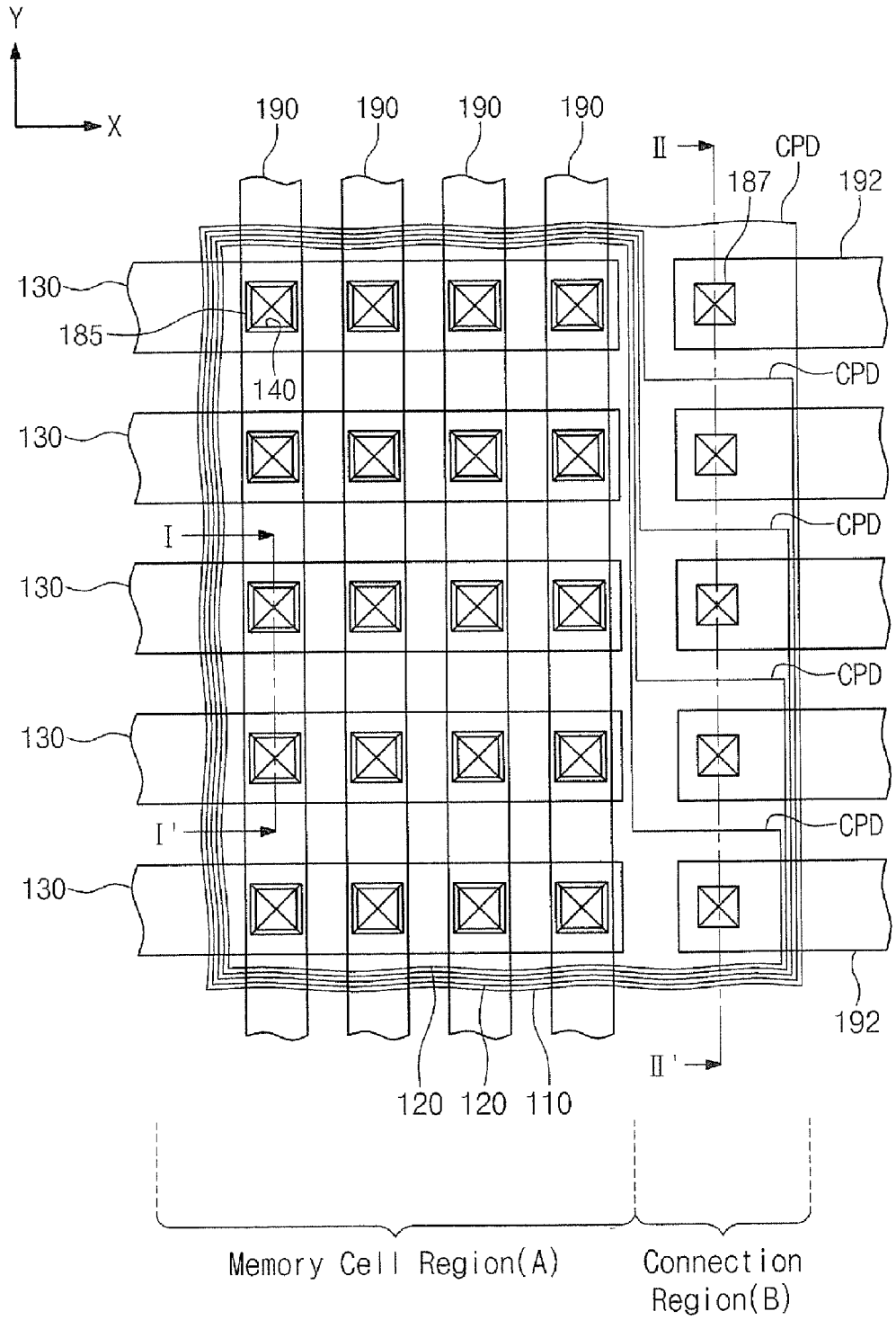
FIG. 1 is a plan view illustrating a semiconductor memory device according to some embodiments of the present invention.

Various embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, the thicknesses of layers and/or regions may have been exaggerated for clarity. It will be understood that when a layer is referred to as being "on" another layer, it may be directly on the other layer or intervening layers may be present. As used herein, the term "and/or" includes any and all combinations of one or more of the associated listed items. Like numbers refer to like elements throughout the specification.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular example embodiments only and is not intended to be limiting of the present invention. As used herein, the singular fowls "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
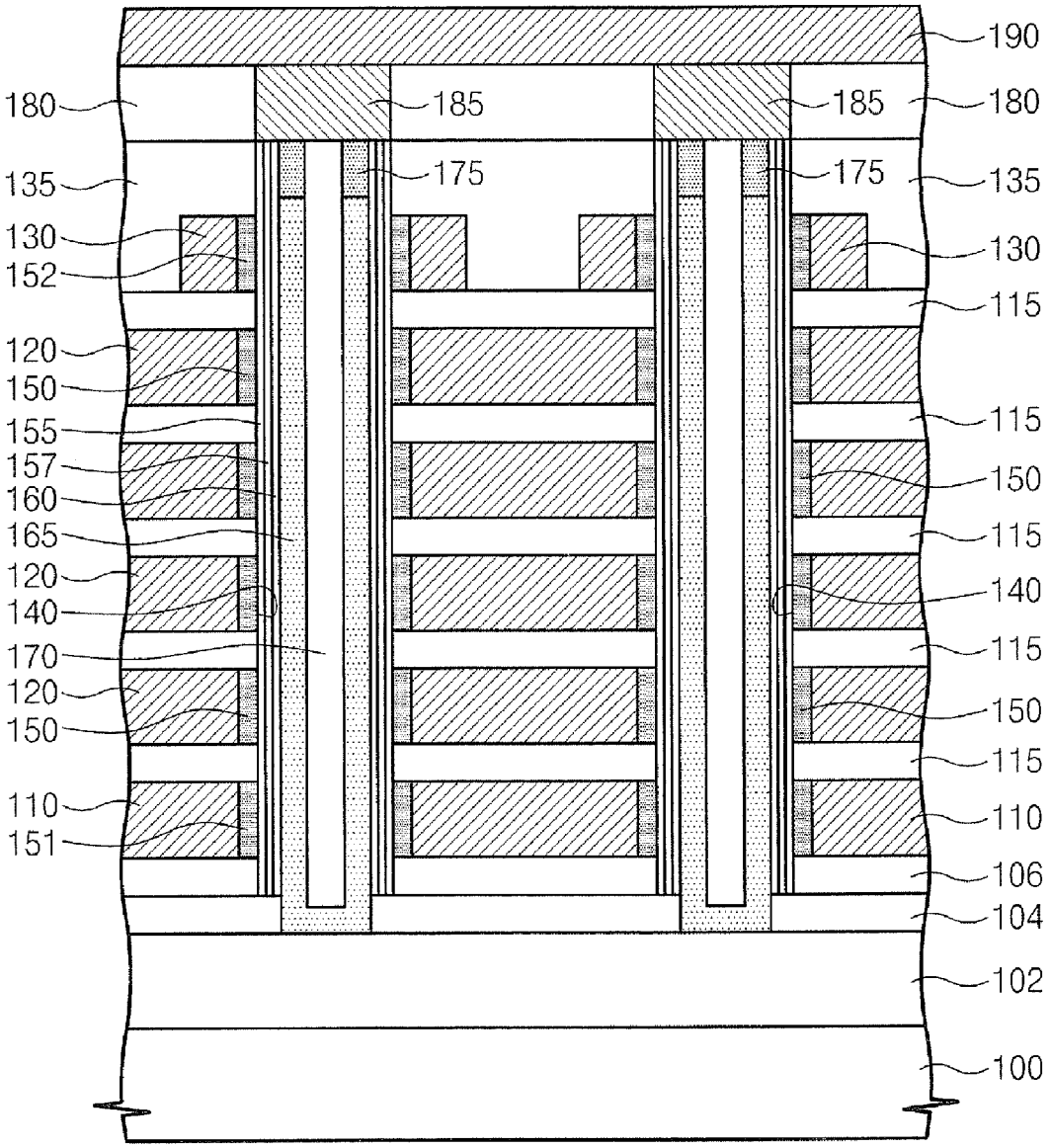
FIG. 2A is a cross-sectional view taken along a line I-I' of FIG. 1.
Figure 2B:
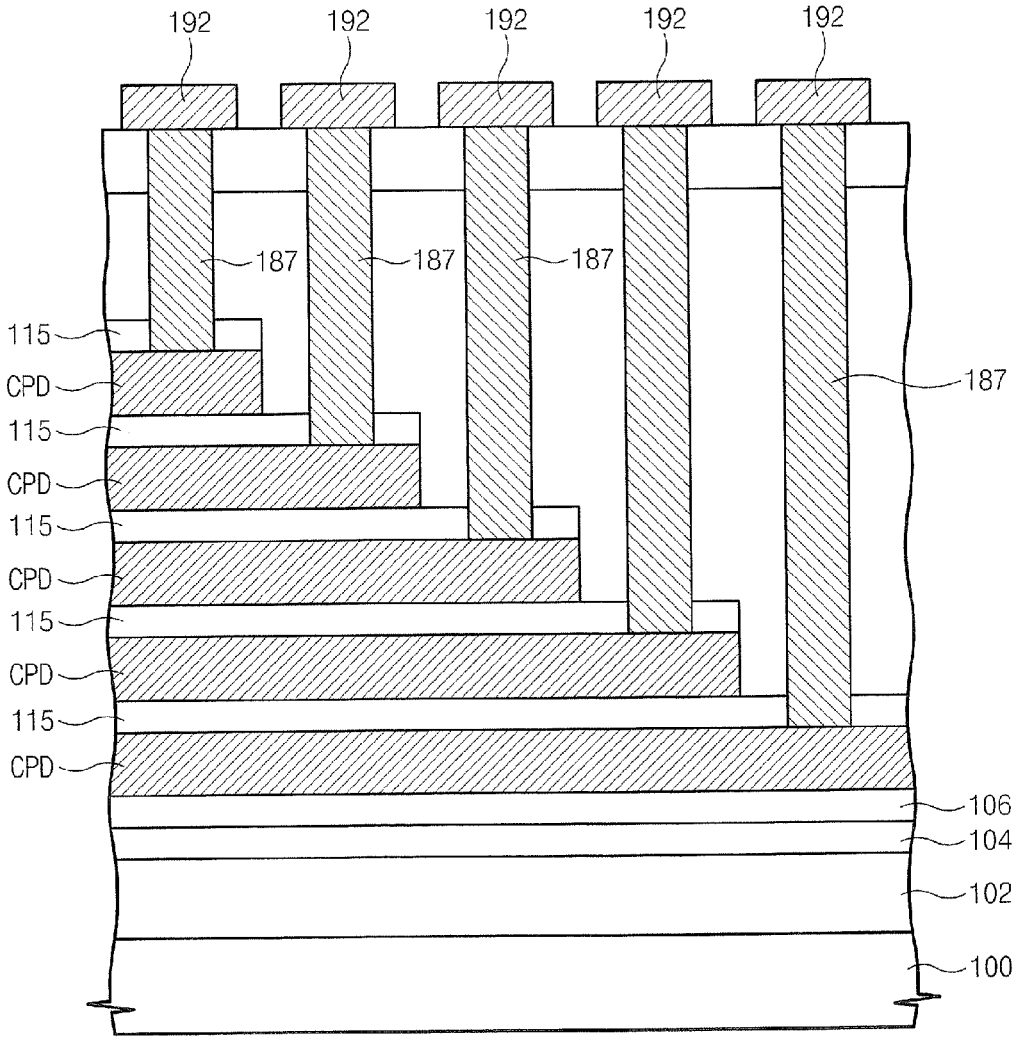
FIG. 2B is a cross-sectional view taken along a line II-II' of FIG. 1.

FIG. 1 is a plan view illustrating a semiconductor memory device according to some embodiments of the present invention, FIG. 2A is a cross-sectional view taken along a line I-I' of FIG. 1, and FIG. 2B is a cross-sectional view taken along a line II-II' of FIG. 1.

Referring to FIGS. 1 and 2A, a semiconductor substrate 100 ("substrate") may include a memory cell region A and a connection region B. Memory cells are disposed in the memory cell region B. The substrate 100 may further include a peripheral circuit region (not illustrated) in which peripheral circuits are disposed to operate the memory cells. Structures to connect the memory cells to the peripheral circuits may be disposed in the connection region B.

A well region 102, which is doped with a first-conductive-type dopant, is disposed in the memory cell region A. A common source region 104, which is doped with a second-conductive-type dopant, is disposed in the well region 102. An upper surface of the common source region 104 may be the same height as that of the substrate 100. The well region 102 may extend to the connection region B. Furthermore, the common source region 104 may also extend to the connection region B. The first-conductive-type dopant may be of inverse type to the second-conductive-type dopant. For example, the first-conductive-type dopant may be p-type dopant, while the second-conductive-type dopant may be n-type dopant. Conversely, the first-conductive-type dopant may be n-type dopant, while the second-conductive-type dopant may be p-type dopant.

A plurality of insulation patterns 115 and a plurality of cell gate patterns 120 may be alternately stacked on the substrate 100 of the memory cell region A. The cell gate patterns 120 may have a planar surface. A first selection gate pattern 110 is interposed between the lowest one of the cell gate patterns 120 and the substrate 100. Like the cell gate patterns 120, the first selection gate pattern 110 may also have a planar surface. The lowest one of the insulation patterns 115 is interposed between the lowest one of the cell gate patterns 120 and the first selection gate pattern 110. A base insulation layer 106 is interposed between the first selection gate pattern 110 and the substrate 100. A second selection gate pattern 130 is disposed on the uppermost one of the insulation patterns 115. The second selection gate patterns 130 extend in parallel with each other along a first direction. The first direction is along an X-axis in FIG. 1. The second selection gate patterns 130 may be spaced apart from each other at regular intervals in a second direction vertical to the first direction (X-axis). The second direction is along a Y-axis in FIG. 1.

The flat-shaped cell gate patterns 120 and first selection gate pattern 110 may extend in a transverse direction, thereby being disposed on the substrate 100 of the connection region B. Portions of the gate patterns 120 and 110 extending to the connection region B are defined as a connection pad ("CPD"). The CPD extending to the connection region B will be described in detail with reference to FIG. 2B.

Referring to FIGS. 1 and 2B, the insulation patterns 115 also may extend in the transverse direction, thereby being disposed on the connection region B. The insulation patterns 115 extending to the connection region B are interposed between the CPDs to make the CPDs insulated. As the height of the CPDs increases in the connection region B, the plane area of the CPDs may gradually be reduced. In addition, the CPDs may include overlapped regions. For this reason, the CPDs may be formed in a staircase structure. The CPD of the first selection gate pattern 110 has the largest plane area, while the CPD of the uppermost one of the cell gate patterns 120 has the smallest plane area. The CPDs may have a staircase structure that progresses upward in the second direction (Y-axis). That is, the CPDs may have a staircase structure that progresses upward along one side of the gate patterns 110, 120, and 130. This can minimize the plane area of the connection region B.

If the CPDs have the staircase structure that progresses upward in the direction farther away from the gate patterns 110, 120 and 130, the plane area of the CPDs may increase. However, according to some embodiments of the present invention, the CPDs have the staircase structure that progresses upward along one side of the gate patterns 110, 120, and 130, thereby minimizing the plane area of the connection region B.

Referring to FIGS. 1, 2A, and 2B, a first interlayer insulation layer 135 may be disposed on the entire surface of substrate 100. The first interlayer insulation layer 135 covers the gate patterns 110, 120, and 130. Moreover, the first interlayer insulation layer 135 covers the CPDs.

An opening 140 may penetrate the first interlayer insulation layer 135, the second selection gate pattern 130, the insulation patterns 115, the cell gate patterns 120, the first selection gate pattern 110, and the base insulation layer 106 in succession, and an active pattern 165 may be disposed in the opening 140. The active pattern 165 is disposed on the substrate 100 in the opening 140 to extend upwardly along sidewalls of the gate patterns 110, 120, and 130 and sidewalls of the insulation patterns 115. The opening 140 may be a form of hole, as illustrate in FIG. 1. In the memory cell region, a plurality of openings 140 may two-dimensionally be arranged along rows and columns. A plurality of active patterns 165 is disposed in the plurality of openings 140. As illustrated in FIG. 1, the opening 140 may have a square planar shape. Alternatively, the opening 140 may have various shapes, for example, planar circle, oval, and polygon.

Referring to FIGS. 2A and 2B, the active pattern 165 may be formed of Group 4A (or Group 14) elements of a periodic table. For instance, the active pattern 165 may be formed of silicon, germanium, or silicon-germanium. The active pattern 165 may have an undoped state or a doped state with the first-conductive-type dopant. The active pattern 165 may be a form of pipe whose inside is empty. The active pattern 165 adjacent to a bottom of the opening 140 may have a closed state, while the active pattern 165 adjacent to an upper end of the opening 140 may have an opened state. A filling insulation pattern 170 may fill the inside of the active pattern 165. Alternatively, the active pattern 165 may be a form of pillar that fills the opening 140. When the active pattern 165 is the form of pillar, the filling insulation pattern 170 may be omitted.

A drain region 175, which is doped with a second-conductive-type dopant, is disposed at the upper end of the active pattern 165. The lower surface of the drain region 175 may have a height close to the upper surface of the second selection gate pattern 130. The lower end of the active pattern 165 comes in contact with the common source region 104. Furthermore, the active pattern 165 may come in contact with the well region 102 in addition to the common source region 104. The opening 140 extends downwardly to penetrate the common source region 104, and the active pattern 165 also extends downwardly to come in contact with the well region 102.

A charge storage layer 157 may be interposed between a sidewall of the cell gate pattern 120 in the opening 140 and the active pattern 165. A blocking insulation layer 155 is interposed between the charge storage layer 157 and the sidewall of the cell gate pattern 120, and a tunnel insulation layer 160 is interposed between the charge storage layer 157 and the active pattern 165. The charge storage layer 157 may include insulating materials having traps capable of storing charges. For example, the charge storage layer 157 may include nitride, oxynitride, metal oxide (e.g., hafnium oxide and so on), and/or insulator including nano dots. The nano dots may include metals or Group 4A elements. The tunnel insulation layer 160 may include at least one selected from oxide, nitride, and oxynitride. The blocking insulation layer 155 may include the same insulation material as the tunnel insulation layer 160 or the insulation material having a higher dielectric constant than the tunnel insulation layer 160. For example, the blocking insulation layer 155 may include a single-layered or multi-layered insulation metal oxide (e.g., aluminum oxide, hafnium oxide, or lanthanum oxide). Alternatively, the blocking insulation layer 155 may include oxide. When both of the blocking insulation layer 155 and the tunnel insulation layer 160 are formed of oxide, the blocking insulation layer 155 may be thicker than the tunnel insulation layer 160. According to some embodiments of the present invention, the blocking insulation layer 155 may be thicker than the tunnel insulation layer 160 in effective oxide thickness ("EOT"). Here, the EOT is a value that estimates the thickness of dielectrics having a dielectric constant other than silicon dioxide ($SiO_2$) in terms of silicon dioxide ($SiO_2$). The EOT may be used in estimating the performance of new dielectrics having a different dielectric constant.

The blocking insulation layer 155, the charge storage layer 157, and the tunnel insulation layer 160, which are interposed respectively between the first selection gate pattern 110 and the active pattern 165, may be utilized as a first gate insulation layer of a first selection transistor. Likewise, the blocking insulation layer 155, the charge storage layer 157, and the tunnel insulation layer 160, which are interposed respectively between the second selection gate pattern 130 and the active pattern 165, may be utilized as a second gate insulation layer of a second selection transistor.

As illustrated in FIG. 2A, blocking insulation layers 155 may extend in parallel with each other, thereby being disposed between the plurality of gate patterns 110 and the active pattern 165. Likewise, the charge storage layer 157 and the tunnel insulation layer 160 also extend in parallel with each other, thereby being disposed between the plurality of cell gate patterns 120 and the active pattern 165.

A conductive barrier 150 may be interposed between the sidewall of the cell gate pattern 120 in the opening 140 and the blocking insulation layer 155. The conductive barrier 150 prevents or inhibits the reaction and interaction between the cell gate pattern 120 and the blocking insulation layer 155. The conductive barrier 150 may include conductive materials having a very low reactivity. For example, the conductive barrier 150 may include nitrogen. More specifically, the conductive barrier 150 may include conductive nitride. The cell gate pattern 120 may include conductive materials having a lower resistivity than the conductive barrier 150. For example, the cell gate pattern 120 may include metal. When the cell gate pattern 120 includes metal, the conductive barrier 150 may include metal nitride. Also, the cell gate pattern 120 and the conductive barrier 150 may include the same metal. For instance, when the cell gate pattern 120 includes tungsten, the conductive barrier 150 may include tungsten nitride. Alternatively, when the cell gate pattern 120 includes titanium or tantalum, the conductive barrier 150 may include titanium nitride or tantalum nitride.

The conductive barrier 150 may be disposed over the sidewall of the cell gate pattern 120 in the opening 140. For example, an interface between the conductive barrier 150 and the cell gate pattern 120 may be non-parallel with the upper surface of the substrate 100. The interface may substantially be vertical to the upper surface of the substrate 100. The conductive barriers 150 may be isolated from each other.

A first selective-conductive barrier 151 may be interposed between the sidewall of the first selection gate pattern 110 in the opening 140 and the first gate insulation layer 155, 157 and 160. The first selective-conductive barrier 151 may prevent or inhibit the reaction between the first selection gate pattern 110 and the first gate insulation layer 155, 157, and 160. The first selective-conductive barrier 151 may include conductive materials having a very low reactivity. For example, the first selective-conductive barrier 151 may include conductive nitride containing nitrogen. When the first selection gate pattern 110 includes metal, the first selective-conductive barrier 151 may include metal nitride containing the same metal as the first selection gate pattern 110. Likewise, a second selective-conductive barrier 152 may be interposed between the sidewall of the second selection gate pattern 130 in the opening 140 and the second gate insulation layer 155, 157 and 160. The second selective-conductive barrier 152 may prevent or inhibit a reaction between the second selection gate pattern 130 and the second gate insulation layer 155, 157, and 160. The second selective-conductive barrier 152 may include conductive nitride containing nitrogen. When the second selection gate pattern 130 includes a metal, the second selective-conductive barrier 152 may include metal nitride containing the same metal as the second selection gate pattern 130. The selective-conductive barriers 151 and 152 and the conductive barrier 150 are isolated from each other.

The first and second selection gate patterns 110 and 130 may include the same metal nitride as the cell gate pattern 120. In this case, the conductive barrier 150 and the selective-conductive barriers 151 and 152 may include the same metal nitride. Alternatively, when the first and second selection gate patterns 110 and 130 include metals different from those of the cell gate pattern 120, the first and second selective-conductive barriers 151 and 152 may include metals different from those of the conductive barrier 150. Consequently, the first and second selective-conductive barriers 151 and 152 may be different in work function from the conductive barrier 150.

A memory cell may include the cell gate pattern 120, the conductive barrier 150, the blocking insulation layer 155, the charge storage layer 157, and the tunnel insulation layer 160. In addition, the memory cell may include a cell channel region. The cell channel region may include the sidewall of the active pattern 165 overlapped with the cell gate pattern 120. The threshold voltage of the memory cell may be changed by the quantity of charges stored in the charge storage layer 157. Using the change of threshold voltage, the memory cell may store data. The memory cell may store 1-bit or multi-bit data according to the quantity of charges stored in the charge storage layer 157. The charges stored in the charge storage layer 157 may be isolated from one another by traps of the charge storage layer 157 and/or the blocking insulation layer 155 and the tunnel insulation layer 160. Consequently, the memory cell may include nonvolatile characteristics that keep retaining data even though the power supply is interrupted. Therefore, the semiconductor memory device according to the embodiments of the present invention may be a nonvolatile memory device.

The first selection gate pattern 110 may be provided in a first selection transistor, and the second selection gate pattern 130 may be provided in a second selection transistor. The first selection transistor may include the first selection gate pattern 110, the first selective-conductive barrier 151, and the first gate insulation layer 155, 157 and 160; and the second selection transistor may include the second selection gate pattern 130, the second selective-conductive barrier 152, and the second gate insulation layer 155, 157 and 160. During the operation of the semiconductor memory device, inversion layers may be formed at the active pattern 165 between the gate patterns 110, 120, and 130 by the fringe field of the gate patterns 110, 120, and 130. By the inversion layers, the selection transistors and the memory cells may be connected to each other in series.

As described above, according to some embodiments of the present invention, the first and second selective-conductive barriers 151 and 152 may be different in work function from the conductive barrier 150 of the cell gate pattern 120. Owing to the difference of work function, both characteristics of the first and second selection transistors and characteristics of the memory cell can be optimized. For instance, when the selection transistors and the memory cell are an NMOS type, the work function of the first and second selective-conductive barriers 151 and 152 may be larger than that of the conductive barrier 150. Consequently, the threshold voltage of the first and second selection transistors may be higher than that of an erased memory cell. This can minimize the amount of off-leakage current to improve reliability of the semiconductor memory device. Therefore, a semiconductor memory device having good characteristics can be provided by adjusting the work function of the selective-conductive barriers 151 and 152 and the conductive barrier 150.

The first selection transistor, the plurality of memory cells, and the second selection transistor are upwardly stacked along the sidewall of the active pattern 165. The first selection transistor, the plurality of memory cells, and the second selection transistor formed at the active pattern 165 are provided in a vertical-type cell string. A plurality of vertical-type cell strings is arranged on the substrate 100 of the memory cell region A in rows and columns.

A second interlayer insulation layer 180 may be disposed on the entire surface of the substrate 100. Bit lines 190 are disposed on the second interlayer insulation layer 180 of the memory cell region A. The bit lines 190 intersect the second selection gate patterns 130. That is, the bit lines 190 extend in parallel with each other along the second direction (Y-axis). The bit lines 190 are electrically connected to the drain regions 175 through bit line plugs 185 penetrating the second interlayer insulation layer 180. One bit line 190 may be electrically connected to the plurality of drain regions 175 arranged in a column along the second direction (Y-axis). By the bit lines 190 and the second selection gate patterns 130 intersecting with each other, one of the active patterns 165 may be selected. Moreover, it may select one memory cell in the cell string of the selected active pattern 165 by selecting one of the cell gate patterns 120.

Meanwhile, connection plugs 187 successively penetrate the second and first interlayer insulation layers 180 and 135 of the connection region B and are connected to the CPDs. According to some embodiments of the present invention, connection wirings 192 may be disposed on the second interlayer insulation layer 180 of the connection region B and connected to the connection plugs 187. The connection wirings 192 extend to electrically connect with peripheral circuits of the peripheral circuit region.

The above-described semiconductor memory device may have a three-dimensional structure including the vertical-typed cell strings, thereby achieving high integration.

Furthermore, the conductive barrier 150 including nitrogen is disposed between the cell gate pattern 120 and the blocking insulation layer 155. The conductive barrier 150 is disposed over the sidewall of the cell gate pattern 120, thereby preventing or inhibiting the reaction between the cell gate pattern 120 and the blocking insulation layer 155. For this reason, it can realize the semiconductor memory device having good reliability.

When the cell gate pattern including metal comes in contact with the blocking insulation layer, the metal of the cell gate pattern may be diffused into the blocking insulation layer. This makes the characteristics of the blocking insulation layer deteriorate to reduce the reliability of the semiconductor memory device. However, according to some embodiments of the present invention, since the conductive barrier 150 is disposed between the cell gate pattern 120 and the blocking insulation layer 155, it may prevent or inhibit the reaction between the cell gate pattern 120 and the blocking insulation layer 155 to result in the semiconductor memory device having good reliability.

Next, some embodiments of the semiconductor memory device of the present invention will be described with reference to FIGS. 3A to 3C. These examples are similar to the semiconductor memory device described with reference to FIGS. 2A and 2B. Accordingly, with respect to the duplicated technical features, the description will be omitted hereinafter for brevity. The same reference numerals can be denoted to the same component as in FIGS. 2A and 2B.

Figure 3A:
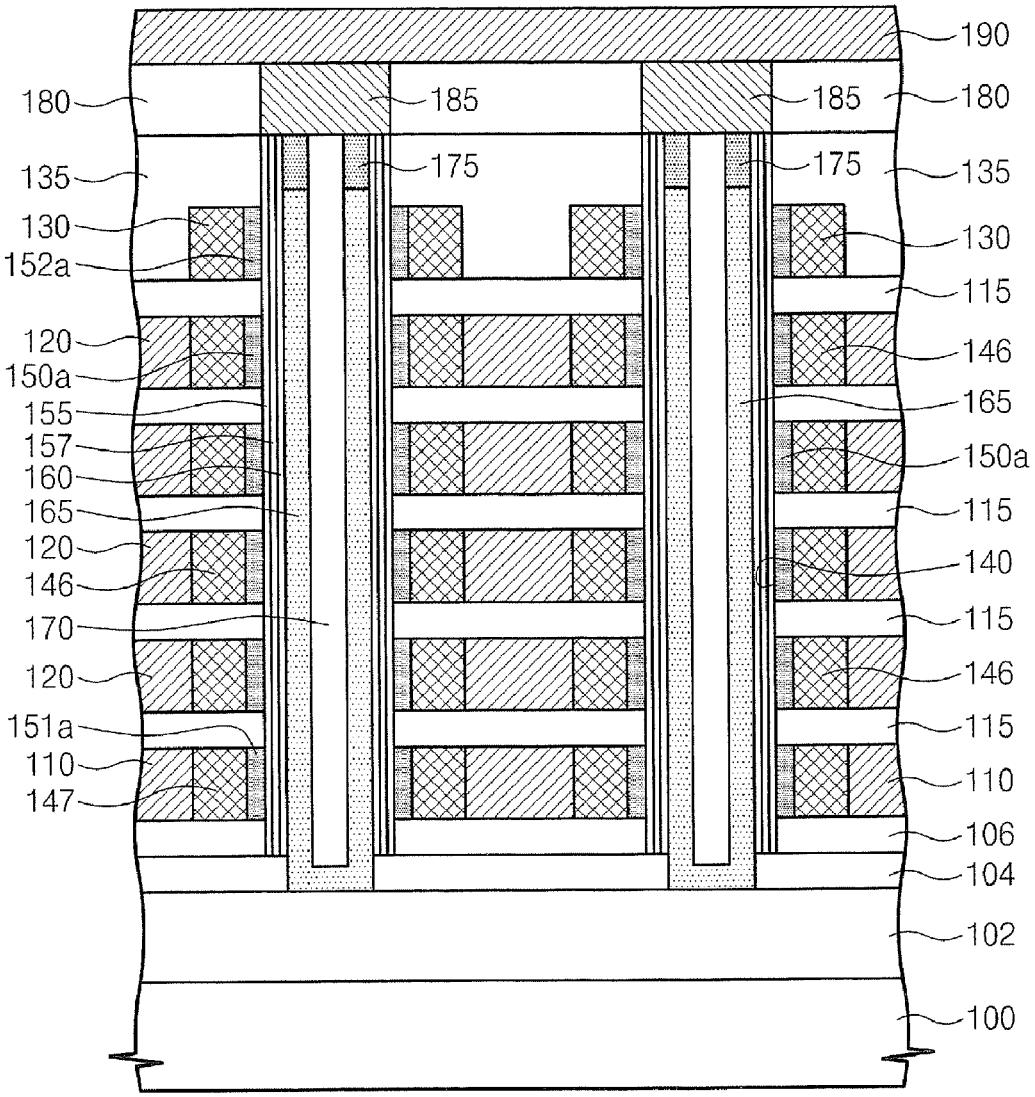
FIG. 3A is a cross-sectional view taken along the line I-I' of FIG. 1 to explain one modification example of the semiconductor memory device according to some embodiments of the present invention.

FIG. 3A is a cross-sectional view taken along the line I-I' of FIG. 1 to explain some embodiments of the semiconductor memory device of the present invention.

Referring to FIG. 3A, cell gate patterns 120 may include Group 4A elements doped with dopants. For instance, the cell gate patterns 120 may include doped silicon, doped germanium, and/or doped silicon-germanium. The first and second selection gate patterns 110 and 130 may also include Group 4A elements doped with dopants. For example, the first and second selection gate patterns 110 and 130 may include doped silicon, doped germanium, and/or doped silicon-germanium.

A conductive barrier 150a may be interposed between the cell gate pattern 120 and the blocking insulation layer 155. A first selective-conductive barrier 151a may be interposed between the first selection gate pattern 110 and the first gate insulation layer 155, 157 and 160, and a second selective-conductive barrier 152a may be interposed between the second selection gate pattern 130 and the second gate insulation layer 155, 157 and 160. The conductive barriers 151a, 152a, and 153a may include nitrogen.

According to some embodiments of the present invention, a portion 146 of the cell gate pattern 120 adjacent to the conductive barrier 150a may include Group 4A element-metal compounds. Also, the conductive barrier 150a may include Group 4A element-metal nitrides. The conductive barrier 150a may include the same Group 4A elements and metals as the portion 146 of the cell gate pattern 120. The portion 146 of the cell gate pattern 120 may have a lower resistivity in Group 4A element-metal compounds than the conductive barrier 150a. For instance, the portion 146 of the cell gate pattern 120 may include metal silicide (e.g., cobalt silicide, nickel silicide, or titanium silicide), metal germanide (e.g., cobalt germanide, nikel germanide, or titanium germanide), and/or metal germanosilicide (e.g., cobalt germanosilicide, nikel germanosilicide, or titanium germanosilicide). Also, the conductive barrier 150a may include cobalt-silicon nitride, cobalt-germanium nitride, cobalt-silicon-germanium nitride, nickel-silicon nitride, nickel-germanium nitride, nickel-germanium nitride, nickel-silicon-germanium nitride, titanium-silicon nitride, titanium-germanium nitride, and/or titanium-silicon-germanium nitride.

Likewise, a portion 147 of the first selection gate pattern 110 adjacent to at least the first selective-conductive barrier 151 a may include Group 4A element-metal compounds, and the first selective conductive barrier 151 a may include Group 4A element-metal nitrides. A portion of the second selection gate pattern 130 adjacent to at least the second selective-conductive barrier 152a may include Group 4A element-metal compounds, and the second selective conductive barrier 152a may include Group 4A element-metal nitrides. The entirety of the first selection gate pattern 110 may be formed of Group 4A element-metal compounds. In addition, the entirety of the second selection gate pattern 130 may be formed of Group 4A element-metal compounds. The first and second selection gate patterns 110 and 130 may include the same metal as the cell gate pattern 120. Likewise, the conductive barriers 150a, 151a, and 152a may include the same metal. The first and second selection gate patterns 110 and 130 may include the same Group 4A elements as the cell gate pattern 120. Also, the conductive barriers 150a, 151a, and 152a may include the same Group 4A elements.

According to some embodiments of the present invention, as illustrated in FIG. 3A, the entirety of the second selection gate pattern 130 may be formed of Group 4A element-metal compounds, and the first selection gate pattern 110 and the cell gate pattern 120 may partially be formed of Group 4A element-metal compounds.

Figure 3B:
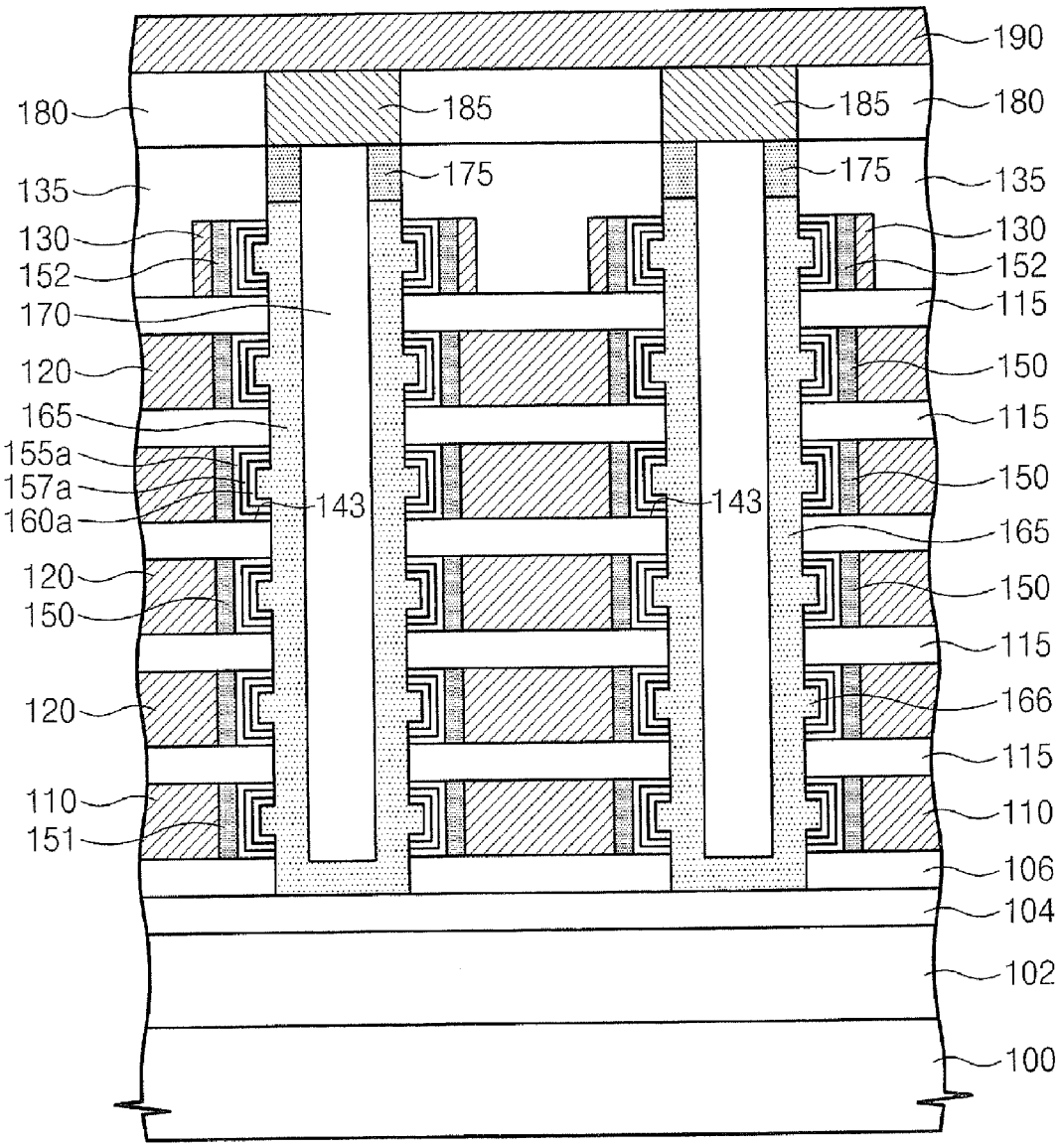
FIG. 3B is a cross-sectional view taken along the line I-I' of FIG. 1 to explain another modification example of the semiconductor memory device according to some embodiments of the present invention.

FIG. 3B is a cross-sectional view taken along the line I-I' of FIG. 1 to explain some embodiments of the semiconductor memory device of the present invention.

Referring to FIG. 3B, sidewalls of the cell gate patterns 120 formed in the opening 140 may be recessed sideward as compared to sidewalls of the insulation patterns 115. For this reason, undercut regions 143 may be defined. The conductive barrier 150 may be disposed in the undercut region 143 and disposed on the recessed sidewall. The conductive barrier 150 may substantially cover over the recessed sidewall of the cell gate pattern 120. Moreover, a blocking insulation layer 155a, a charge storage layer 157a, and a tunnel insulation layer 160a, which are formed between the conductive barrier 150 and the active pattern 165, may also be disposed in the undercut region 143. The charge storage layers 157a may be isolated from each other and disposed in the plurality of undercut regions 143 formed within the opening 140. Likewise, the blocking insulation layers 155a may be isolated from each other and disposed in the plurality of undercut regions 143. Furthermore, the tunnel insulation layers 160a may be isolated from each other and disposed in the plurality of undercut regions 143. The blocking insulation layer 155a, the charge storage layer 157a, and the tunnel insulation layer 160a may conformally be disposed along an inner side of the undercut region 143. In such cases, the active pattern 165 may include a protrusion 166 extending in the undercut region 143. The charge storage layer 157a may be formed of the same materials as the charge storage layer 157 described with reference to FIG. 2A and FIG. 2B.

Sidewalls of the first and second selection gate patterns 110 and 130 formed in the opening 140 may be recessed sideward as compared to a sidewall of a base insulation layer 106, sidewalls of insulation patterns 115, and sidewalls of a first interlayer insulation layer 135. For this reason, the undercut regions 143 may also be defined by sidewalls of the first and second selection gate patterns 110 and 130. The first and second selective-conductive barriers 151 and 152 may be disposed in the undercut region 143 defined by sidewalls of the first and second selection gate patterns 110 and 130. In addition, the first gate insulation layer 155a, 157a and 160a interposed between the first selective-conductive barrier 151 and the active pattern 165 may be disposed in the undercut region 143. The second gate insulation layer 155a, 157a and 160a interposed between the second selective-conductive barrier 152 and the active pattern 165 may be disposed in the undercut region 143. The first and second gate insulation layers 155a, 157a and 160a may include the same materials as the blocking insulation layer 155a, the charge storage layer 157a, and the tunnel insulation layer 160a. The first gate insulation layer 155a, 157a and 160a disposed in the undercut region 143 may be isolated from the blocking insulation layer 155a, the charge storage layer 157a, and the tunnel insulation layer 160a disposed in the above adjacent undercut region 143. Likewise, the second gate insulation layer 155a, 157a and 160a disposed in the undercut region 143 may be isolated from the blocking insulation layer 155a, the charge storage layer 157a, and the tunnel insulation layer 160a disposed in the below adjacent undercut region 143.

The modification example of FIG. 3A and the modification example of FIG. 3B may be combined with each other. For example, the cell gate patterns 120 of FIG. 3B may include doped Group 4A elements, and a portion of the cell gate patterns 120 adjacent to at least the conductive barrier 150 may include Group 4A element-metal compounds. In such cases, the conductive barrier 150 may include Group 4A element-metal nitrides. Likewise, the first and second selection gate patterns 110 and 130 of FIG. 3B may include Group 4A elements. In such cases, portions of the selection gate patterns 110 and 130 adjacent to at least the selective-conductive barriers 151 and 152 may include Group 4A element-metal compounds, and the selective-conductive barriers 151 and 152 may include Group 4A element-metal nitrides.

Figure 3C:
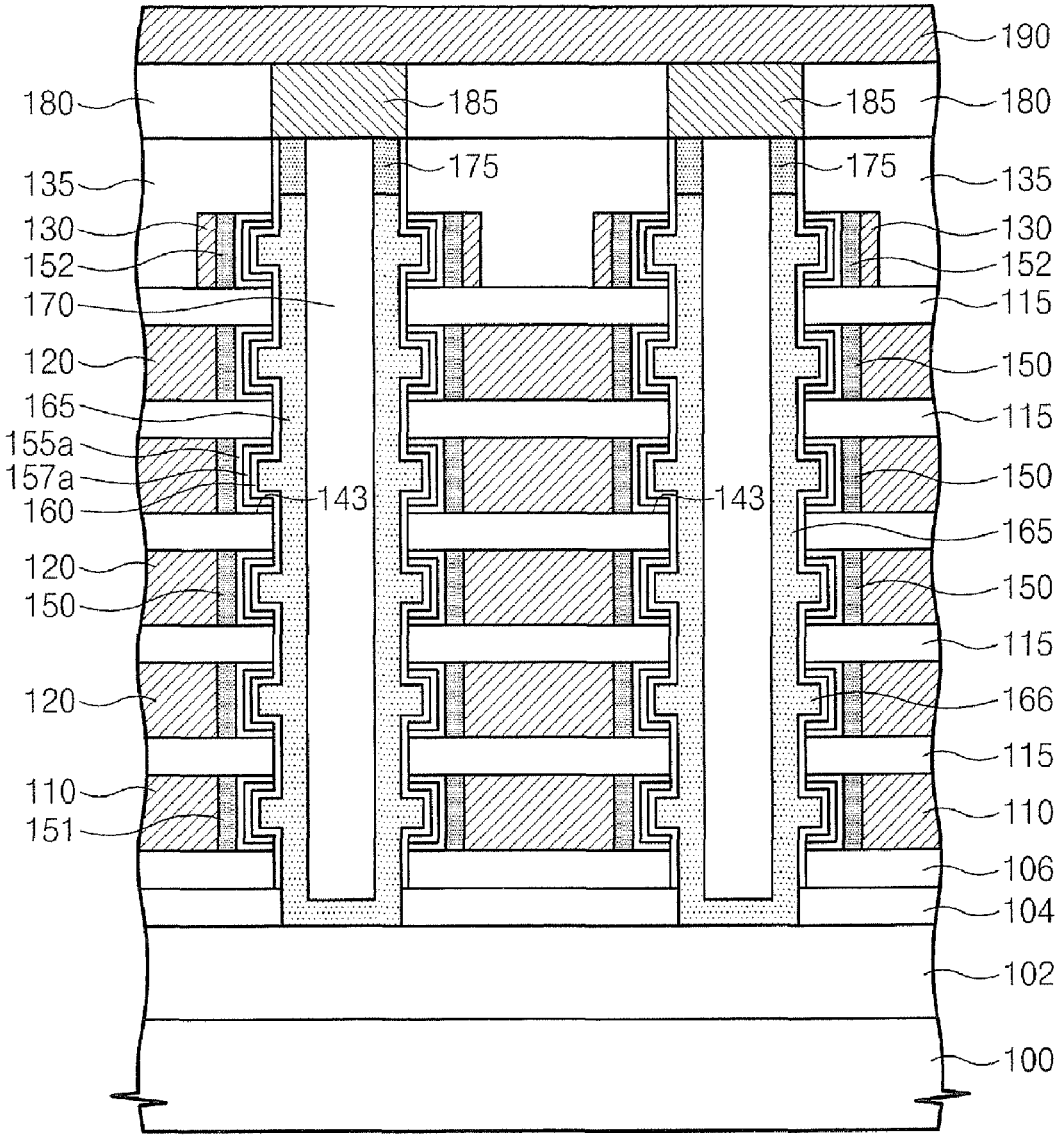
FIG. 3C is a cross-sectional view taken along the line I-I' of FIG. 1 to explain further modification examples of the semiconductor memory device according to some embodiments of the present invention.

FIG. 3C is a cross-sectional view taken along the line I-I' of FIG. 1 to explain further embodiments of the semiconductor memory device of the present invention.

Referring to FIG. 3C, the conductive barrier 150, the blocking insulation layer 155a, and the charge storage layer 157a may be disposed in the undercut region 143 close to the cell gate pattern 120. Like the modification example of FIG. 3B, the blocking insulation layer 155a and the charge storage layer 157a are disposed in the undercut region 143 and may be isolated from the adjacent blocking insulation layer 155a and charge storage layer 156a disposed in the above and/or below adjacent undercut region 143. The tunnel insulation layer 160 upwardly and/or downwardly extends to directly connect with the tunnel insulation layer 160 disposed in the adjacent undercut region 143. That is, one tunnel insulation layer 160 extends into successive undercut regions and may be disposed between a plurality of charge storage layers 157a isolated from each other and the active pattern 165. In some embodiments, the charge storage layer 157a may be formed of the same materials as the charge storage layer 157 described with reference to FIGS. 2A and 2B. Alternatively, the charge storage layer 157a may be formed of Group 4A elements (e.g., silicon, germanium, or silicon-germanium) or conductors. The blocking insulation layer 155a and the tunnel insulation layer 160 may be formed of the same materials as the blocking insulation layer 155 and the tunnel insulation layer 160 described with reference to FIGS. 2A and 2B.

As illustrated in FIG. 3C, the tunnel insulation layer 160 may extend so as to be interposed between the first and second selection gate patterns 110 and 130 and the active pattern 165. The tunnel insulation layer 160 may be included in first and second gate insulation layers 155a, 157a and 160a. Like some embodiments of FIG. 3B, with respect to the gate patterns 110, 120, and 130 including Group 4A element-metal compounds and the conductive barriers 150a, 151a, and 152a including Group 4A element-metal nitrides in FIG. 3A, it may be applicable to the semiconductor memory device of FIG. 3C.

Methods of forming the semiconductor memory device according to some embodiments of the present invention will now be described with reference to drawings.

Figure 4A:
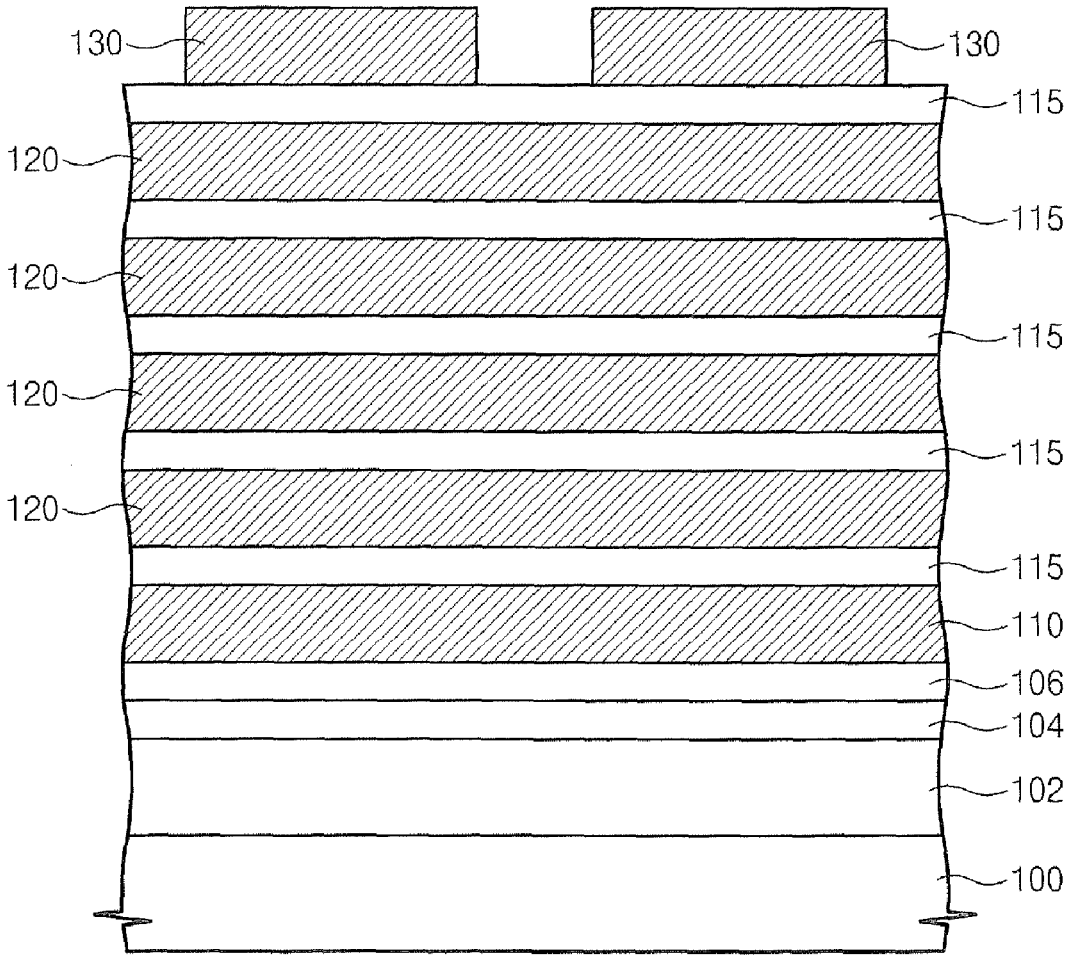
FIGS. 4A to 4E are cross-sectional views taken along the line I-I' of FIG. 1 to explain methods of forming the semiconductor memory device according to some embodiments of the present invention.
Figure 4B:
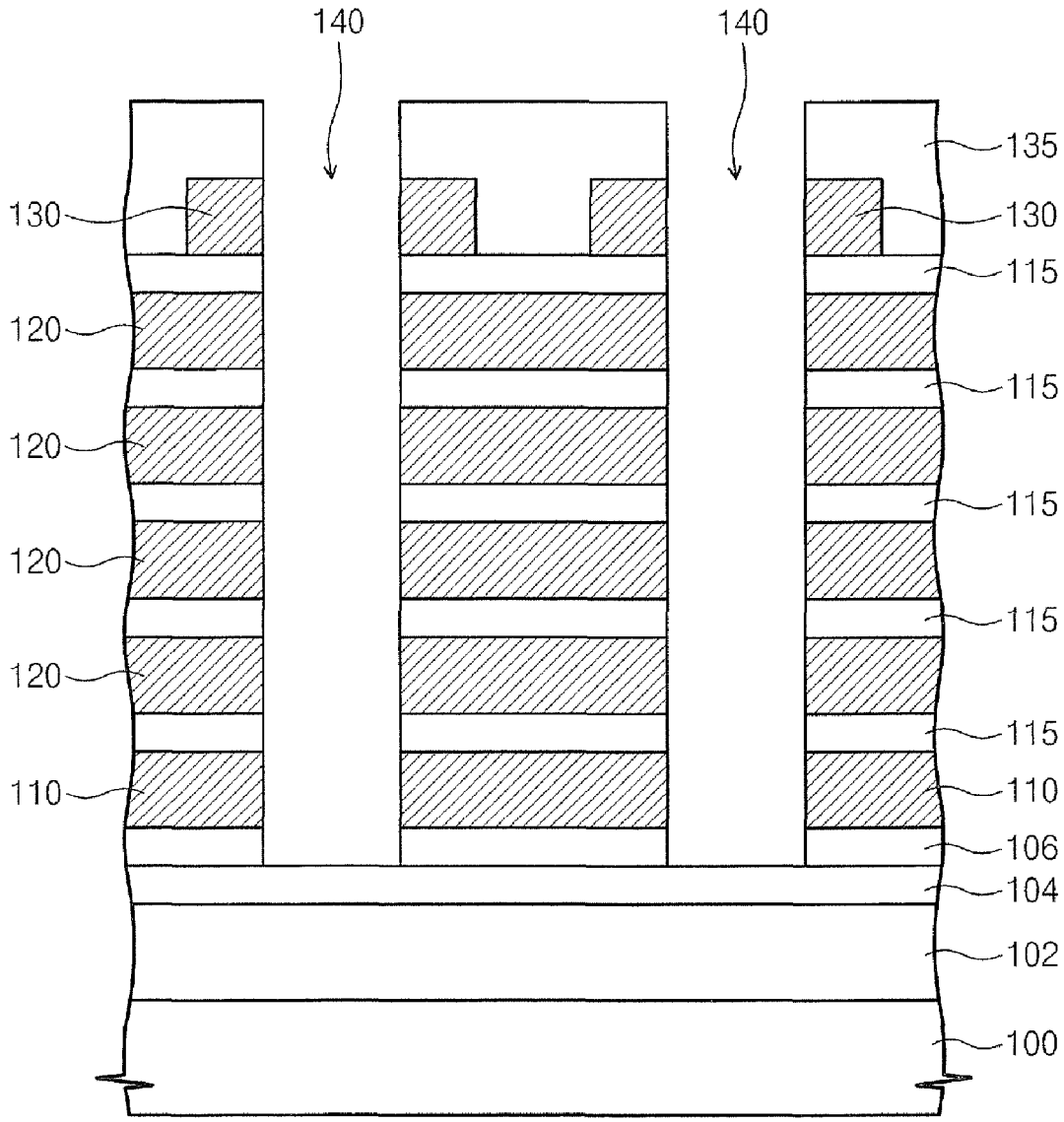
Figure 4C:
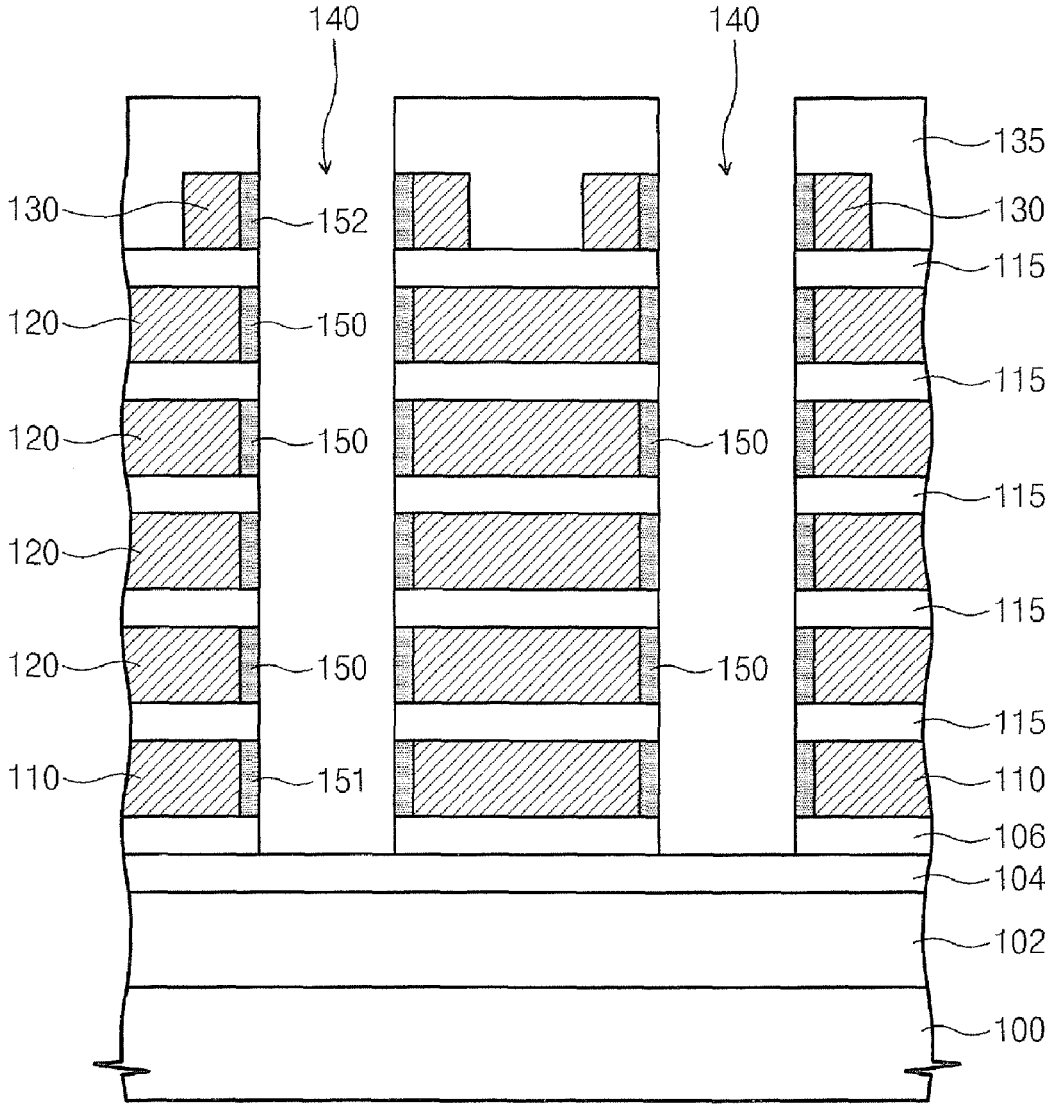
Figure 4D:
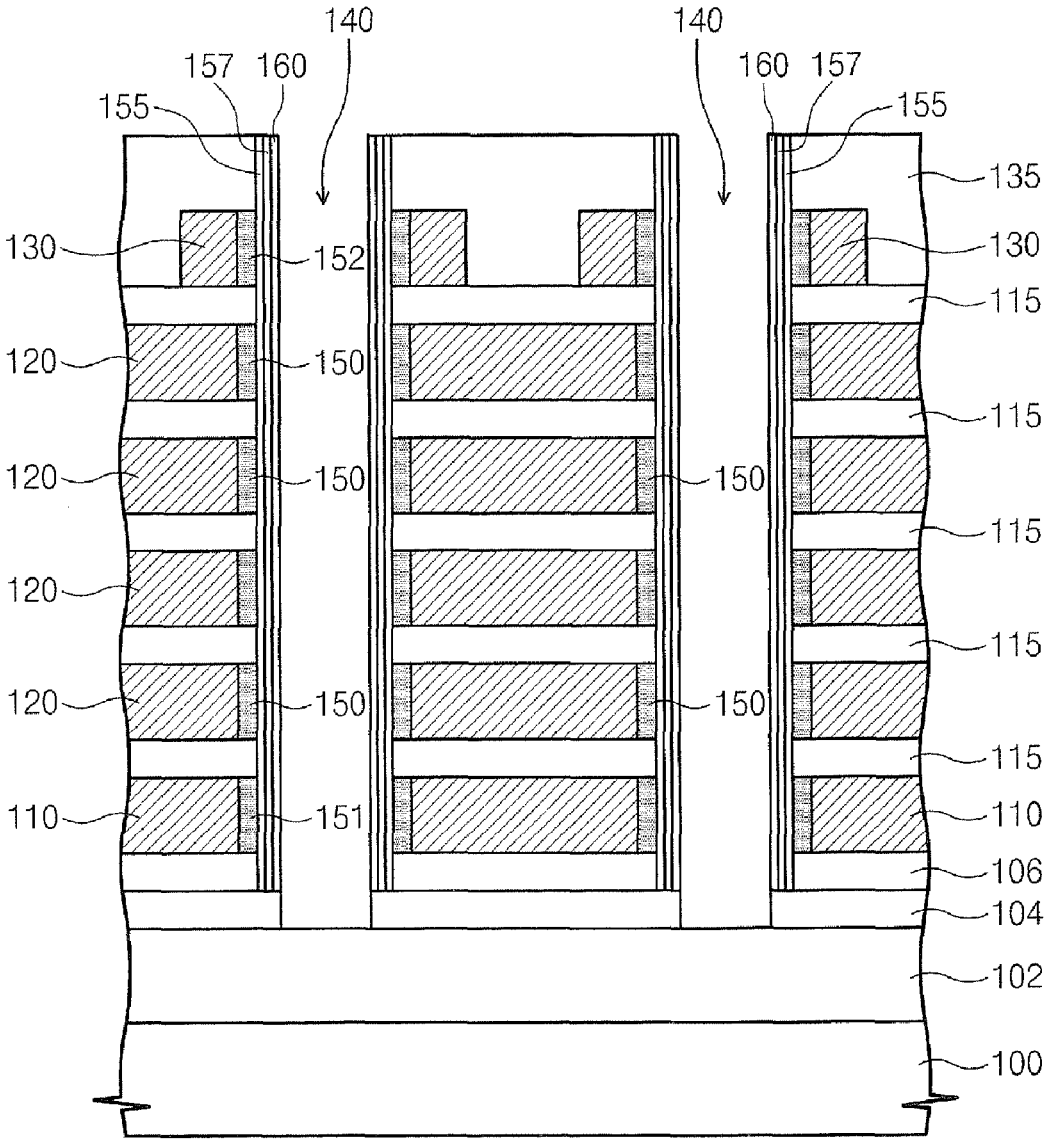
Figure 4E:
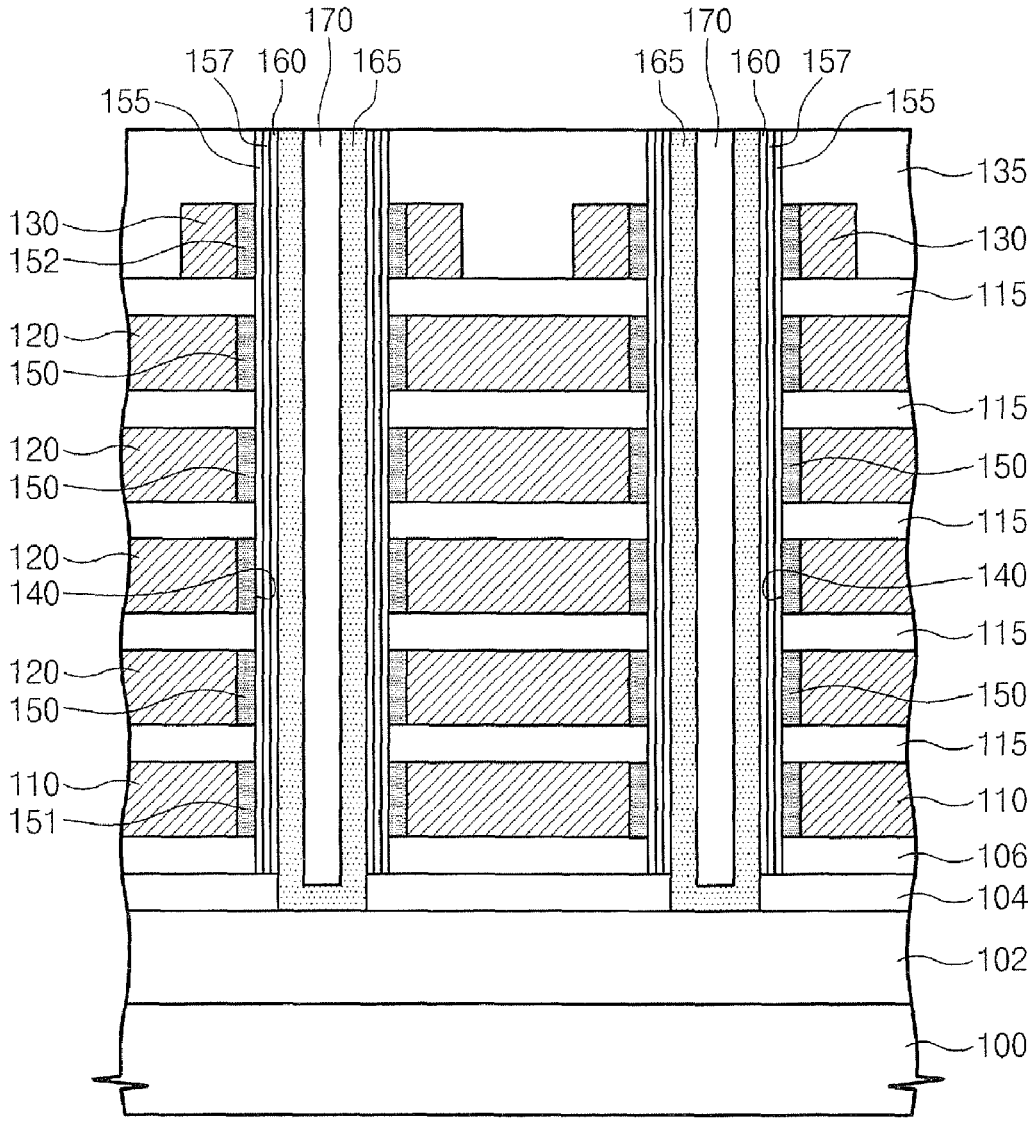
Figure 5A:
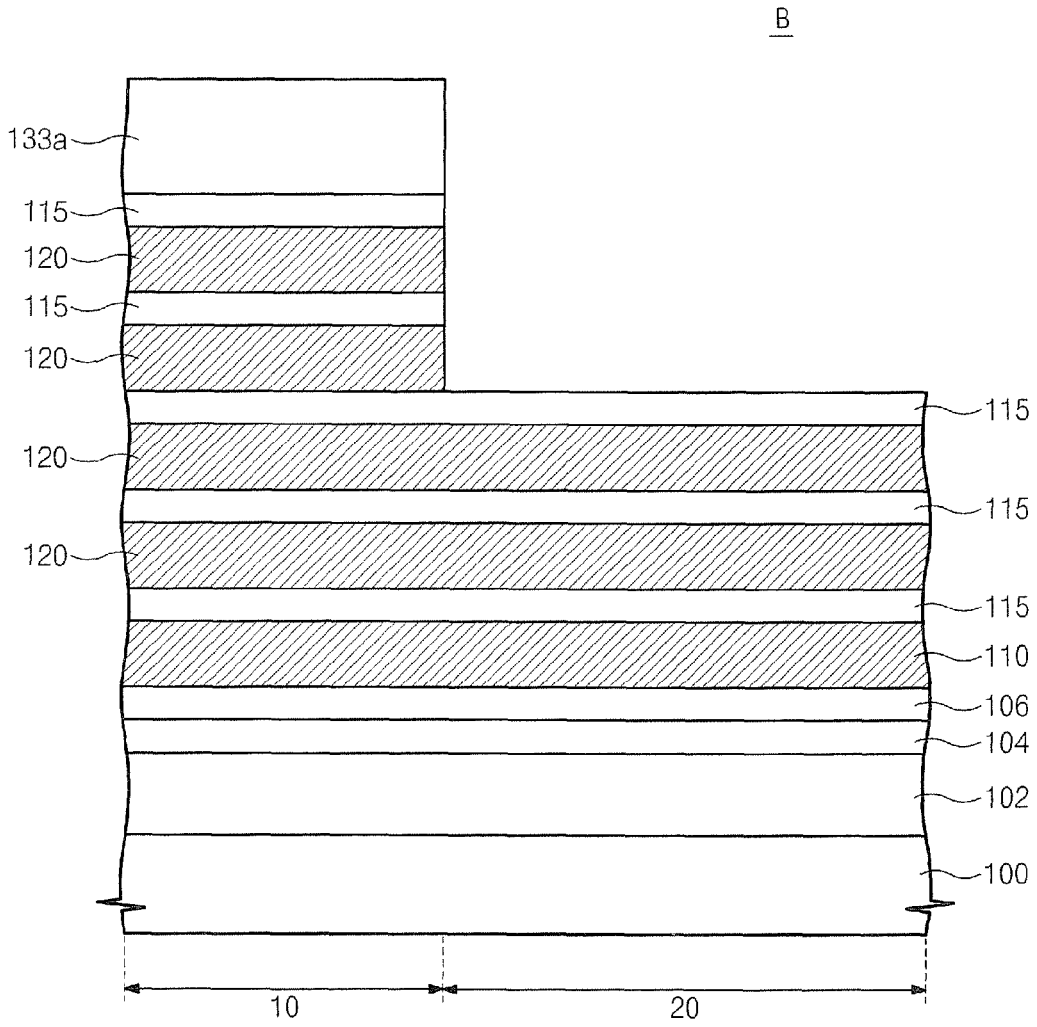
FIGS. 5A to 5C are cross-sectional views taken along the line II-II' of FIG. 1 to explain methods of forming pads in a connection region of the semiconductor memory device according to some embodiments of the present invention.
Figure 5B:
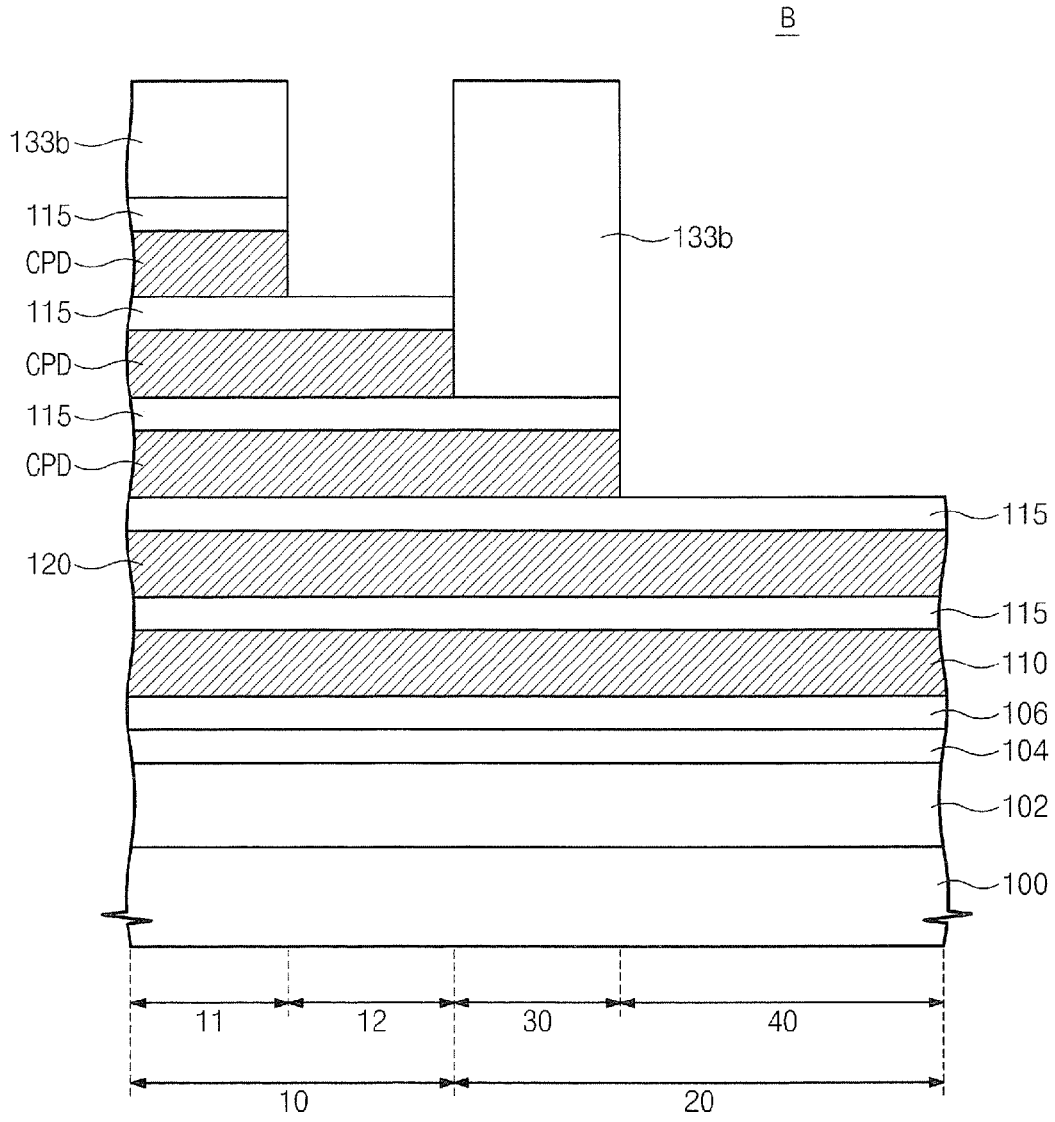
Figure 5C:
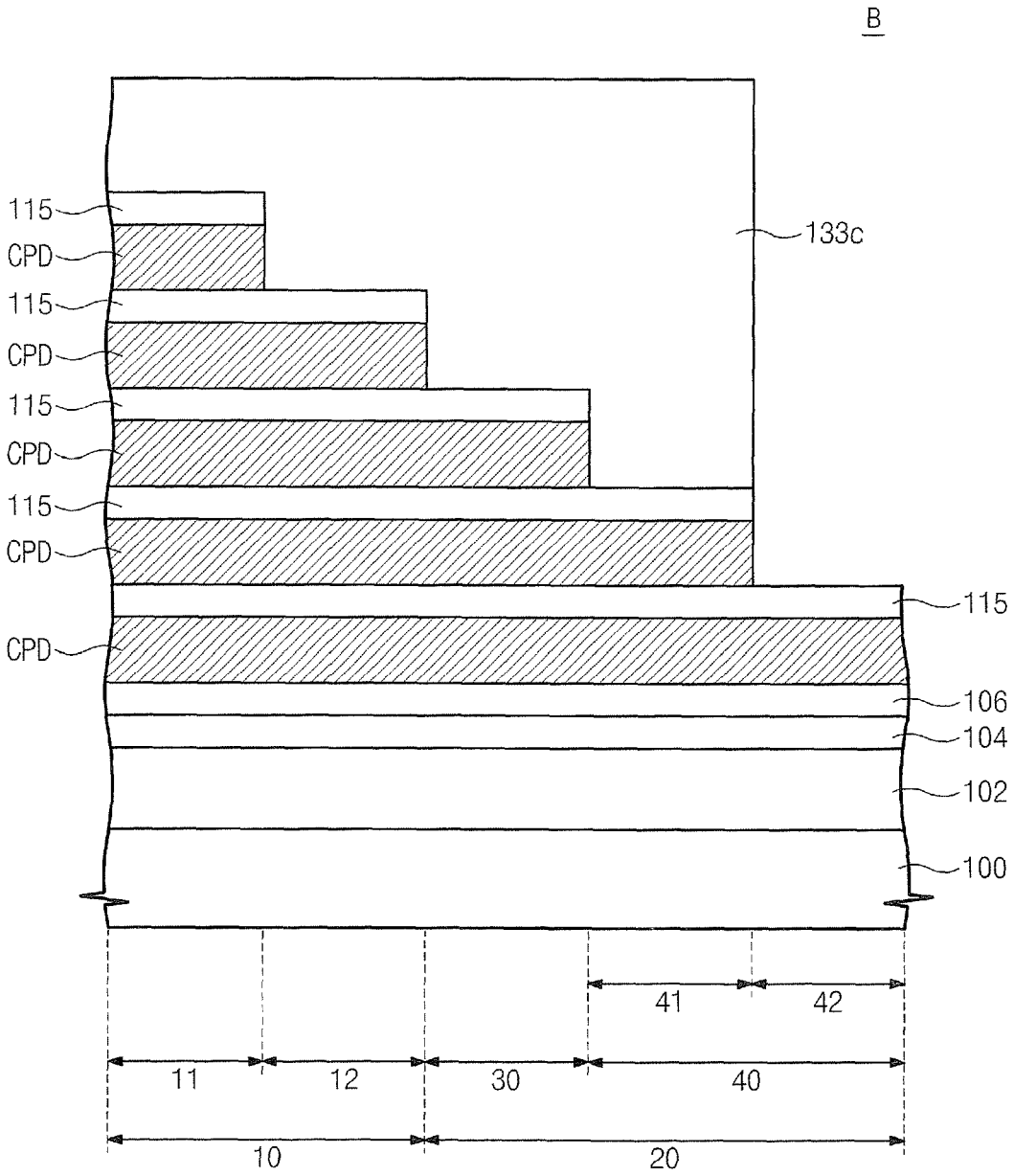

FIGS. 4A to 4E are process cross-sectional views taken along the line I-I' of FIG. 1 to explain methods of forming the semiconductor memory device according to some embodiments of the present invention; and FIGS. 5A to 5C are process cross-sectional views taken along the line II-II' of FIG. 1 to explain methods of forming pads in a connection region of the semiconductor memory device according to some embodiments of the present invention.

Referring to FIGS. 1 and 4A, a well region 102 may be formed by injecting the first-conductive-type dopants into the substrate 100 of the memory cell region A. The well region 102 may also be formed in the connection region B. A common source region 104 is formed by injecting the second-conductive-type dopants into the well region 102.

Subsequently, a base insulation layer 106 may be formed on the substrate 100, and a first selection gate layer 110 may be formed on the base insulation layer 106. The base insulation layer 106 may be, for example, an oxide layer, a nitride layer, and/or an oxynitride layer. Insulation layers 115 and cell gate layers 110 are alternately stacked on the first selection gate layer 110. A second insulation layer 130 may be formed on the uppermost one of the insulation layers 115. Before forming the base insulation layer 106, transistors and/or resistors may be formed in a peripheral region (not shown) to configure peripheral circuits. Second selection patterns 130 may be formed in the memory cell region A by patterning the second selection gate layer 130. The second selection gate patterns 130 may extend along one direction in parallel with each other. A first selection gate pattern 110, alternately stacked insulation patterns 115, and cell gate patterns 120 may be formed by successively patterning the cell gate layers 120, the insulation layers 115, and the first selection gate layer 110. The cell gate patterns 120, the insulation patterns 115, and the first selection gate pattern 110 may be formed on the base insulation layer 106 of the memory cell region A and the connection region B.

After forming the second selection gate pattern 130, the first selection gate pattern 110 and the cell gate patterns 120 may be formed. Alternatively, after forming the first selection gate pattern 110 and the cell gate patterns 120, the second selection gate pattern 130 may be formed. The insulation patterns 115 may be formed of such as an oxide, a nitride, and/or an oxynitride. The cell gate patterns 120 may include metal. For example, the cell gate patterns 120 may be formed of tungsten, titanium, or tantalum. The first and second selection gate patterns 110 and 130 may include metals. The first and second selection gate patterns 110 and 130 may include the same metals as the cell gate patterns 120. On the contrary, the first and second selection gate patterns 110 and 130 may include metals different from those of the cell gate patterns 120.

Next, the CPDs of the connection region B may be formed. Methods of forming the CPDs will be described with reference to FIGS. 5A to 5C.

Referring to FIGS. 1, 2B and 5A, the CPDs to be formed in the connection region B may be divided into a first group and a second group. The number of layers of the first-group CPDs may be equal to that of the second-group CPDs. Alternatively, the number of layers of the first-group CPDs may be as small as 1 or as large as 1 as compared to that of the second-group CPDs. When the total number of layers to be formed in the connection region B is an even number, the number of layers of the first-group CPDs may be equal to that of the second-group CPDs. When the total number of layers to be formed in the connection region B is an odd number, the number of layers of the first-group CPDs may be unequal to that of the second-group CPDs. Alternatively, the number of layers of the first-group CPDs may be as small as 1 or as large as 1 as compared to that of the second-group CPDs.

For convenience of description, FIG. 2B illustrates five-layered CPDs. With five layers, the number of layers of the first-group CPDs may be designated as 2 and the number of layers of the second-group CPDs may be designated as 3. Naturally, it should be understood that the embodiments are not limited thereto. For example, the number of layers of the first-group CPDs may be designated as 3 and the number of layers of the second-group CPDs may be designated as 2.

A first photolithography process may be carried out to divide a first region 10 and a second region 20 in the connection region B. A first mask pattern 133a may be formed by the first photolithography process to cover gate patterns 110 and 120 of the first region 10 divided in the connection region. Also, gate patterns 110 and 120 of the second region 20 may be exposed. The first-group CPDs may be formed in the first region 10, while the second-group CPDs may be formed in the second region 20. The first mask pattern 133a may cover over the memory cell region A.

Using the first mask pattern 133a as an etching mask, a first etching process may be carried out. The gate pattern 120, which may be formed by the uppermost pad CPD of the second-group CPDs, may be exposed by the first etching process. A first patterning process may include the first photolithography process and the first etching process.

Referring to FIGS. 1, 2B and 5B, the first-group CPDs may be divided into two subgroups in the same manner as the methods of dividing the CPDs into the first group and the second group. Likewise, the second-group CPDs may be divided into two subgroups by the above-described division. Two groups in the first group may be defined as a first subgroup and a second subgroup, respectively, and two groups in the second group may be defined as a third subgroup and a fourth subgroup. In such embodiments of the present invention, the number of layers in the CPDs of the first, second, and third subgroups may be 1, and the number of layers in the CPDs of the fourth subgroup may be 2.

The number of layers of the first-subgroup CPDs may be equal to that of the second-subgroup CPDs. Alternatively, the number of layers of the first-subgroup CPDs may be as small as 1 or as large as 1 as compared to that of the second-subgroup CPDs. Likewise, the number of layers of the third-subgroup CPDs may be equal to that of the fourth-subgroup CPDs. Alternatively, the number of layers of the third-subgroup CPDs may be as small as 1 or as large as 1 as compared to that of fourth-subgroup CPDs.

Similarly, the first region 10 may be divided into two sub-regions 11 and 12, and the second region 20 may be divided into two sub-regions 30 and 40. That is, the first region 10 may be divided into a first sub-region 11 in which the first-subgroup CPDs are formed and a second sub-region 12 in which the second-subgroup CPDs are formed; and the second region 20 may be divided into a third sub-region 30 in which the third-subgroup CPDs are formed and a fourth sub-region 40 in which the fourth-subgroup CPDs are formed.

After carrying out the first patterning process, the first mask pattern 133a may be removed. Sequentially, a second mask pattern 133b may be formed by carrying out a second photolithography process. The second mask pattern 133b may cover one sub-region of the first region 10 and one sub-region of the second region 20. Also, gate patterns may be exposed, located in the other sub-region of the first region 10 and the other sub-region of the second region 20. For example, the first and third sub-regions 11 and 30 may be covered with the second mask pattern 133b, and the second and fourth sub-regions 12 and 40 may be exposed.

Using the second mask pattern 133b as an etching mask, a second etching process may be carried out. The second etching process etches gate patterns located in the second sub-region 12 and the fourth sub-region 40. Consequently, the first, second, third, and fourth-subgroup CPDs are formed with a single layer, respectively. A second patterning process may include the second photolithography process and the second etching process.

Referring to FIGS. 1 and 5C, the second mask pattern 133b may be removed. The number of layers of the fourth-subgroup CPDs may be 2. Accordingly, the fourth-subgroup CPDs may be divided into two subgroups once more. Likewise, the fourth sub-region 40 may be divided into two sub-regions 41 and 42, each corresponding to two subgroups in the fourth subgroup. A third mask pattern 133c may be formed by carrying out a third photolithography process to cover one sub-region 41 in the fourth sub-region 40. Also, gate patterns may be exposed, located at the other sub-region 42 in the fourth sub-region 40. The third mask pattern 133c may cover the previously formed CPDs. Moreover, the third mask pattern 133c may cover the memory cell region A. A third etching process is carried out by using the third mask pattern 133c as an etching mask. Consequently, two CPDs are formed in the fourth sub-region 40. A third patterning process includes the third photolithography process and the third etching process.

As described above, after patterning it by dividing the connection region B into the first region 10 and the second region 20, the first region 10 and the second region 20 may be divided into two sub-regions, respectively, thereby patterning one sub-region 12 in the first region 10 and one sub-region 40 in the second region 20 at the same time. Next, each of the four sub-regions 11, 12, 30 and 40 is divided into two smaller sub-regions, and two smaller sub-regions included in each of the four sub-regions 11, 12, 30 and 40 are simultaneously patterned. By repeatedly performing these manners, all of the CPDs may be formed in the connection region B by the number of patterning processes smaller than the total number of layers of the CPDs.

When the total number X of layers of the CPDs formed in the connection region B is $2^{n-1}<X\leq 2^n$ (n is a natural number), the number of patterning processes is 'n'. For example, when the total number of layers of the CPDs is 32, the number of patterning processes is 5. That is, when the total number of layers of the CPDs is 32, all of the CPDs may be formed by performing the patterning processes five times. As an alternate example, when the total number X of layers of the CPDs is 64, it may form all 64-layered CPDs by performing the patterning processes six times.

Subsequently, referring to FIG. 4B, the first interlayer insulation layer 135 may be formed on the entire surface of the substrate 100. The first interlayer insulation layer 135 covers the second selection gate patterns 130 and the CPDs (CPDs of FIG. 2B). The first interlayer insulation layer 135 may be, for example, an oxide layer, a nitride layer, and/or an oxynitride layer.

The opening 140 may be formed by successively patterning the first interlayer insulation layer 135, the second selection gate pattern 130, the insulation patterns 115, the cell gate patterns 120, the first selection gate pattern 110, and the base insulation layer 106. The opening 140 may be a form of hole. The common source region 104 may be exposed in the opening 140. The hole-shaped openings 140 may be formed on the substrate 100 of the memory cell region A so as to be spaced apart from each other in parallel with each other. The hole-shaped openings 140 may be two-dimensionally arranged along rows and columns.

Referring to FIG. 4C, a nitridation process may be carried out in the opening 140. More specifically, the nitridation process is carried out on sidewalls of the cell gate patterns 120 exposed in the opening 140. For this reason, conductive barriers 150 are formed on the sidewalls of the cell gate patterns 120 in the opening 140. During the nitridation process, the sidewalls of the exposed cell gate patterns 120 react with the supplied nitrogen to form the conductive barriers 150. At this time, conductive materials do not form on sidewalls of the insulation patterns 115 in the opening 140. For this reason, the conductive barriers 150 are electrically isolated from each other. When the cell gate patterns 120 include metals, the conductive barriers 150 are formed of metal nitrides. For example, when the cell gate patterns 120 are formed of tungsten, titanium, or tantalum, the conductive barriers 150 may be formed of tungsten nitride, titanium nitride, or tantalum nitride. By the nitridation process, a first selective-conductive barrier 151 and a second selective-conductive barrier 152 are formed on sidewalls of the first and second selection gate patterns 110 and 130 exposed in the opening 140, respectively.

The nitridation process may be isotropy. The nitridation process may use nitrogen-containing nitrogen source gas. The nitridation process may use thermally excited nitrogen, plasma-state nitrogen, and/or radical-state nitrogen, which are obtained from the nitrogen-containing nitrogen source gas. The thermally excited nitrogen, plasma-state nitrogen, and/or radical-state nitrogen may be generated inside a process chamber in which the nitridation process is carried out. When the plasma-state nitrogen is generated in the process chamber, a back bias may not be applied to an electrostatic chuck on which the substrate 100 is mounted. Alternatively, according to some embodiments of the present invention, the plasma-state nitrogen and the radical-state nitrogen are remotely generated at the outside of the process chamber and may be supplied to the inside of the process chamber by diffusion and/or convention. The nitrogen source gas may contain such as a nitrogen ($N_2$) gas, an ammonia ($NH_3$) gas, and/or a nitrogen trifluoride ($NF_3$) gas. The present invention is not limited thereto. The nitrogen source gas may use another gases containing nitrogen.

The conductive barriers 150, 151, and 152 may be formed by the nitridation process, thereby being selectively formed on the exposed gate patterns 110, 120, and 130. As a result, it can form the conductive barriers 150 isolated from each other and the first and second selective-conductive barriers 151 and 152 isolated from the conductive barriers 150 in the opening 140. Furthermore, the conductive barriers 150, 151, and 152 may be formed over the sidewalls of the gate patterns 110, 120, and 130 by the nitridation process.

Before carrying out the nitridation process, the sidewalls of the gate patterns 110, 120, and 130 exposed in the opening 140 may be recessed sideward as compared to the sidewalls of the insulation patterns 115. By the recess process, the state of an inner sidewall of the opening 140 can be controlled. For example, the sidewalls of the conductive barriers 150, 151, and 152 may be protruded into the opening 140 as compared to the sidewalls of the insulation patterns 115. By carrying out the recess process before the nitridation process, the sidewalls of the conductive barriers 150, 151, and 152 may substantially coplanar with the sidewalls of the insulation patterns 115.

Referring to FIG. 4D, the blocking insulation layer 155, the charge insulation layer 157, and the tunnel insulation layer 160 may be conformally formed on the entire surface of the substrate having the conductive barriers 150, 151, and 152. For this reason, the blocking insulation layer 155, the charge storage layer 157, and the tunnel insulation layer 160 may be formed along the sidewalls of the opening 140 with a uniform thickness. The blocking insulation layer 155, the charge storage layer 157, and the tunnel insulation layer 160 may be formed by an ALD (atomic layer deposition) process.

Subsequently, removing the tunnel insulation layer 160, the charge storage layer 157, and the blocking insulation layer 155 formed on the bottom of the opening 140 may expose the common source region 104. The tunnel insulation layer 160, the charge storage layer 157, and the blocking insulation layer 155 formed on the bottom of the opening 140 may be removed by anisotropically etching the entire surface. At this time, the tunnel insulation layer 160, the charge storage layer 157, and the blocking insulation layer 155 formed on the top of the opening 140 may also be removed.

By etching the exposed common source region 104, the well region 102 may be exposed.

Referring subsequently to FIG. 4E, the active pattern 165 may be formed in the opening 140. The active pattern 165 may include Group 4A elements. For instance, the active pattern 165 may be formed of silicon, germanium, or silicon-germanium. Methods of forming the active pattern 165 will now be described. An amorphous active layer may conformally be formed on the substrate 100 having the opening 140. The amorphous active layer has good step coverage. The amorphous active layer comes in contact with the substrate 100 below the opening 140, the well region 102 being formed thereon. A crystallization process may be carried out on the amorphous active layer. The amorphous active layer may be changed into a poly crystalline active layer by the crystallization process. Alternatively, the amorphous active layer come in contact with the mono crystalline substrate 100 may be changed into a mono crystalline active layer by the crystallization process. A filling insulation layer may be formed on the active layer to fill the opening 140. The active pattern 165 and the filling insulation pattern 170 may be formed in the opening 140 by planarizing the active layer and the filling insulation layer until the first interlayer insulation layer is exposed. The crystallization process may be carried out before or after forming the filling insulation layer.

Alternatively, the active pattern 165 may also be formed by a selective epitaxial process using the substrate 100 exposed in the opening 140 as a seed layer. In such cases, the active pattern 165 may also be a form of pillar that fills the opening 140. When the active pattern 165 is formed by the epitaxial process, the filling insulation layer may be omitted.

The following methods will be described with reference to FIGS. 1, 2A and 2B. The drain region 175 may be formed by supplying a second-conductive-type dopant to the upper end of the active pattern 165, and the second interlayer insulation layer 180 may be formed to cover the entire surface of the substrate 100. The bit line plugs 185 are formed, which penetrate the second interlayer insulation layer 180. The bit line plugs 185 are connected to the drain region 175. The connection plugs 187 are formed, which continuously penetrate the second and first interlayer insulation layers 180 and 135 of the connection region B. The connection plugs 187 and the bit line plugs 185 may be formed at the same time. The bit line 190 is formed on the second interlayer insulation layer 180 of the memory cell region A, thereby being connected to the bit line plugs 185. The connection wirings 192 are formed on the second interlayer insulation layer 180 of the connection region B, thereby being connected to the connection plugs 187. The bit line 190 and the connection wirings 192 may be formed at the same time. The plugs 185 and 187 may include, for example, tungsten, copper, or aluminum. The bit line 190 and the connection wirings 192 may include, for example, tungsten, copper, or aluminum.

Methods of forming the semiconductor memory device illustrated in FIG. 3A will be described below. These methods may include the methods described with reference to FIGS. 4A and 4B, and FIGS. 5A to 5C except that the gate patterns 110, 120, and 130 may include Group 4A doped with dopants.

Figure 6A:
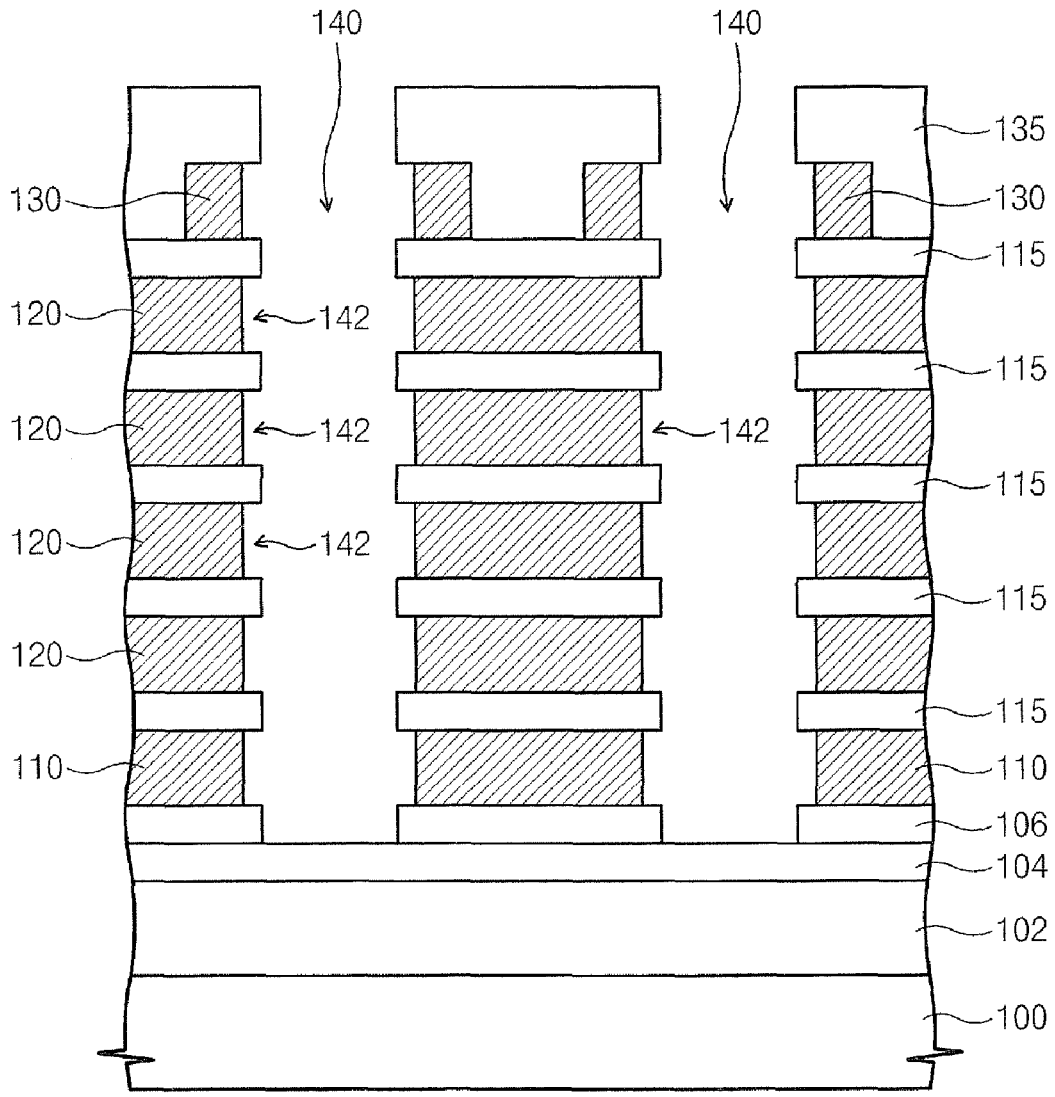
FIGS. 6A to 6C are cross-sectional views to explain methods of forming the semiconductor memory device illustrated in FIG. 3A.
Figure 6B:
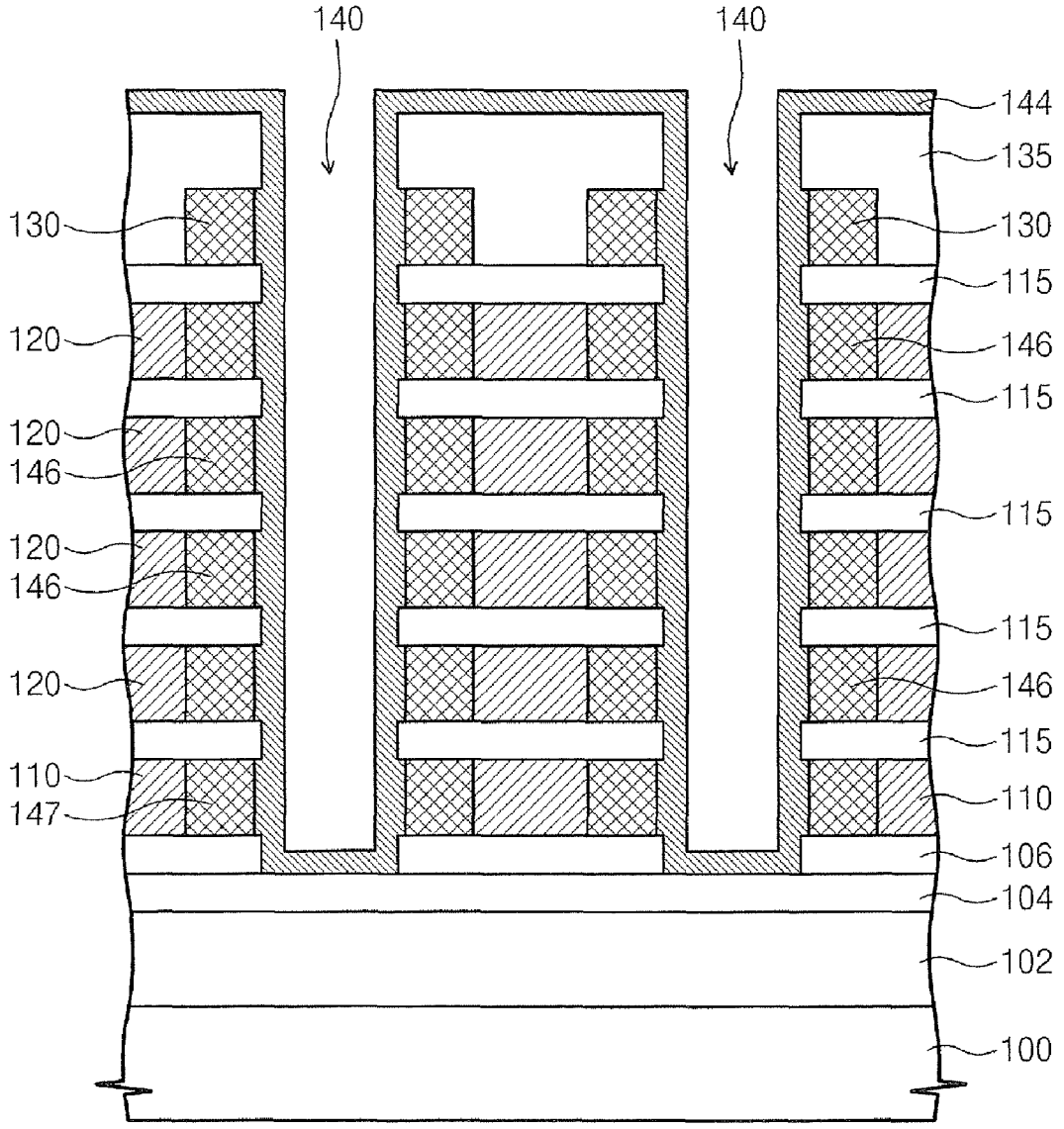
Figure 6C:
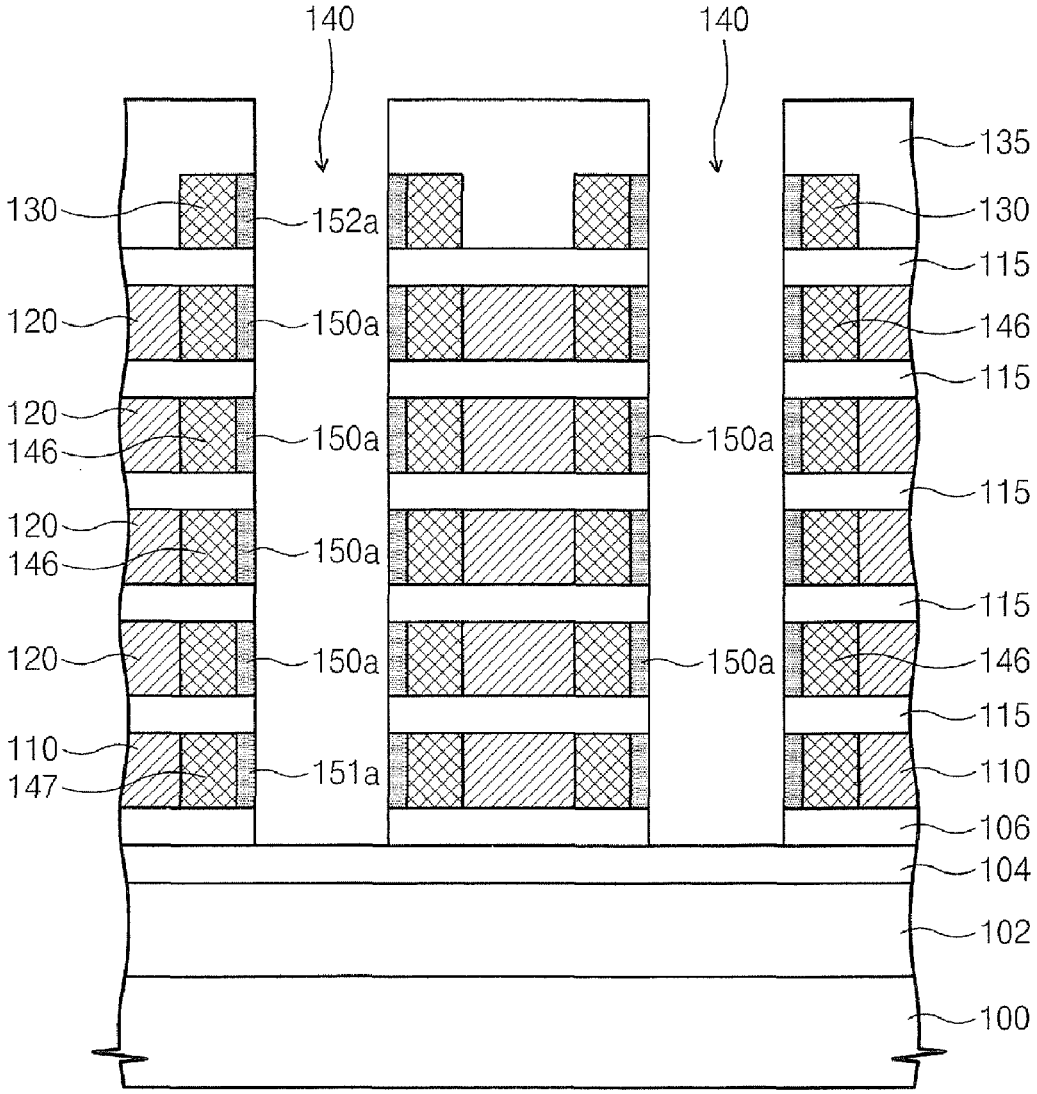

FIGS. 6A to 6C are process cross-sectional views to explain methods of forming the semiconductor memory device illustrated in FIG. 3A.

Referring to FIGS. 4B and 6A, after forming the opening 140, the undercut regions 142 may be formed by recessing sideward the sidewalls of the gate patterns 110, 120, and 130 exposed in the opening 140 as compared to the sidewalls of the insulation patterns 115. The gate patterns 110, 120, and 130 may include doped Group 4A elements. For example, the gate patterns 110, 120, and 130 may include doped silicon, doped germanium, or doped silicon-germanium.

Referring to FIG. 6B, a metallization process may be carried out on the sidewalls of the gate patterns 110, 120, and 130 exposed in the opening 140. The metallization process supplies metals into the exposed gate patterns 110, 120, and 130 to form at least a part of the gate patterns 110, 120, and 130 of metal compounds. By the metallization process, at least a part of the gate patterns 110, 120, and 130 may be formed of Group 4A element-metal compounds.

In some embodiments of the metallization process, a metal layer 144 may be formed on the substrate 100 to come in contact with the sidewalls of the gate patterns 110, 120, and 130 exposed in the opening 140. The metal layer 144 may include cobalt, nickel, or titanium. At least a part of the gate patterns 110, 120, and 130 may be formed of the Group 4A element-metal compounds by reacting the metal layer 144 to the gate patterns 110, 120, and 130. As illustrated in FIG. 6B, the overall second selection gate pattern 130 may be formed of the Group 4A element-metal compounds. The metal layer 144 and the gate patterns 110, 120, and 130 may be reacted to each other by a thermal process. The method of forming the metal layer 144 and the reaction process of the metal layer 144 and the gate patterns 110, 120, and 130 may be carried out by an in-situ method or an ex-site method. After finishing the reaction process, unreacted metal layer 140 is removed. Hereby, the metallization process may be finished.

Metallized parts (that is, parts formed of Group 4A element-metal compounds) of the gate patterns 110, 120, and 130 may be increased in volume. Consequently, portions of the undercut regions 142 may be filled with the metallized parts of the gate patterns 110, 120, and 130.

Before forming the metal layer 144, a buffer layer (not shown) may be disposed on the common source region 104 below the opening 140. The buffer layer may be a part of the base insulation layer 106. Specifically, in forming the opening 140 when carrying out the metallization process, the top of the base insulation layer 120 is removed and the bottom of the base insulation layer 120 remains. A part of the remained base insulation layer 106 may be used as a buffer layer. The buffer layer may prevent or inhibit the reaction between the metal layer 144 and the common source region 104. After removing the metal layer 144, the buffer layer may be removed.

During the metallization process, the metal layer 144 and the common source region 104 below the opening 140 may be reacted to each other. In such cases, the metallized part of the common source region 104 may remain. Conversely, the metallized part of the common source region 104 may be removed by an additional process. Moreover, the metallized part of the common source region 104 may be removed by the following methods for exposing the well region 102.

Referring to FIG. 6C, the unreacted metal layer 144 may be removed, and then the metallized parts 146 and 147 of the gate patterns 110, 120, and 130 may be exposed. The conductive barriers 150a, 151a, and 152a are formed by carrying out the nitridation process on the metallized parts 146 and 147 of the gate patterns 110, 120, and 130. The nitridation process may be equal to the nitridation process described with reference to FIG. 4C. Due to the nitridation process, the conductive barriers 150a, 151a, and 152a may be formed of Group 4A element-metal nitrides by supplying nitrogen to the metallized parts of the gate patterns 110, 120, and 130. The metallized parts 146 and 147 of the gate patterns 110, 120, and 130 may have a low resistivity as compared to the conductive barriers 150a, 151a, and 152a.

The conductive barriers 150a, 151a, and 152a may fill the undercut region 142. According to some embodiments of the present invention, the formation of the undercut region 142 may be omitted.

The following methods may be carried out in the same manner as described with reference to FIGS. 4D and 4E, and FIGS. 2A and 2B. The methods may thereby realize the semiconductor memory device of FIG. 3A.

Next, methods of forming the semiconductor memory device illustrated in FIG. 3B will be described with reference to accompanying drawings.

These methods may include the ways described with reference to FIGS. 4A and 4B, and FIGS. 5A to 5C.

Figure 7A:
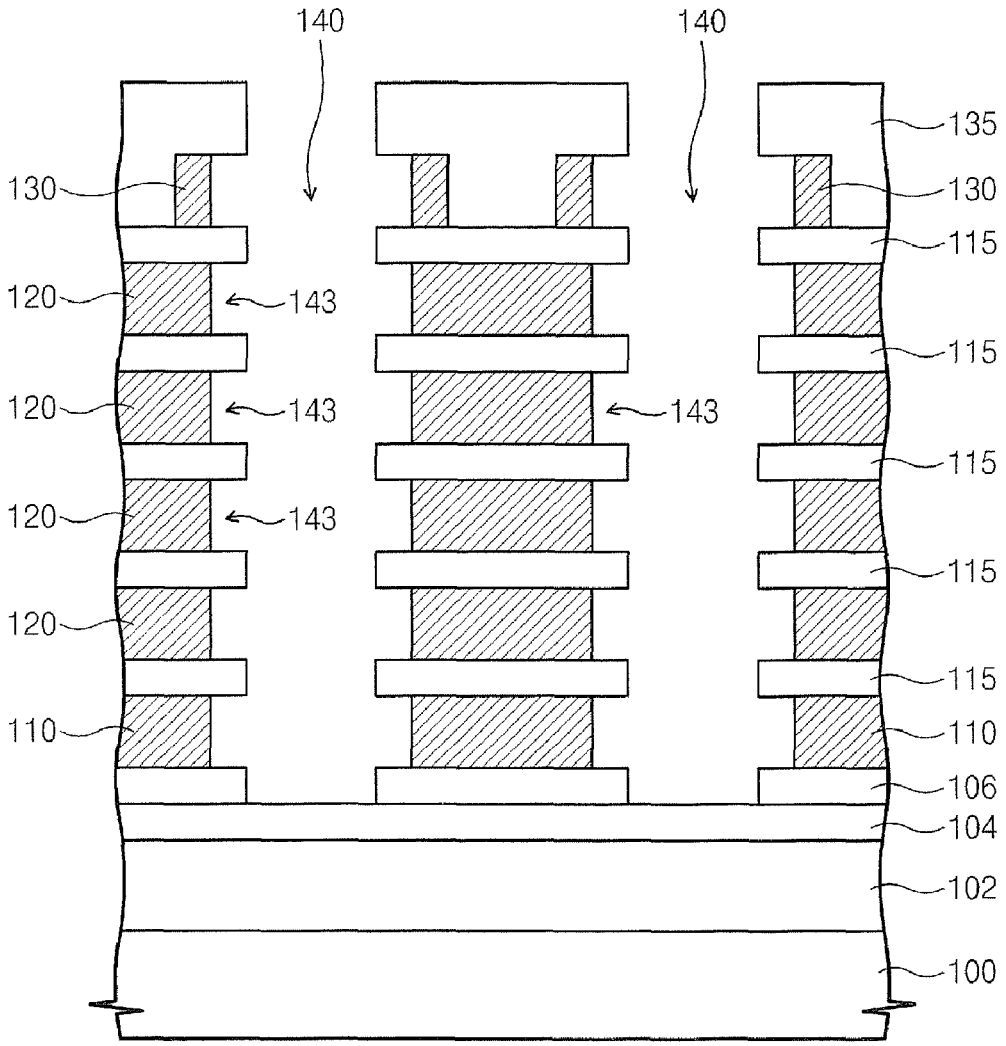
FIGS. 7A to 7C are cross-sectional views to explain methods of forming the semiconductor memory device illustrated in FIG. 3B.
Figure 7B:
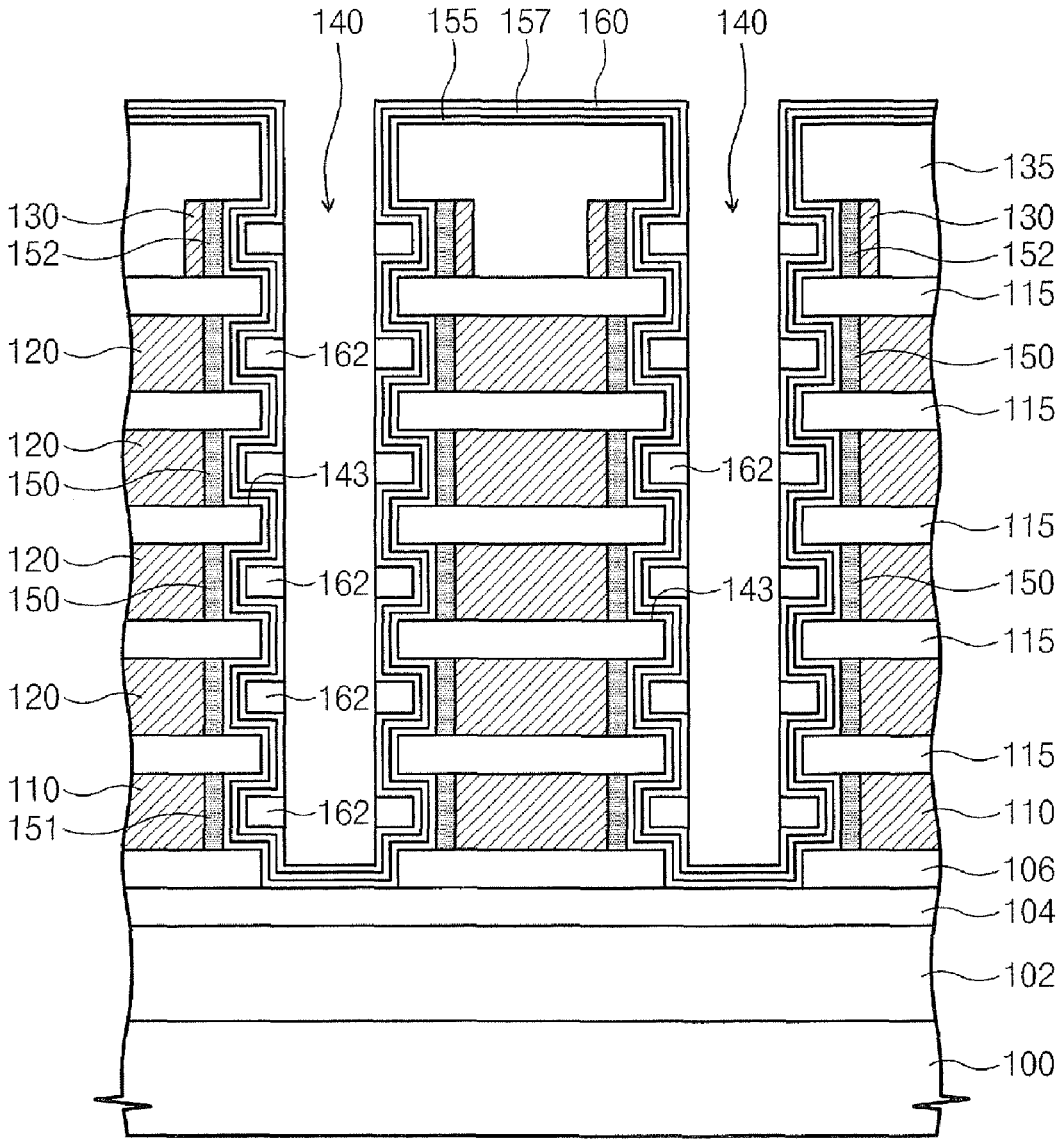
Figure 7C:
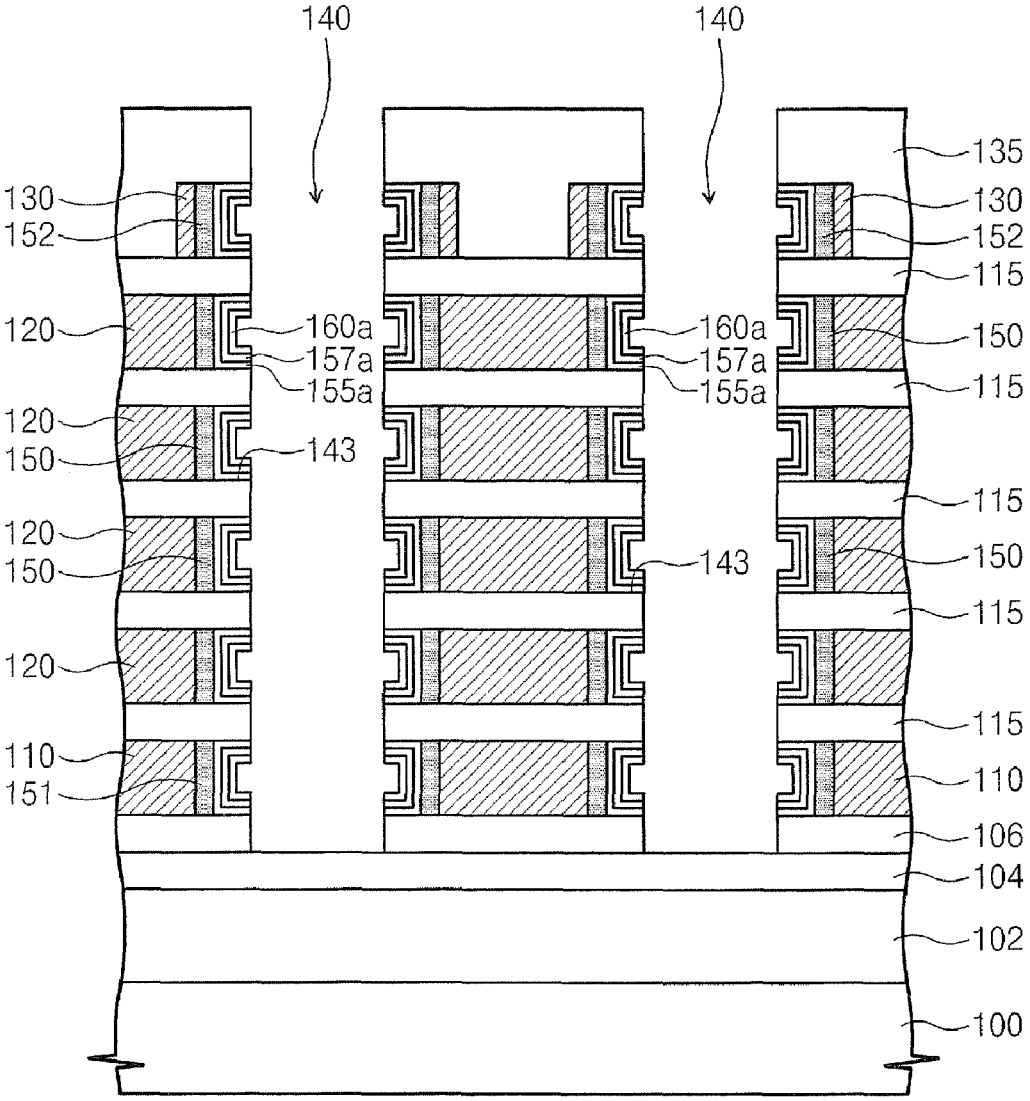

FIGS. 7A to 7C are process cross-sectional views to explain methods of forming the semiconductor memory device illustrated in FIG. 3B.

Referring to FIGS. 4B and 7A, after forming the opening 140, the undercut regions 143 may be formed by recessing sideward the sidewalls of the gate patterns 110, 120, and 130 exposed in the opening 140 as compared to the sidewalls of the insulation patterns 115. The depth of the undercut region 143 may be deeper than the undercut region 142 of FIG. 6A. The depth of the undercut region 143 may be a horizontal distance between the recessed sidewalls of the cell gate pattern 120 and the sidewalls of the insulation pattern 115.

Referring to FIG. 7B, the nitridation process is subsequently carried out on the substrate 100 to form the conductive barriers 150, 151, and 152. The nitridation process is the same as described with reference to FIG. 4C. The conductive barriers 150, 151, and 152 are formed in the undercut regions 143. Portions of the undercut regions 143 may be in an empty state. When the gate patterns 110, 120, and 130 contain metals, the nitridation process may directly be carried out on the recessed sidewalls of the gate patterns 110, 120, and 130. Hereby, the conductive barriers 150, 151, and 152 may be formed of metal nitrides.

Alternatively, when the gate patterns 110, 120, and 130 contain doped Group 4A elements, the metallization process may be carried out on the recessed sidewalls of the gate patterns 110, 120, and 130 before carrying out the nitridation process. The metallization process may be equal to that described with reference to FIG. 6B. In such cases, by carrying out the metallization process and the nitridation process, the conductive barriers 150, 151, and 152 may be formed of Group 4A element-metal nitrides. Even in these cases, the conductive barriers 150, 151, and 152 may be formed in the undercut regions 143, and portions of the undercut regions 143 may be in an empty state.

Subsequently, the blocking insulation layer 155, the charge storage layer 157, and the tunnel insulation layer 160 may be conformally formed on the substrate 100 in turns. At this time, parts of the blocking insulation layer 155, the charge storage layer 157, and the tunnel insulation layer 160 may be formed in the undercut region 143. The blocking insulation layer 155, the charge storage layer 157, and the tunnel insulation layer 160 may be formed to have a substantially uniform thickness along an inner surface of the opening 140 and the undercut region 143.

A sacrificial layer may be formed on the substrate 100 to fill the opening 140 and the undercut region 143, and then the sacrificial layer may be planarized until the tunnel insulation layer 160 disposed on the upper surface of the first interlayer insulation layer 135 is exposed. Sacrificial patterns 162 may be formed by anisotropically etching the planarized sacrificial layer to fill the undercut region 143.

Referring to FIG. 7C, by using the sacrificial patterns 162 as an etching mask, the tunnel insulation layer 160, the charge storage layer 157, and the blocking insulation layer 155 located outside the undercut regions 143 may be removed by the isotropic etching. Consequently, the blocking insulation layer 155a, the charge storage layer 157a, and the tunnel insulation layer 160a remaining in the undercut region 143 are isolated from adjacent blocking insulation layer 155a, charge storage layer 157a, and tunnel insulation layer 160a disposed in above and/or below adjacent undercut region 143. Then, the sacrificial patterns 162 may be removed.

Alternatively, the tunnel insulation layer 160, the charge storage layer 157, and the blocking insulation layer 155 located outside the undercut regions 143 may also be removed by the anisotropic etching. In this case, the sacrificial patterns 162 may not be required.

The following methods may be carried out in the same manner as described with reference to FIG. 4E. Also, the active patterns 165 may be formed to have the protrusion 166 extending in the undercut region 143. The methods can thus realize the semiconductor memory device of FIG. 3B.

Figure 8:
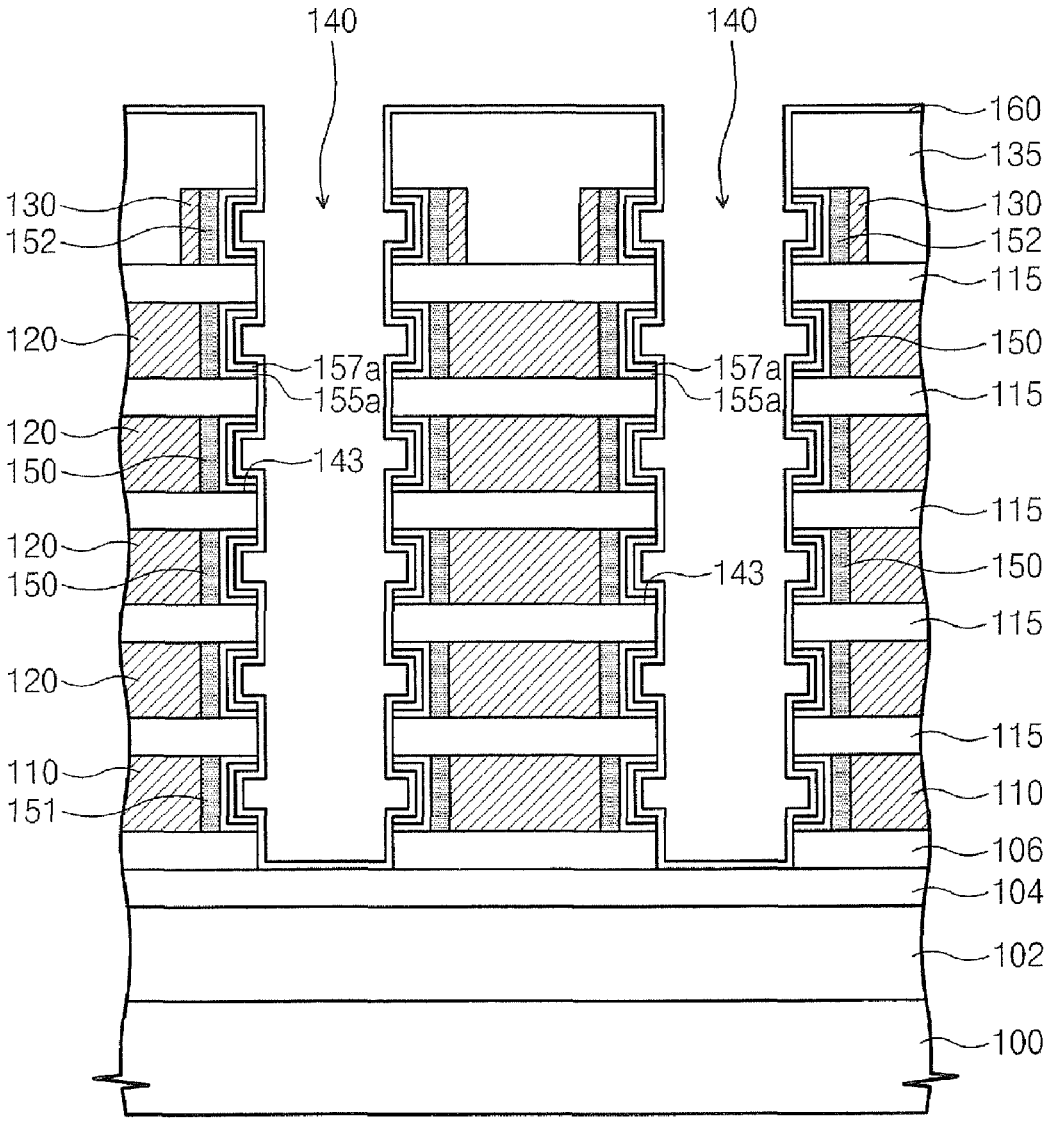
FIG. 8 is a cross-sectional view to explain methods of foaming the semiconductor memory device illustrated in FIG. 3C.

FIG. 8 is a process cross-sectional view to explain methods of forming the semiconductor memory device illustrated in FIG. 3C. The methods of foaming the semiconductor memory device may include the methods described with reference to FIG. 3C.

Referring to FIG. 8, the nitridation process is carried out on the substrate 100 having the undercut regions 143 to form the conductive barriers 150, 151, and 152. The method of forming the conductive barriers 150, 151, and 152 in the undercut regions 143 may be the same as described with reference to FIG. 7B.

Subsequently, the blocking insulation layer 155 and the charge storage layer 157 may be conformally formed on the substrate 100. The blocking insulation layer 155 and the charge storage layer 157 may be formed to have a substantially uniform thickness along an inner surface of the opening 140 and the undercut region 143.

The charge storage layer 157 and the blocking insulation layer 155 outside the undercut regions 143 may be removed. For this reason, the blocking insulation layer 155a and the charge storage layer 157a remaining in the undercut region 143 may be isolated from the adjacent blocking insulation layer 155a and charge storage layer 157a disposed in the above and/or below adjacent undercut region 143. The charge storage layer 157 and the blocking insulation layer 155 may be removed by the anisotropic etching or the isotropic etching using the sacrificial patterns.

Subsequently, the tunnel insulation layer 160 may be conformally formed on the substrate 100. Then, the tunnel insulation layer 160 formed on the bottom of the opening 140 may be removed. At this time, the tunnel insulation layer 160 may remain as it is, located on the sidewalls of the charge storage layer 157a and the insulation patterns 115 in the opening 140.

The following methods may be carried out in the same manner as described with reference to FIG. 4E. The methods can thus realize the semiconductor memory device of FIG. 3C.

Various embodiments illustrate different cell gate patterns.

Figure 9:
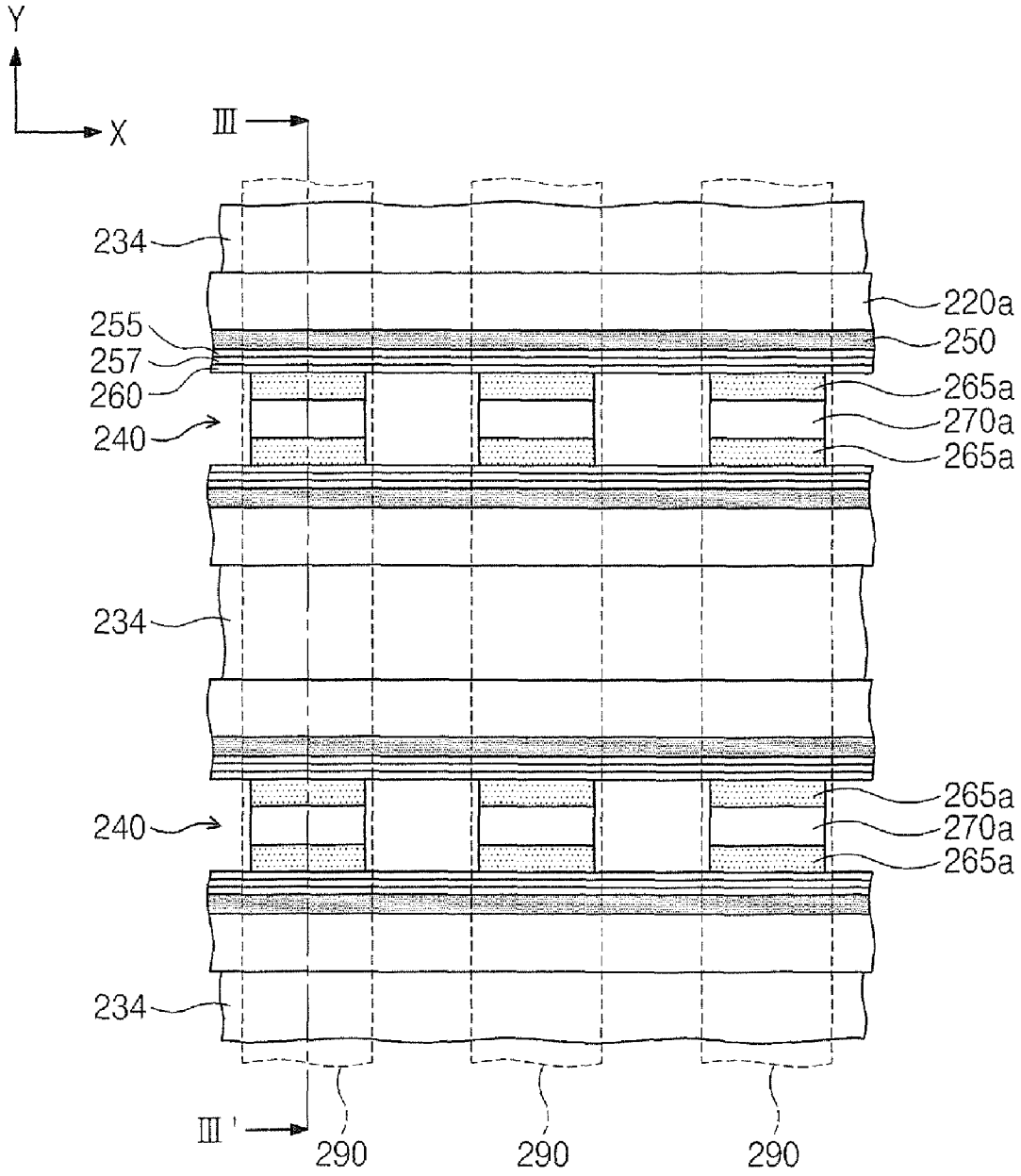
FIG. 9 is a plan view illustrating a semiconductor memory device according to some embodiments of the present invention.
Figure 10:
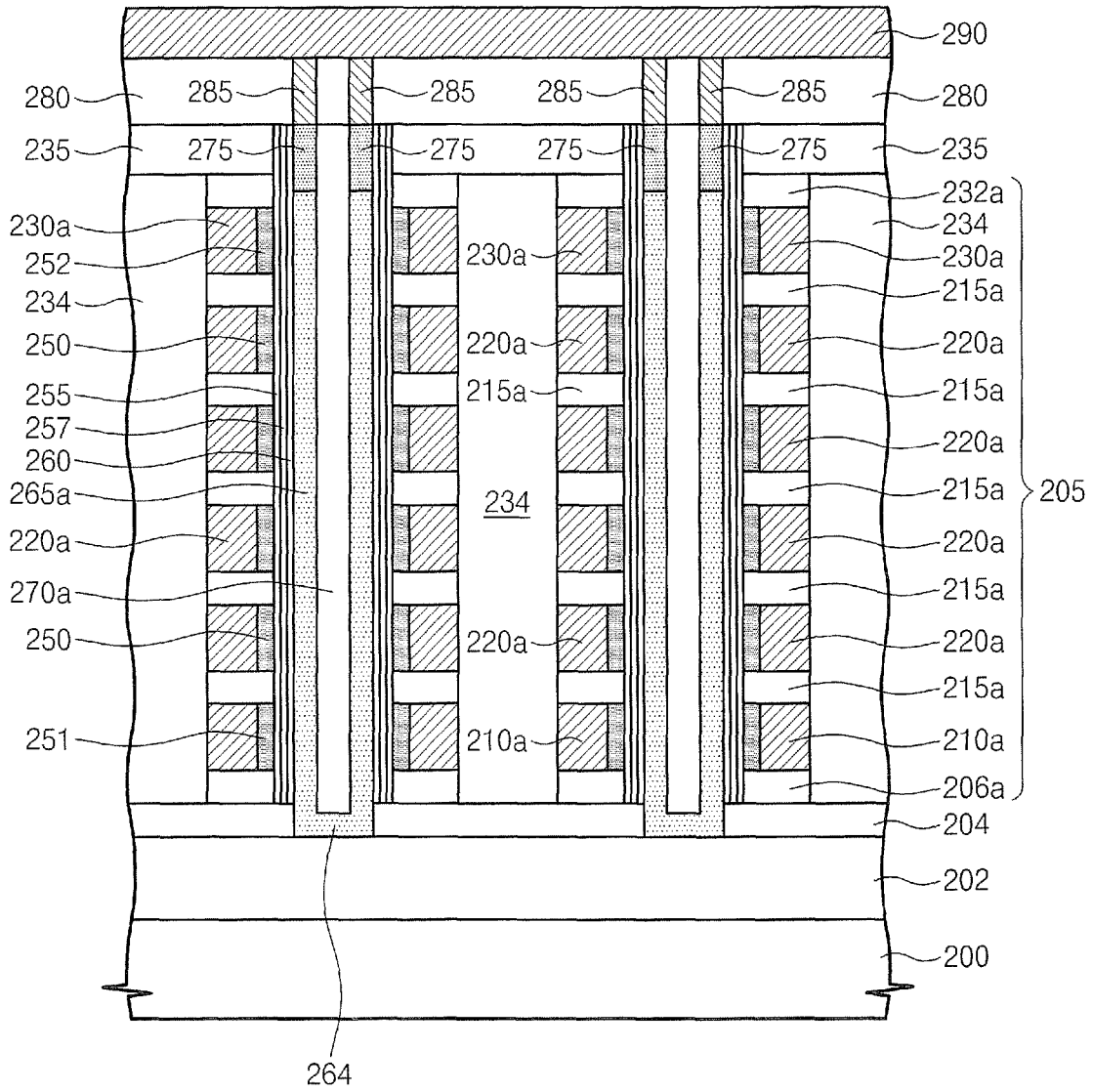
FIG. 10 is a cross-sectional view taken along a line III-III' of FIG. 9.

FIG. 9 is a plan view illustrating a semiconductor memory device according to some embodiments of the present invention, and FIG. 10 is a cross-sectional view taken along a line III-III' of FIG. 9.

Referring to FIGS. 9 and 10, a well region 202, which is doped with a first-conductive-type dopant, is disposed in a substrate 200, and a common source region 204, which is doped with a second-conductive-type dopant, is disposed in the well region 202. A plurality of device isolation patterns 234 extend along a first direction (X-axis) in parallel with one another. The device isolation patterns 234 are spaced apart from each other in a second direction (Y-axis) perpendicular to the first direction (X-axis). A pair of gate stacks 205 is disposed on the substrate 200 between a pair of adjacent device separation patterns 234. The pair of gate stacks 205 extends along the first direction (X-axis) in parallel with each other. The pair of gate stacks 205 is spaced apart from each other along the second direction (Y-axis) to define an opening 240. The opening 240 may be a form of groove extending in the first direction (X-axis). The pair of gate stacks 205 is symmetrical to each other on the basis of the opening 240.

The gate stack 205 may include a base insulation layer 206a, a first selection gate pattern 210a, insulation patterns 215a, cell gate patterns 220a, a second selection gate pattern 230a, and a capping insulation pattern 232a. The first selection gate pattern 210a is disposed on the base insulation pattern 206a, and the insulation patterns 215a and the cell gate patterns 220a are alternately stacked on the first selection gate pattern 210a. The second selection gate pattern 230a is disposed on the uppermost one of the insulation patterns 215a, and the capping insulation pattern 232a is disposed on the second selection gate pattern 230a. The cell gate pattern 220a may form a line extending in the first direction (X-axis). The first and second selection gate patterns 210a and 230a may also form a line extending in the first direction (X-axis). The first interlayer insulation layer 235 may be disposed on the substrate 200. The first interlayer insulation layer 235 covers the gate stacks 205 and the device isolation patterns 234. The opening 240 extends upward to penetrate the first interlayer insulation layer 235.

An active pattern 265a may be disposed in the opening 240. The active pattern 265a extends upward along sidewalls (sidewalls of the gate patterns 210a, 220a, and 230a and sidewalls of the insulation patterns 206a, 215a, and 232a) of the gate stacks 205. A pair of active patterns 265a is spaced apart from each other to face each other. The pair of active patterns 265a may extend upward along sidewalls of the pair of gate stacks 205. The pair of active patterns 265a may be disposed on both edges of an active plate 264 disposed on the bottom of the opening 240. The pair of active patterns 265a may be connected to both edges of the active plate 264 without a boundary. The active plate 264 may come in contact with the common source region 204. In addition, the opening 240 extends downward to penetrate the common source region 204, and the active plate 264 may come in contact with the well region 202. For this reason, the active pattern 265a may electrically be connected to the well region 202 in two directions. A drain region 275 doped with a second dopant may be disposed on an upper end of the active pattern 265a. A pair of vertical-type cell strings includes the pair of active patterns 265a. The pair of active patterns 265a and the active plate 264 may be defined as one active pattern group. A plurality of active pattern groups is disposed in the opening 240 so as to be spaced apart from each other in the first direction (X-axis). A filling insulation pattern 270a may be interposed between the pair of active patterns 265a.

Meanwhile, the pair of active patterns 265a may be substituted by one pillar-type active pattern. The pillar-type active pattern has a pair of lateral sides facing each other. The pair of lateral sides in the pillar-type active pattern extends upward along sidewalls of the pair of gate stacks 205. In such cases, the filling insulation pattern 270a may be omitted. The plurality of pillar-type active patterns may be disposed in the opening 240 so as to be spaced apart from each other in the first direction (X-axis).

Referring subsequently to FIGS. 9 and 10, the charge storage layer 257 is interposed between the cell gate pattern 220a and the active pattern 265a, and the blocking insulation layer 255 is interposed between the charge storage layer 257 and the cell gate pattern 220a. The tunnel insulation layer 260 is interposed between the charge storage layer 257 and the active pattern 265a. The blocking insulation layer 255, the charge storage layer 257, and the tunnel insulation layer 260 may be formed of the same materials as the blocking insulation layer 155, the charge storage layer 157, and the tunnel insulation layer 160 of FIGS. 1, 2A and 2B.

A conductive barrier 250 may be interposed between the cell gate pattern 220a and the blocking insulation layer 255. The conductive barrier 250 contains nitrogen. When the cell gate pattern 220a contains metals, the conductive barrier 250 may contain metal nitride. The cell gate pattern 220a and the conductive barrier 250 may contain the same metals. The conductive barrier 250 may be a form of line extending in the first direction (X-axis).

Layers 255, 257, and 260 between the first selection gate pattern 210a and the active pattern 265a may be utilized as a first insulation layer of a first selection transistor, while layers 255, 257, and 260 between the second selection gate pattern 230a and the active pattern 265a may be utilized as a second insulation layer of a second selection transistor. A first selective-conductive barrier 251 is interposed between the first selection gate pattern 210a and the first gate insulation layer 255, 257 and 260; and a second selective-conductive barrier 252 is interposed between the second selection gate pattern 230a and the second gate insulation layer 255, 257 and 260. When the first and second selection gate patterns 210a and 230a contain metals, the first and second selective-conductive barriers 251 and 252 may contain metal nitrides. The conductive barriers 250, 251, and 252 may be formed of the same materials as the conductive barriers 150, 151, and 152 described with reference to FIGS. 1 and 2A.

A second interlayer insulation layer 280 may be disposed on the entire surface of the substrate 200, and a bit line plug 285 may penetrate the second interlayer insulation layer 280, thereby being connected to the drain region 275. A bit line 290 is disposed on the second interlayer insulation layer 280, thereby being connected to the bit line plug 285. The bit line 290 goes across the gate patterns 210a, 220a, and 230a. A plurality of bit lines 290 may extend in the second direction (Y-axis) in parallel with one another.

The blocking insulation layer 255, the charge storage layer 257, and the tunnel insulation layer 260 may continuously extend, thereby being interposed between the plurality of cell gate patterns 220a and the active pattern 265a.

Figure 11A:
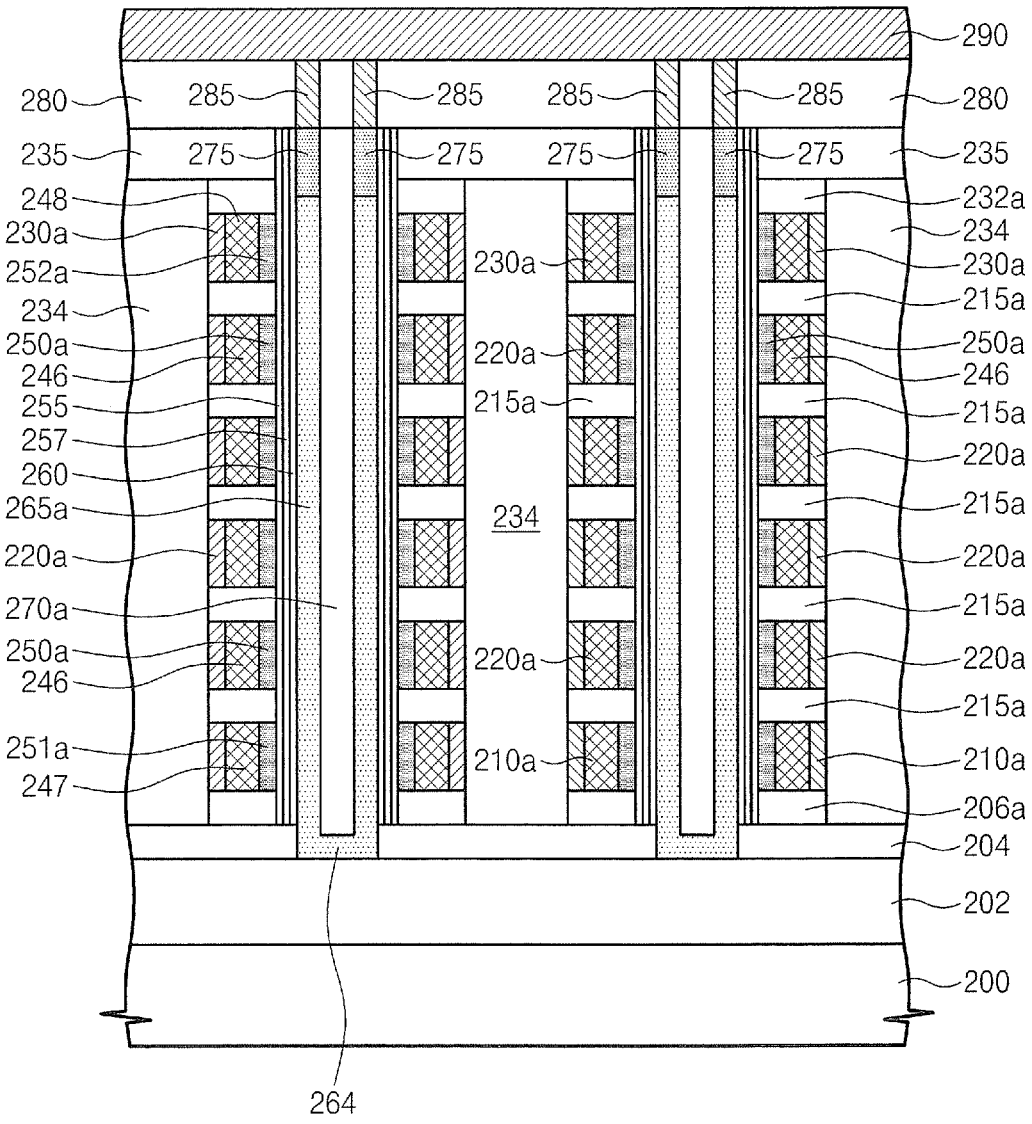
FIG. 11A is a cross-sectional view taken along the line III-III' of FIG. 9 to explain one modification example of the semiconductor memory device according to some embodiments of the present invention.

FIG. 11A is a cross-sectional view taken along the line III-III' of FIG. 9 to explain examples of the semiconductor memory device according to some embodiments of the present invention.

Referring to FIG. 11A, as mentioned in above-described embodiments of the present invention, the gate patterns 210, 220a, and 230a may contain Group 4A elements. In such cases, portions 246, 247, and 248 of the cell gate patterns 210a, 220a, and 230a adjacent to at least the conductive barriers 250a, 251a, and 252a may contain Group 4A element-metal compounds. At this time, the conductive barriers 250a, 251a, and 252a may contain Group 4A element-metal nitrides. All of the gate patterns 210a, 220a, and 230a may be formed of Group 4A element-metal compounds. The Group 4A element-metal compounds of the gate patterns 210a, 220a, and 230a may be the same materials as those of the gate patterns 110, 120, and 130 in FIG. 3A. The conductive barrier 250a, 251a, and 252a may be formed of the same materials as the conductive barriers 150a, 151a, and 152a of FIG. 3A FIG. 11B is a cross-sectional view taken along the line III-III' of FIG. 9 to explain other examples of the semiconductor memory device according to some embodiments of the present invention.

Figure 11B:
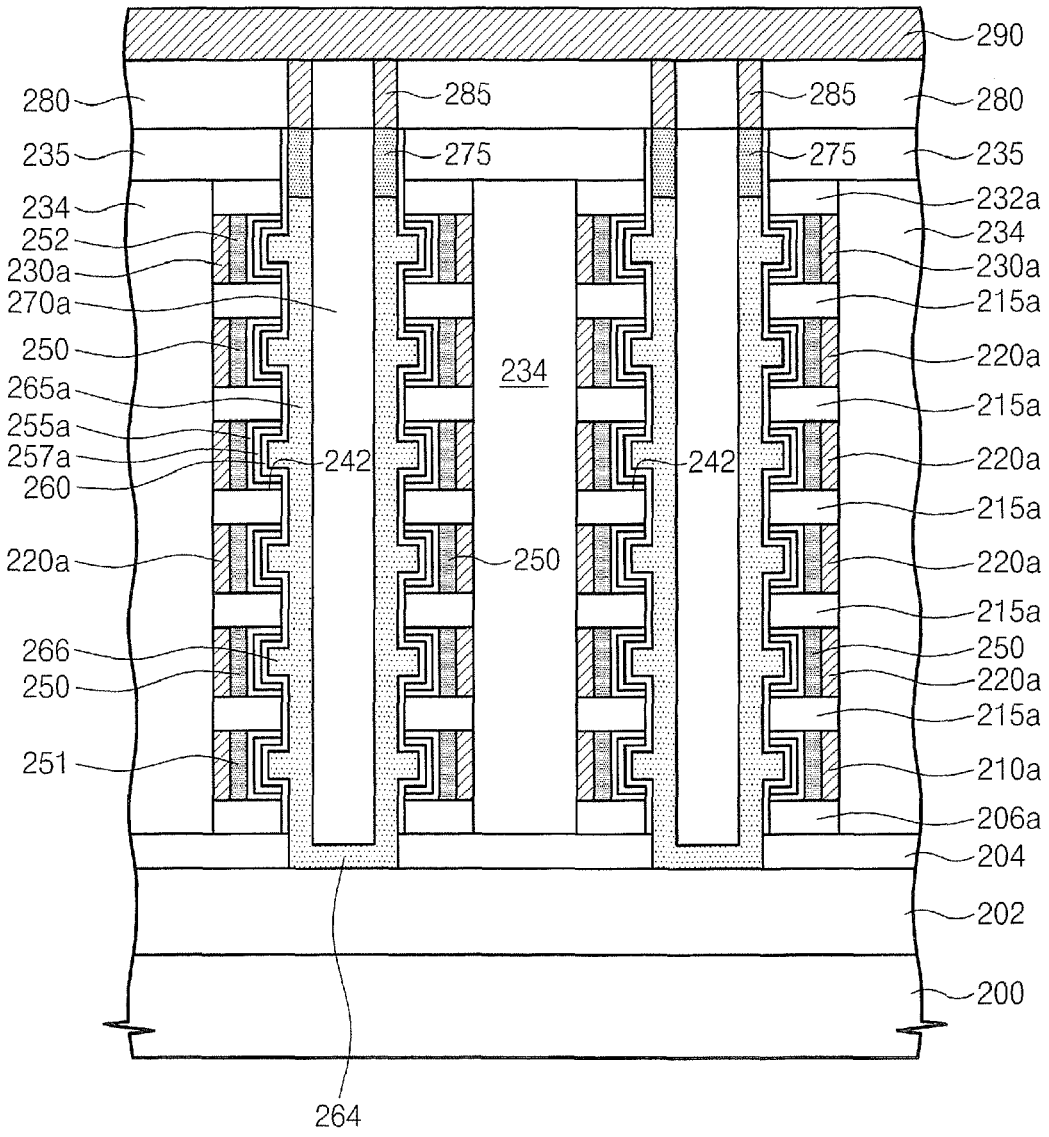
FIG. 11B is a cross-sectional view taken along the line III-III' of FIG. 9 to explain another modification example of the semiconductor memory device according to some embodiments of the present invention.

Referring to FIG. 11B, sidewalls of the gate patterns 210a, 220a, and 230a formed in the opening 140 may be recessed sideward as compared to sidewalls of the insulation patterns 206a, 215a, and 232a. For this reason, the undercut regions 242 may be defined. The conductive barriers 250, 251, and 252 are disposed in the undercut regions 242. The blocking insulation layer 255a and the charge storage layer 257a may be disposed in the undercut region 242. The blocking insulation layer 255a and the charge storage layer 257a may restrictively be disposed in the undercut region 242. That is, the blocking insulation layer 255a and the charge storage layer 257a disposed in the undercut region 242 are isolated from the adjacent blocking insulation layer 255a and charge storage layer 257a disposed in the above and/or below adjacent undercut region 242. The tunnel insulation layer 260 continuously extends, thereby being interposed between the charge storage layers 257a and the active pattern 265a, which are isolated from each other in the opening 240. Alternatively, as illustrated in FIG. 3, the tunnel insulation layers 260 may be isolated from one another, which are disposed in the undercut regions 242. The active pattern 265a may include a protrusion 266 extending in the undercut region 242. As the examples of FIG. 3A and the examples of FIG. 3B may be combined with each other, so the examples of FIG. 11A and the examples of FIG. 11B may be combined with each other.

Methods of forming the semiconductor memory device according to these embodiments of the present invention will now be described with reference to accompanying drawings.

Figure 12A:
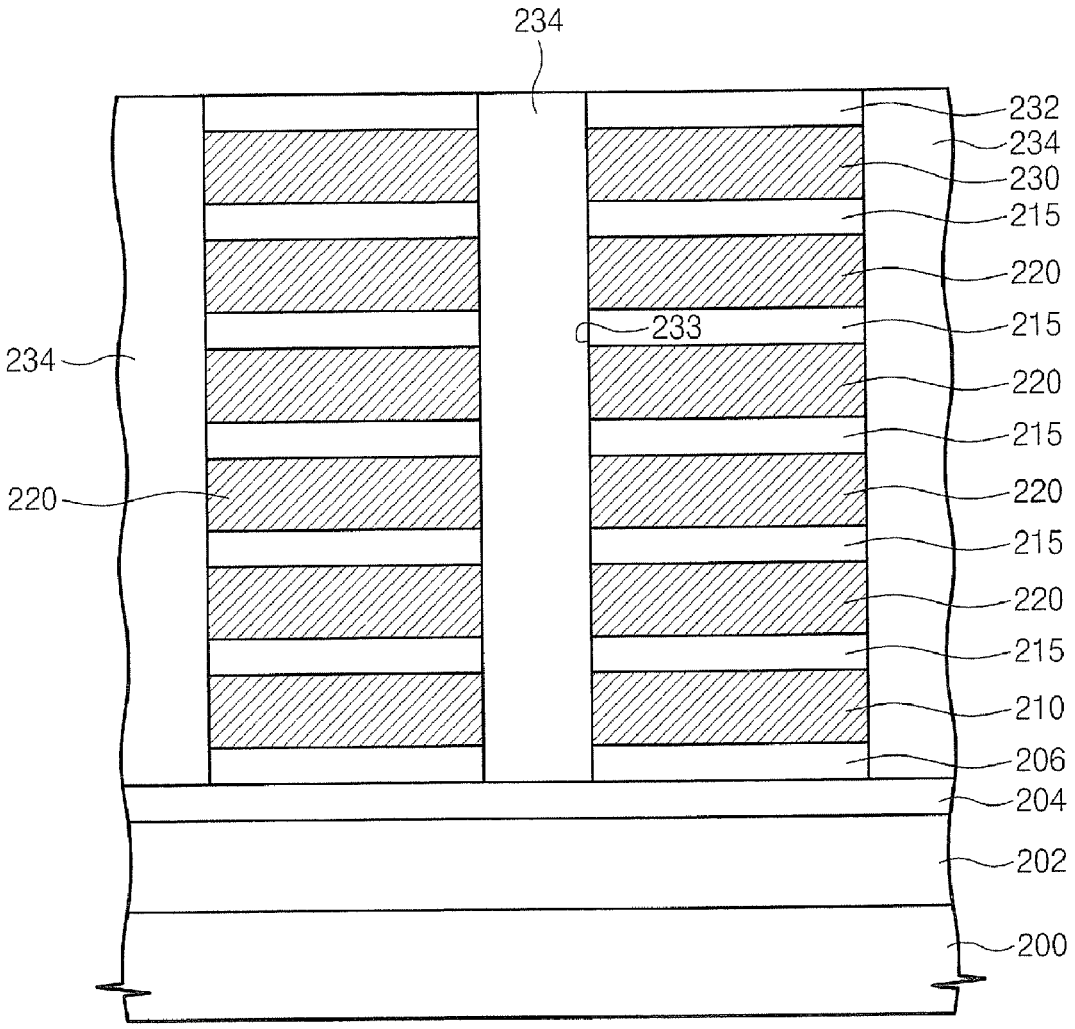
FIGS. 12A to 12C are cross-sectional views taken along the line III-III' of FIG. 9 to explain methods of forming the semiconductor memory device according to some embodiments of the present invention.
Figure 12B:
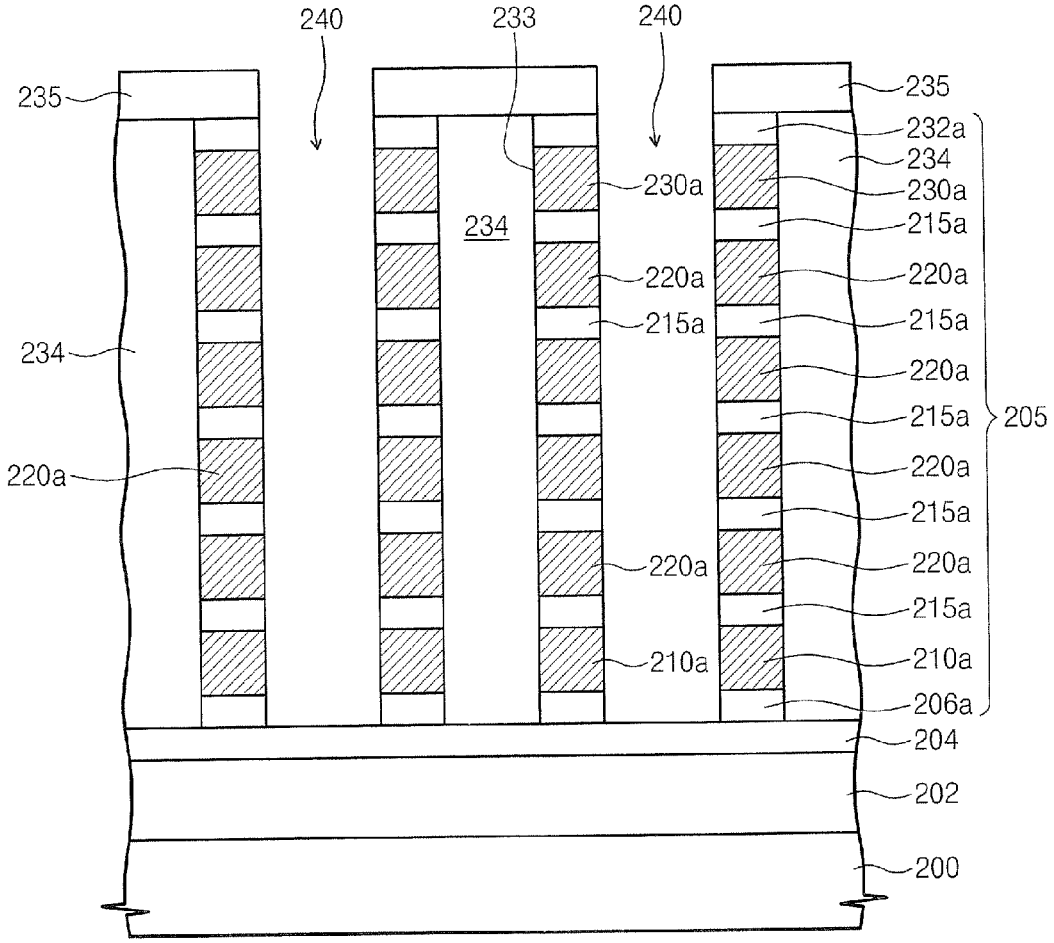
Figure 12C:
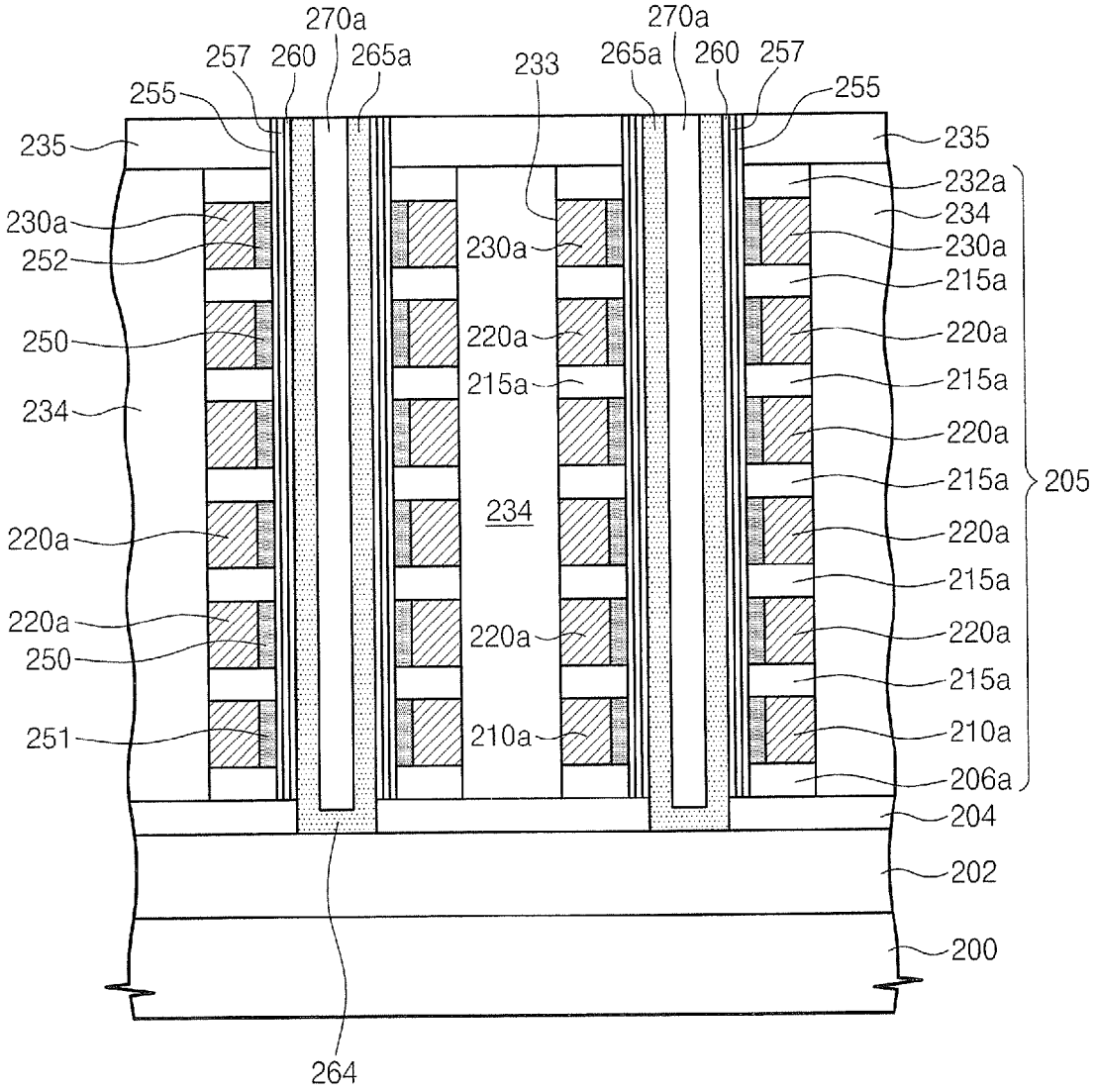

FIGS. 12A to 12C are cross-sectional views taken along the line III-III' of FIG. 9 to explain methods of forming the semiconductor memory device according to some embodiments of the present invention.

Referring to FIG. 12A, a well region 202 may be formed by injecting the first-conductive-type dopants into the substrate 200, and a common source region 204 may be formed by injecting the second-conductive-type dopants into the well region 202. A base insulation layer 206, a first selection gate layer 210, insulation layers 215 and cell gate layers 220 that are alternately stacked, a second selection gate layer 230, and a capping insulation layer 232 are sequentially formed on the substrate 200. A trench is formed by sequentially patterning the layers 232, 230, 220, 215, 210, and 106, and a device isolation pattern 234 is formed. As illustrated in FIG. 9, the device isolation patterns 234 may extend in one direction in parallel with one another. Consequently, the patterned capping insulation layer 232, the second selection gate layer 230, the insulation layers 215, the cell gate layers 220, the first selection gate layer 210, and the base insulation layer 206, which are located between the device isolation patterns 234 adjacent to each other, may be a form of line extending in one direction.

Referring to FIG. 12B, the first interlayer insulation layer 235 may be formed on the entire surface of the substrate 200. The opening 240 is formed by patterning sequentially the patterned layers 232, 230, 215, 220, 210, and 206. The opening 240 may be a form of groove extending in one direction. For this reason, a pair of gate stacks 205 is formed at both sides of the opening 240. The gate stacks 205 are configured of lines extending in one direction. The gate stacks 205 include a base insulation pattern 206a, a first selection gate pattern 210a, insulation patterns 215a and cell gate patterns 220a that are alternately stacked, a second selection gate patterns 230a, and a capping insulation pattern 232a. A portion of the base insulation layer 206 may remain below the opening 240. The remaining portion of the base insulation layer 206 may be a buffer layer.

Referring to FIG. 12C, the conductive barriers 250, 251, and 252 may be formed by carrying out the nitridation process on sidewalls of the gate patterns 210a, 220a, and 230a exposed at both sidewalls of the opening 140. The nitridation process may be equal to that of the above-described embodiments of the present invention. Before carrying out the nitridation process, the sidewalls of the gate patterns 210a, 220a, and 230a may be recessed sideward.

The blocking insulation layer 255, the charge storage layer 257, and the tunnel insulation layer 260 may conformally be formed on the substrate 200 having the conductive barriers 250, 251, and 252. The tunnel insulation layer 260, the charge storage layer 257, and the blocking insulation layer 255 on the bottom of the opening 240 are removed. At this time, the layers 255, 257, and 260 on the sidewalls of the opening 240 remain.

The layers 255, 257, and 260 located on the upper surface of the first interlayer insulation layer 235 may be removed together with the layers 255, 257, and 260 on the bottom of the opening 240. When a buffer layer is arranged below the opening 240, the common source region 204 may be exposed by removing the buffer layer. The well region 202 may be exposed by etching the exposed common source region 204.

The active plate 264 and the pair of active patterns 265a may be formed in the opening 240. The active plate 264 comes in contact with the common source region 204 and the well region 202, and the pair of active patterns 265a extends upward along the sidewalls of the pair of gate stacks 205 from both edges of the active plate 264. The pair of active patterns 265a and the active plate 264 may be formed of doped Group 4A elements (e.g., doped silicon, doped germanium, or doped silicon-germanium). Methods of forming the pair of active patterns 265a and the active plate 264 will be described more fully with reference to FIGS. 13A to 13C.

Figure 13A:
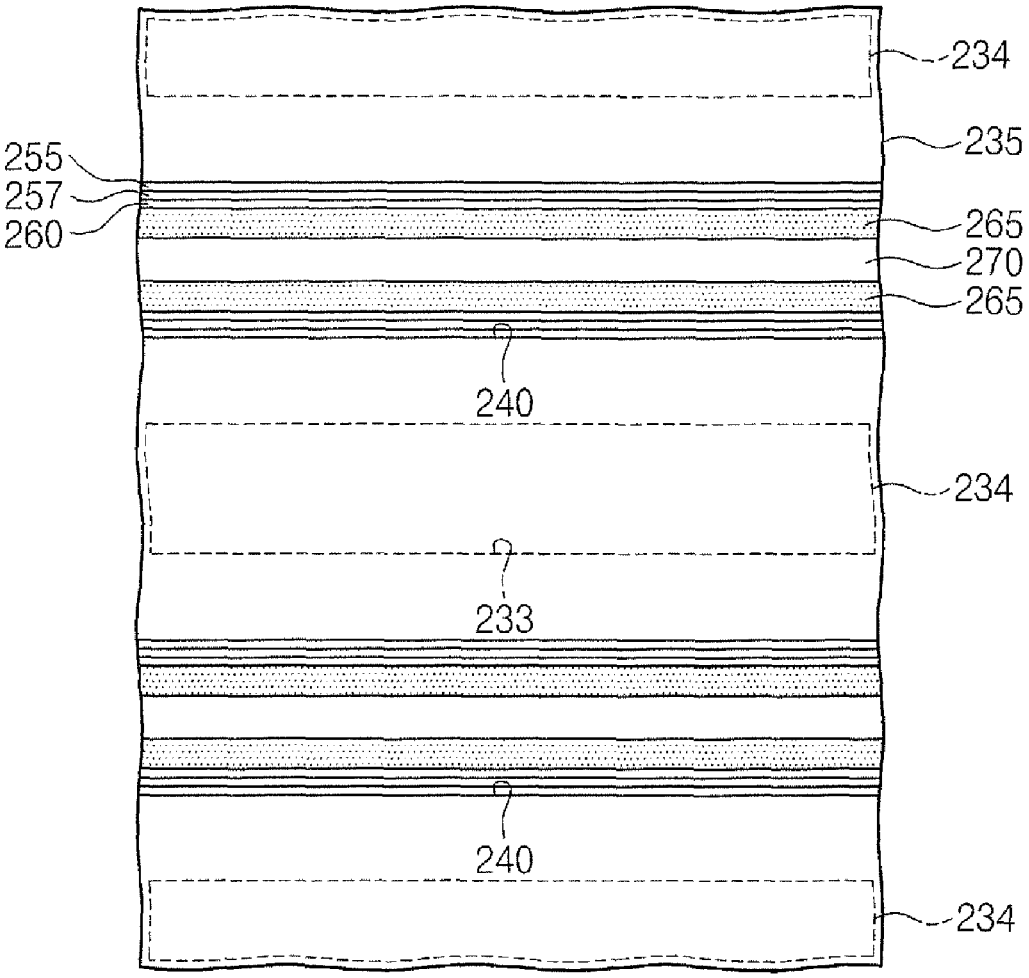
FIGS. 13A to 13C are plan views to explain active patterns of FIG. 12C.
Figure 13B:
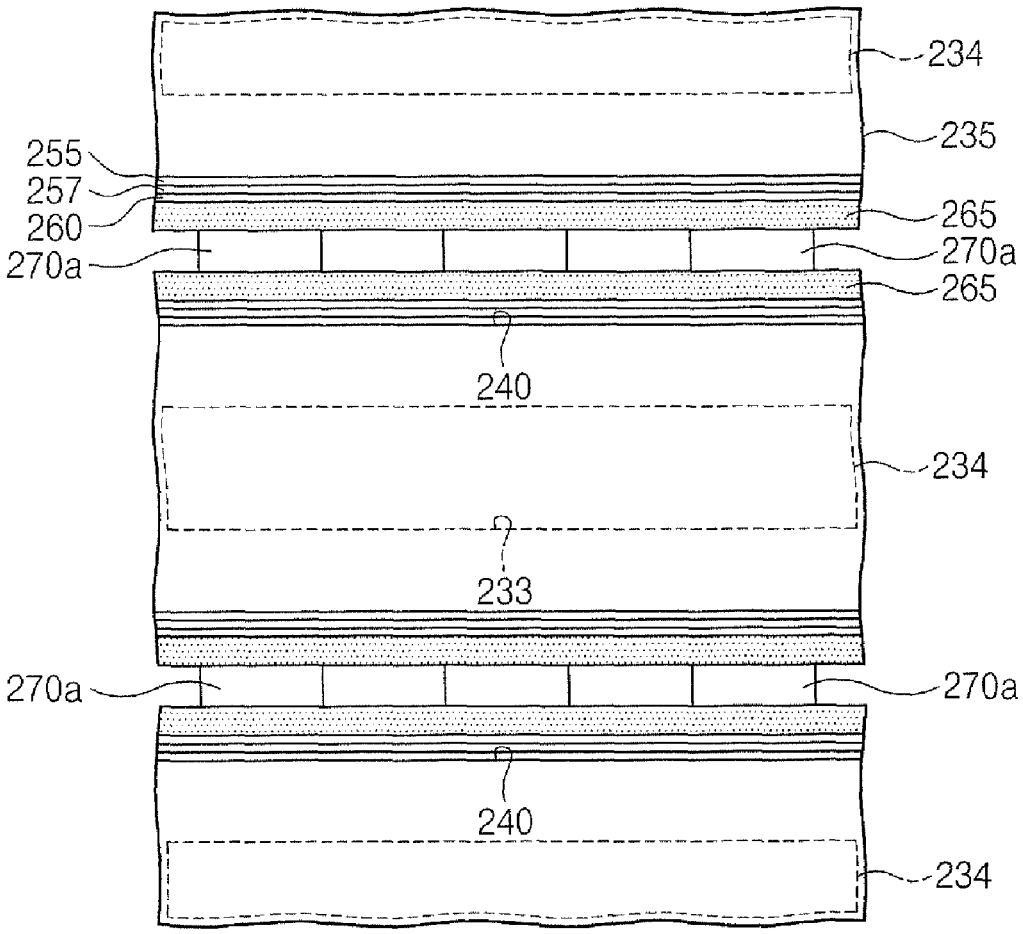
Figure 13C:
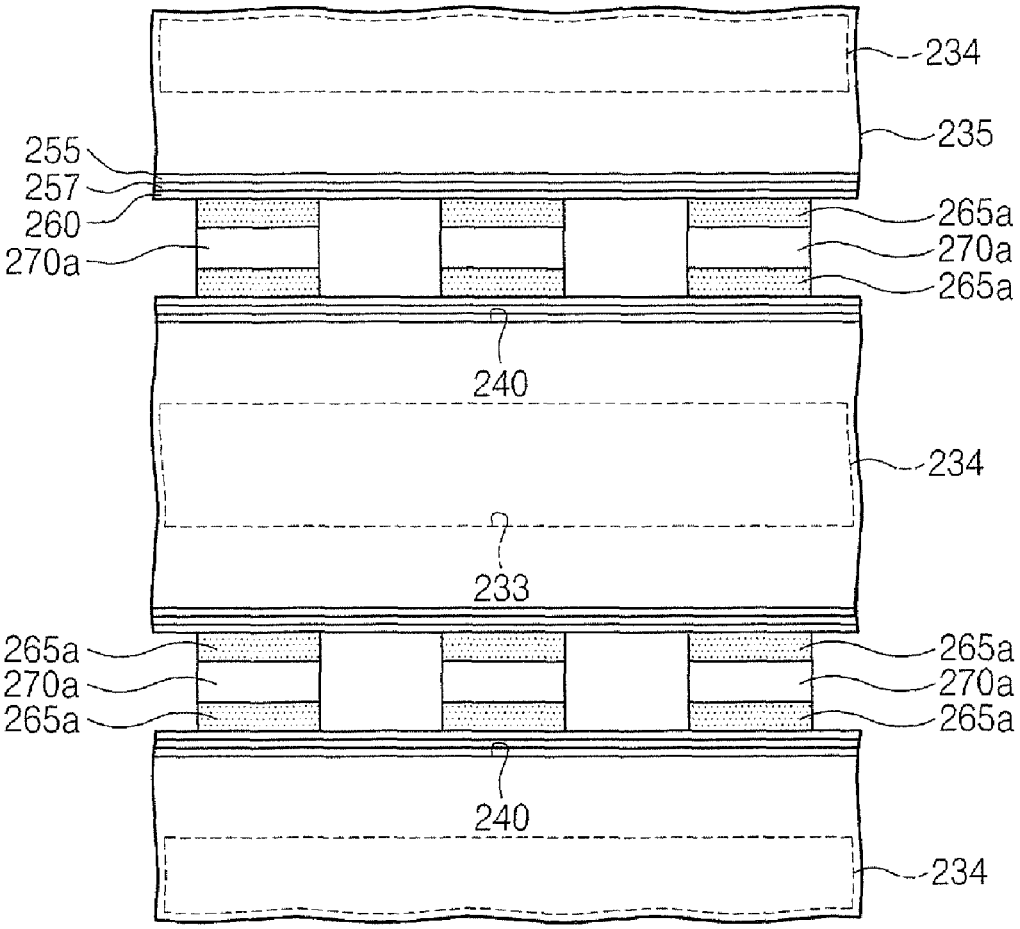

FIGS. 13A to 13C are plan views to explain active patterns of FIG. 12C.

Referring to FIGS. 12C and 13A, an amorphous active layer may conformally be formed on the substrate 200 having the exposed common source region 204 and the exposed well region 202. The amorphous active layer has good step coverage. A crystallization process may be carried out on the amorphous active layer. The amorphous active layer may be changed into a poly crystalline or mono crystalline active layer by the crystallization process. The filling insulation layer is formed on the active layer to fill the opening 140. The crystallization process may be carried out before or after forming the filling insulation layer.

As illustrated in FIG. 13A, a preliminary active pattern 265 and a preliminary filling insulation pattern 270 may be formed in the opening 140 by planarizing the active layer and the filling insulation layer until the first interlayer insulation layer is exposed.

Referring to FIG. 13B, a plurality of filling insulation patterns 270a may be formed in the opening 240 by patterning the preliminary filling insulation pattern 270. The preliminary filling insulation patterns 270a are spaced apart from one another in one direction.

Referring to FIG. 13C, the preliminary active pattern 265 may be isotropically etched by using the filling insulation patterns 270a as an etching mask. As a result, the preliminary active pattern 265 between the filling insulation patterns 270 is removed, thereby forming the pair of active patterns 265a and the active plate 264. The pair of active patterns 265a may be a preliminary active pattern 265 remaining between the filling insulation pattern 270a and the pair of gate stacks 205, and the active plate 264 may be a preliminary active pattern 265 remaining between the filling insulation pattern 270a and the substrate 200. The upper surface of the pair of active patterns 265a may be lower than that of the filling insulation pattern 270a.

Referring subsequently to FIG. 12C, the drain region 275 of FIG. 10 may be formed by injecting the second-conductive-type dopants into the upper ends of the active pattern 265a, and the second interlayer insulation layer 280 of FIG. 10 may be formed to cover the entire surface of the substrate 200. The bit line plug 285 of FIG. 10 is formed, which penetrates the second interlayer insulation layer 280, and the bit line 290 of FIG. 10 is formed on the second interlayer insulation layer 280, thereby being connected to the bit line plug 285. As a result, it may realize the semiconductor memory device of FIG. 8 and FIG. 10.

Figure 14A:
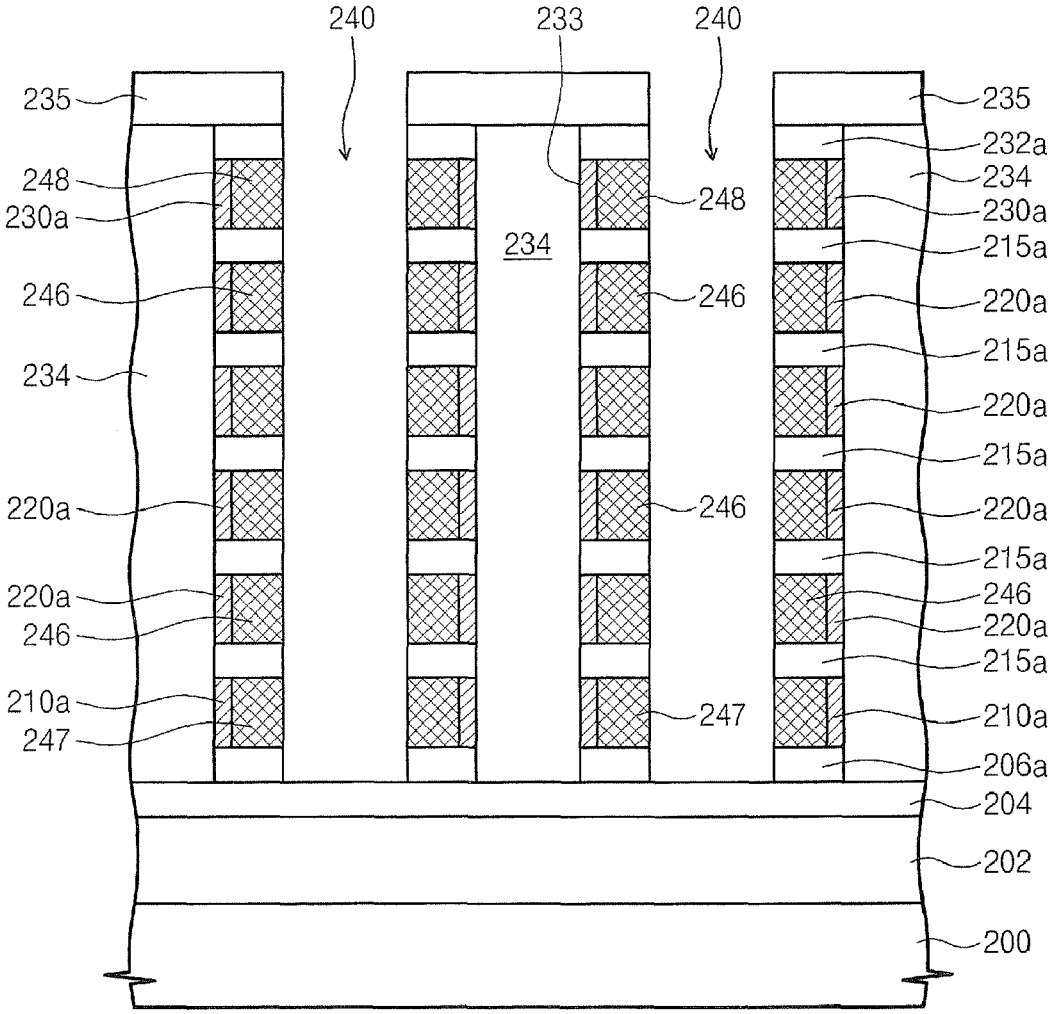
FIG. 14A and FIG. 14B are cross-sectional views to explain methods of forming the semiconductor memory device illustrated in FIG. 11A.
Figure 14B:
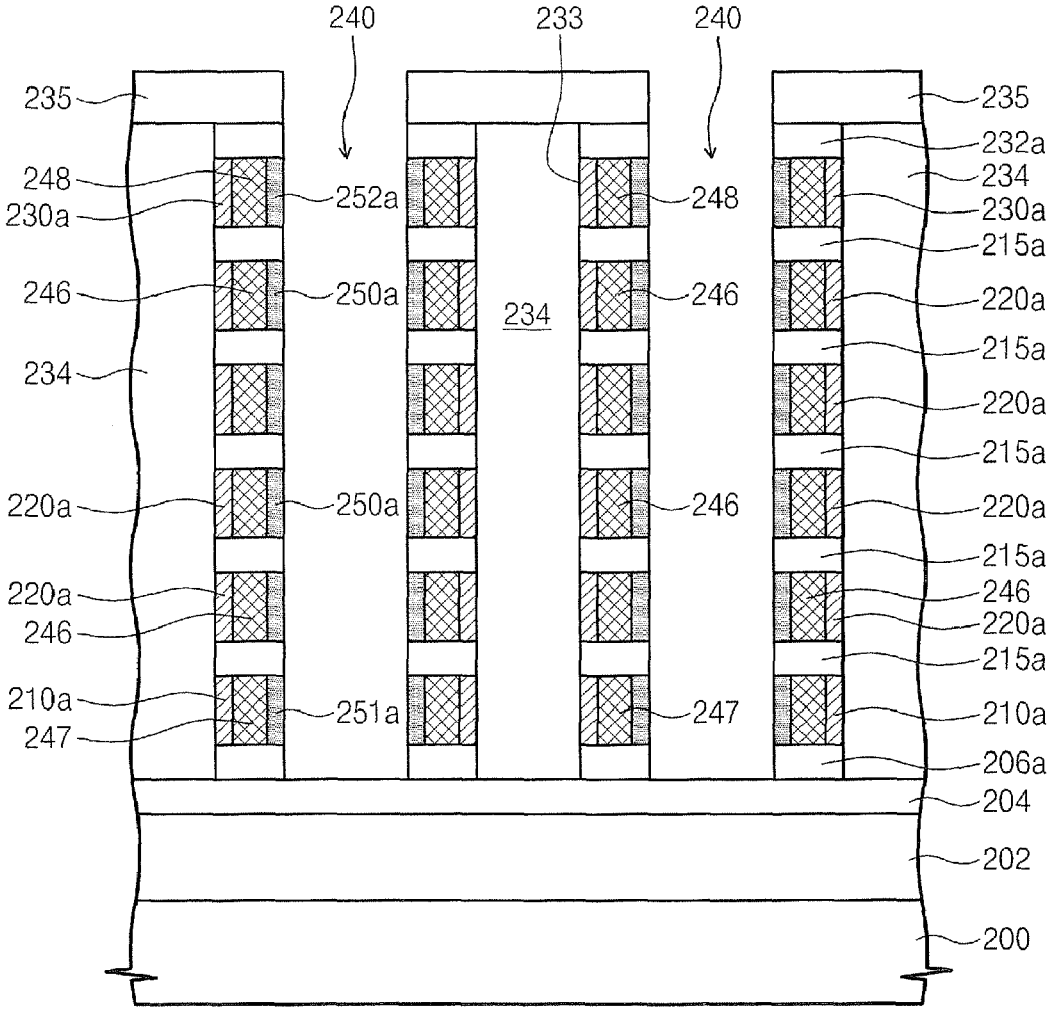

FIGS. 14A and 14B are cross-sectional views to explain methods of forming the semiconductor memory device illustrated in FIG. 11A. The methods of forming the semiconductor memory device of FIG. 11A may include the ways described with reference to FIG. 12A.

Referring to FIGS. 12B and 14A, after forming the opening 240, sidewalls of the gate patterns 210a, 220a, and 230a may be exposed in the opening 240. The gate patterns 210a, 220a, and 230a may be formed of doped Ground 4A elements, for example, doped silicon, doped germanium, or doped silicon-germanium.

The metallization process may be carried out on the sidewalls of the gate patterns 210a, 220a, and 230a exposed in the opening 240. The metallization process may be the same as described with reference to FIG. 6B. That is, a metal layer is formed on the substrate 200 to come in contact with the sidewalls of the gate patterns 210a, 220a, and 230a exposed in the opening 240. The metal layer reacts to the gate patterns 210a, 220a, and 230a. For this reason, at least the parts 246, 247, and 248 of the gate patterns 210a, 220a, and 230a may be formed of Group 4A element-metal compounds. The method of forming the metal layer and the reaction process of the metal layer may be carried out by an in-situ method or an ex-site method. Unreacted metal layer is removed. The metal layer may be formed on the buffer layer below the opening 240 described with reference to FIG. 12. The buffer layer may prevent or inhibit the reaction between the metal layer and the common source region 204.

Before carrying out the metallization process, the exposed sidewalls of the gate patterns 210a, 220a, and 230a may be recessed sideward.

Referring to FIG. 14B, the metallized parts 246, 247, and 248 (that is, parts formed of Ground 4A element-metal compounds) of the gate patterns 210a, 220a, and 230 may be exposed by removing the unreacted metal layer. Then, the conductive barriers 250a, 251a, and 252a may be formed by carrying out the nitridation process on the metallized parts 246, 247, and 248. The conductive barriers 250a, 251a, and 252a may be formed of Group 4A element-metal nitrides.

A process of forming the blocking insulation layer 255 and the following methods may be carried out in the same manner as described with reference to FIG. 12C and FIGS. 13A to 13C. The methods may thereby realize the semiconductor memory device illustrated in FIG. 11A.

Figure 15A:
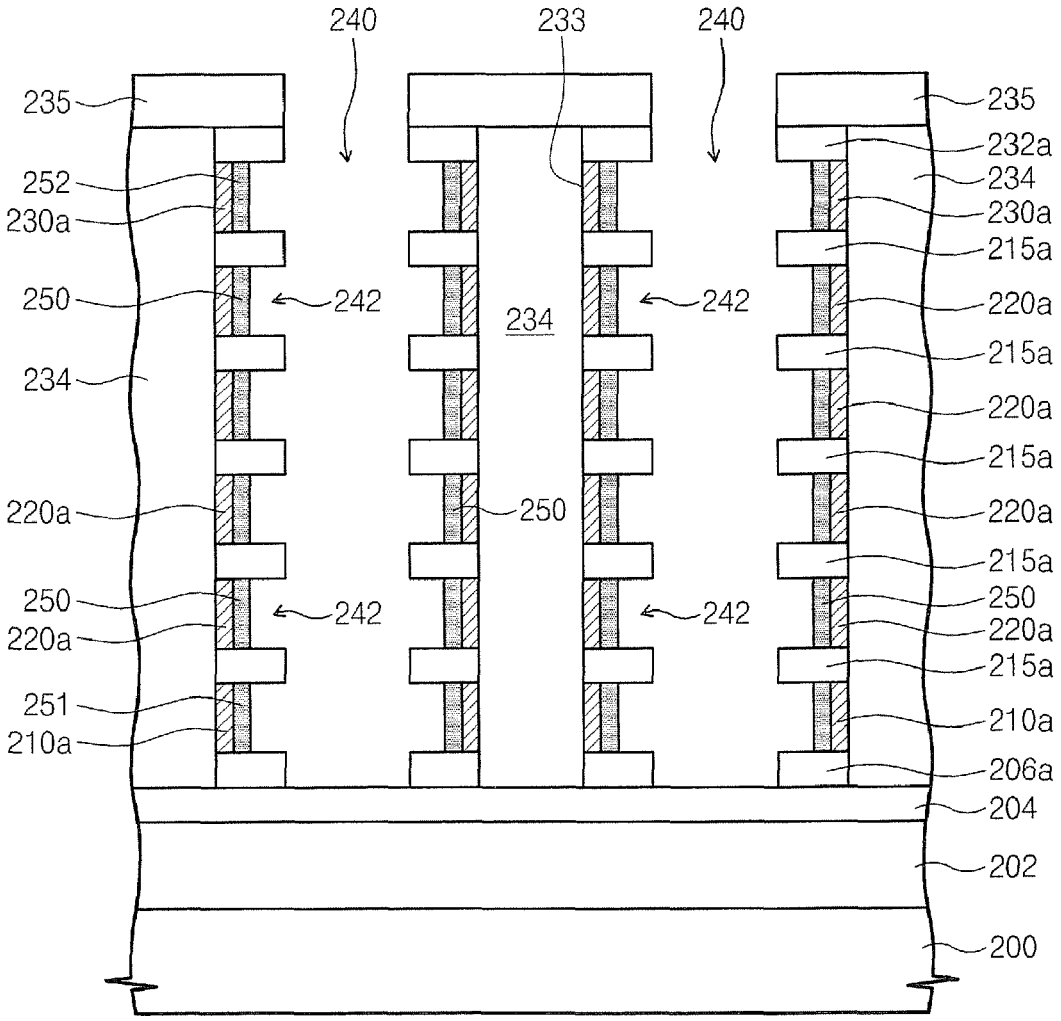
FIG. 15A and FIG. 15B are cross-sectional views to explain methods of forming the semiconductor memory device illustrated in FIG. 11B.
Figure 15B:
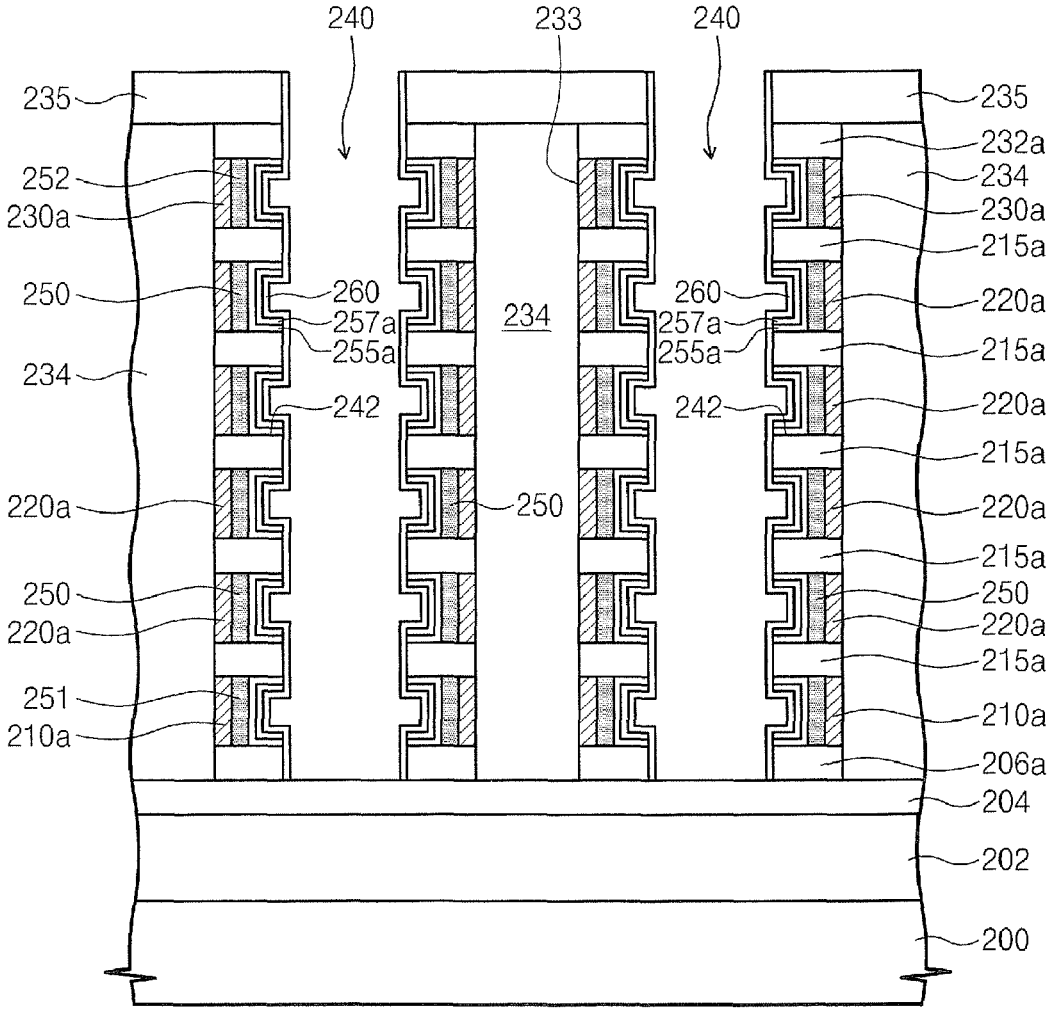

FIGS. 15A and 15B are cross-sectional views to explain methods of forming the semiconductor memory device illustrated in FIG. 11B. These methods may include the methods described with reference to FIGS. 12A and 12B.

Referring to FIGS. 12B and 15A, the undercut regions 242 may be formed by recessing sideward the gate patterns 210a, 220a, and 230a exposed in the opening 240. When the gate patterns 210a, 220a, and 230a contain metals, the conductive barriers 250, 251, and 252 may be formed by carrying out the nitridation process on the recessed sidewalls of the gate patterns 210a, 220a, and 230a. In such cases, the conductive barriers 250, 251, and 252 may be formed of metal nitrides. The nitridation process may be the same as the above-described embodiments of the present invention. The conductive barriers 250, 251, and 252 are formed in the undercut regions 242.

When the gate patterns 210a, 220a, and 230a contain doped Group 4A elements, the metallization process and the nitridation process may sequentially be carried out. In such cases, the conductive barriers 250, 251, and 252 may be formed of Group 4A element-metal nitrides.

The conductive barriers 250, 251, and 252 may fill a portion of the undercut regions 242. That is, other portions of the undercut regions 242 may be in an empty state.

Referring to FIG. 15B, the blocking insulation layer and the charge storage layer may be conformally formed on the substrate 200 in turns. The blocking insulation layer and the charge storage layer may be formed to have a substantially uniform thickness along an inner surface of the opening 240 and the undercut region 242. The blocking insulation layer and the charge storage layer located outside the undercut region 242 are removed. For this reason, the blocking insulation layer 255a and the charge storage layer 257a remaining in the undercut region 242 are isolated from adjacent blocking insulation layer 255a and charge storage layer 257a disposed above and/or below adjacent undercut region 242. The blocking insulation layer and the charge storage layer located outside the undercut region 242 may be removed by the anisotropic etching. Alternatively, the blocking insulation layer and the charge storage layer located outside the undercut region 242 may also be removed by the isotropic etching that uses the sacrificial pattern 162 of FIG. 7B. The blocking insulation layer 255a and the charge storage layer 257a formed restrictively in the undercut region 242 may be formed of the same materials as the blocking insulation layer 155a and the charge storage layer 157a described with reference to FIG. 3B.

Subsequently, the tunnel insulation layer 260 may be conformally formed on the substrate 200, and the tunnel insulation layer 260 formed on the bottom of the opening 240 may be removed. At this time, the tunnel insulation layer 260, which is located on the sidewalls of the insulation patterns 215 in the opening 240, remains. Therefore, the continuously extending tunnel insulation layer 260 may be disposed on the inner sidewall of the opening 240.

Alternatively, the tunnel insulation layer 260 may be formed before removing the blocking insulation layer and the charge storage layer outside the undercut region 242, and all of the blocking insulation layer, the charge storage layer, and the tunnel insulation layer outside the undercut region 242 may also be removed.

A process of forming the active patterns 265a and the following methods may be carried out in the same manner as described with reference to FIGS. 13A to 13C and FIG. 12C. The methods can thereby realize the semiconductor memory device described in FIG. 11B.

In the various embodiments of the present invention, corresponding components may be formed of the same materials.

According to the various embodiments of the present invention, the semiconductor memory devices may be embodied on various types of semiconductor packages. For example, the semiconductor memory devices according to the embodiments of the present invention may be packaged in such manners as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like. According to the embodiments of the present invention, the package on which the semiconductor memory device is mounted may further include a controller controlling the semiconductor memory device and/or a logic device.

Figure 16:
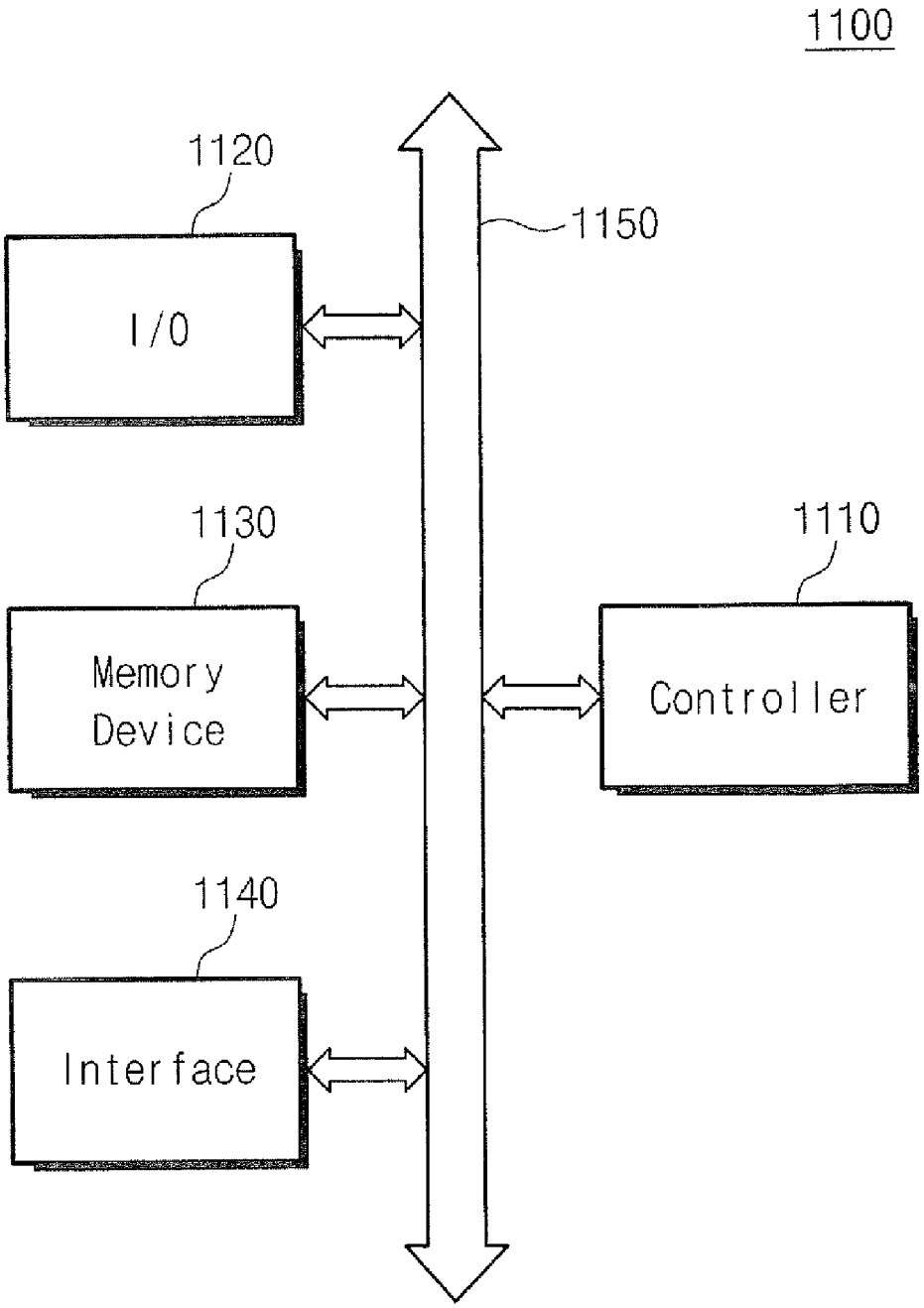
FIG. 16 is a block diagram of an electronic system including semiconductor memory devices according to some embodiments of the present invention.

FIG. 16 is a block diagram of an electronic system including semiconductor memory devices according to the embodiments of the present invention.

Referring to FIG. 16, the electronic system 1100 according to the embodiments of the present invention may include a controller 1110, an input and output (I/O) device 1120, a memory device 1130, an interface 1140, and a bus 1150. The controller 1110, the I/O device 1120, the memory device 1130, and the interface 1140 may be coupled to each other via the bus 1150. The bus 1150 is a transfer pathway of data.

The controller 1110 may include at least one microprocessor, digital signal processor, and/or microcontroller, and at least one logic device that can execute functions similar to these. The I/O device 1120 may include a keypad, a keyboard, and a display device. The memory device 1130 may store data and/or instructions. The memory device 1130 may include at least one of the semiconductor memory devices disclosed in the various embodiments of the present invention. In addition, the memory device 1130 may further include other types of semiconductor memory devices (e.g., phase change memory device, magnetic memory device, DRAM (Dynamic Random Access Memory) device, and/or SRAM (Static Random Access Memory) device). The interface 1140 transmits data to a communication network or receives data from a communication network. The interface 1140 may have a wired or wireless form. For example, the interface 1140 may include an antenna or a wire/wireless transceiver. Although not illustrated in FIG. 16, the electric system 1100 and an operation memory for improving the operation of the controller 1110 may further include high-speed DRAM and/or SRAM The electronic system 1100 is applicable to a mobile system, a personal computer, an industrial computer, or a system carrying out various functions. For example, the mobile system may be a personal digital assistant (PDA), a portable computer, a web tablet, a mobile phone, a wireless phone, a memory card, a digital music system, or electronic products for transmitting/receiving information in wireless environments.

Figure 17:
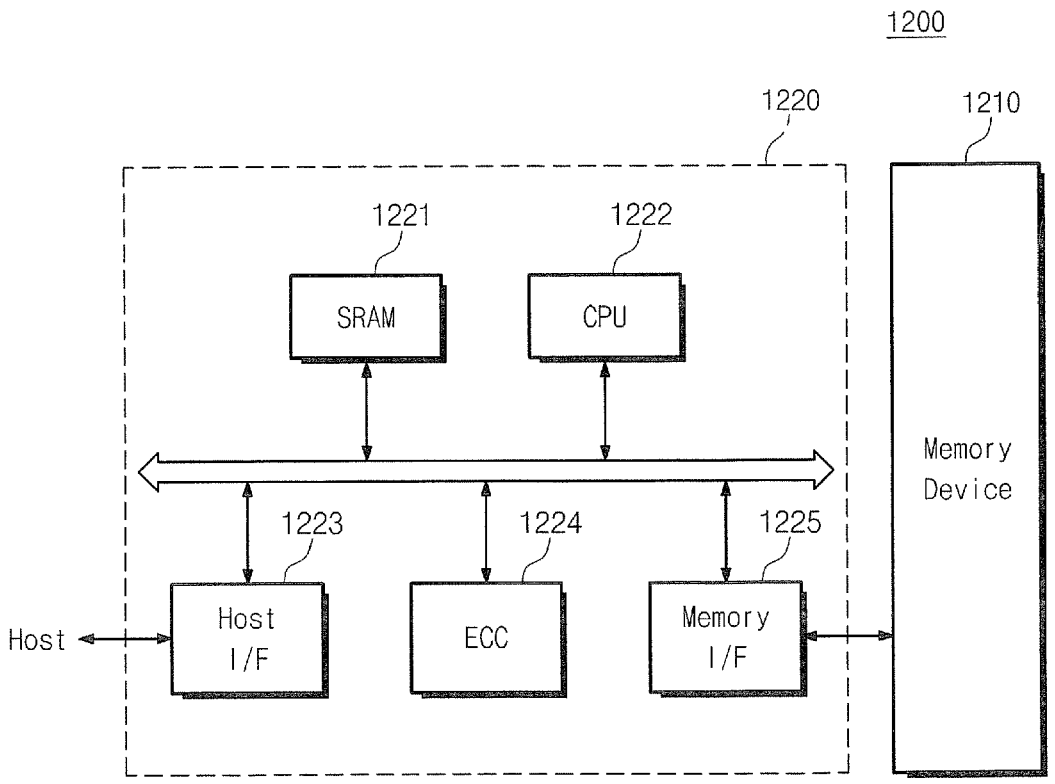
FIG. 17 is a block diagram of a memory card including the semiconductor memory device according to some embodiments of the present invention.

FIG. 17 is a block diagram a memory card including the semiconductor memory device according to some embodiments of the present invention.

Referring to FIG. 17, a memory card 1200 may include a memory device 1210. The memory device 1210 may include a memory controller 1220 for controlling the data exchange between a host and the memory device 1210.

The memory controller 1220 may include a CPU (Central Processing Unit) 1222 for controlling overall operations of the memory card. Furthermore, the memory controller 1220 may include an SRAM 1221 used as an operation memory of the CPU 1222. In addition, the memory controller 1220 may further include a host interface 1223 and a memory interface 1225. The host interface 1223 may be provided with a data exchange protocol between the memory card 1200 and the host. By the memory interface 1225, the memory controller 1220 is connected with the memory device 1210. Moreover, the memory controller 1220 may further include an Error Correction Code (ECC) 1224. The ECC 1224 may detect and correct the errors of data read from the memory device 1210. Even not illustrated in FIG. 17, the memory card 1200 may further include a ROM device that stores code data for interfacing with the host. The memory card 1200 may be used as a portable data storage card. Alternatively, the memory card 1200 may be embodied with a Solid State Disk (SSD) that can exchange with a hard disk of computer system.

As described above, according to various embodiments, the opening may be formed to penetrate the stacked cell gates, and the conductive barriers may be formed on the sidewalls of the cell gate layers by carrying out the nitridation process in the opening. Due to the nitridation process, the conductive barriers may selectively be formed on the sidewalls of the cell gate layers. In addition, the conductive barriers may be formed in the opening in a state of separation.

Although the present invention has been described in connection with various embodiments of the present invention illustrated in the accompanying drawings, it is not limited thereto. It will be apparent to those skilled in the art that various substitutions, modifications and changes may be made thereto without departing from the scope and spirit of the invention.

What is claimed is:

1. A semiconductor memory device comprising:

insulation patterns and cell gate patterns that are alternately stacked on a substrate;

an active pattern disposed on the substrate and extending upward along sidewalls of the insulation patterns and sidewalls of the cell gate patterns;

a charge storage layer interposed between the [sidewall] *sidewalls* of the cell gate [pattern] *patterns* and the active pattern;

a blocking insulation layer interposed between the [sidewall] *sidewalls* of the cell gate [pattern] *patterns* and the charge storage layer;

a tunnel insulation layer interposed between the charge storage layer and the active pattern; and a conductive barrier interposed between the blocking insulation layer and the sidewall of *one of* the cell gate [pattern] *patterns* and containing [nitrogen] *metal nitride*.

2. The semiconductor memory device of claim 1, wherein the *one of the* cell gate [pattern] *patterns* contains metals, [the conductive barrier contains metal nitrides,] and the *one of the* cell gate [pattern] *patterns* and the conductive barrier contain the same metals.

3. The semiconductor memory device of claim 1, wherein a part of [at least] the *one of the* cell gate [pattern] *patterns* coming in contact with the conductive barrier contains Group 4A element-metal compounds, the conductive barrier contains Group 4A element-metal nitrides, and the Group 4A element-metal compounds and the conductive barrier contain the same Group 4A elements and the same metals.

4. The semiconductor memory device of claim 1, wherein the conductive barrier is recessed sideward as compared to the sidewalls of the insulation patterns to define undercut regions, the *charge storage layer comprises a plurality of* charge storage layers *that* are disposed in the undercut regions, respectively, and the charge storage layers disposed in adjacent undercut regions are isolated from each other.

5. The semiconductor memory device of claim 4, wherein the tunnel insulation layer extends into successive undercut regions to be disposed between the charge storage layers that are isolated from each other and the active pattern.

6. The semiconductor memory device of claim 1, wherein the active pattern is disposed in a hole penetrating successively through the insulation patterns and the cell gate patterns, and the cell gate patterns are a form of planar surface.

7. The semiconductor memory device of claim 1, wherein the cell gate patterns form lines extending along one direction in parallel with an upper surface of the substrate.

*8. A semiconductor memory device comprising:*

*insulation patterns and cell gate patterns that are alternately stacked on a substrate;*

*an active pattern disposed on the substrate and extending upward along sidewalls of the insulation patterns and sidewalls of the cell gate patterns;*

*a charge storage layer interposed between the sidewalls of the cell gate patterns and the active pattern;*

*a blocking insulation layer interposed between the sidewalls of the cell gate patterns and the charge storage layer;*

*a tunnel insulation layer interposed between the charge storage layer and the active pattern; and*

*a conductive barrier interposed between the blocking insulation layer and the sidewall of one of the cell gate patterns and containing nitrogen,*

*wherein the blocking insulation layer includes a plurality of layers, and includes metal oxide.*

*9. The semiconductor memory device of claim 8, wherein at least one of the plurality of layers includes aluminum oxide, hafnium oxide or lanthanum oxide.*

*10. The semiconductor memory device of claim 8, wherein the plurality of layers includes a first layer having aluminum oxide and a second layer having oxide.*

*11. The semiconductor memory device of claim 8, wherein the blocking insulation layer includes an insulation material having a higher dielectric constant than the tunnel insulation layer.*

*12. The semiconductor memory device of claim 8, further comprising:*

*a first selection gate pattern disposed between the substrate and a lowermost one of the insulation patterns; and*

*a second selection gate pattern disposed on an uppermost one of the insulation patterns.*

*13. A semiconductor memory device comprising:*

*a substrate;*

*a first insulation pattern disposed on the substrate;*

*a first selection gate pattern disposed on the first insulation pattern;*

*a plurality of second insulation patterns and a plurality of cell gate patterns that are alternately stacked on the first selection gate pattern;*

*an active pattern disposed on the substrate and extending upward along sidewalls of the plurality of second insulation patterns and sidewalls of the plurality of cell gate patterns;*

*a blocking insulation layer disposed on the sidewalls of the plurality of second insulation patterns and the sidewalls of the plurality of cell gate patterns;*

*a charge storage layer disposed on a sidewall of the blocking insulation layer;*

*a tunnel insulation layer disposed on a sidewall of the charge storage layer and disposed between the charge storage layer and the active pattern;*

*a conductive barrier disposed between the blocking insulation layer and the sidewall of one of the plurality of cell gate patterns, and including nitrogen; and*

*a second selection gate pattern disposed on an uppermost one of the plurality of second insulation patterns,*

*wherein the charge storage layer is disposed between the blocking insulation layer and the tunnel insulation layer,*

*wherein the blocking insulation layer is disposed between the charge storage layer and the sidewalls of the plurality of second insulation patterns and between the charge storage layer and the sidewalls of the plurality of cell gate patterns, and*

*wherein the blocking insulation layer includes aluminum oxide, hafnium oxide or lanthanum oxide.*

*14. The semiconductor memory device of claim 13, wherein the blocking insulation layer includes a plurality of layers.*

*15. The semiconductor memory device of claim 13, wherein the blocking insulation layer includes a first layer having aluminum oxide and a second layer having oxide.*

*16. The semiconductor memory device of claim 13, wherein the blocking insulation layer includes an insulation material having a higher dielectric constant than the tunnel insulation layer.*

*17. A semiconductor memory device comprising:*

*a substrate;*

*a plurality of insulation patterns and a plurality of cell gate patterns that are alternately stacked on the substrate;*

*an active pattern disposed on the substrate and extending upward along sidewalls of the plurality of insulation patterns and sidewalls of the plurality of cell gate patterns;*

*a blocking insulation layer disposed on the sidewalls of the plurality of insulation patterns and the sidewalls of the plurality of cell gate patterns;*

*a charge storage layer disposed on a sidewall of the blocking insulation layer;*

*a tunnel insulation layer disposed on a sidewall of the charge storage layer and disposed between the charge storage layer and the active pattern; and*

*a conductive barrier disposed between the blocking insulation layer and the sidewall of one of the plurality of cell gate patterns, and including nitrogen,*

*wherein the charge storage layer is disposed between the blocking insulation layer and the tunnel insulation layer,*

*wherein the blocking insulation layer is disposed between the charge storage layer and the sidewalls of the plurality of insulation patterns and between the charge storage layer and the sidewalls of the plurality of cell gate patterns,*

*wherein each of the plurality of cell gate patterns has a planar surface,*

*wherein the active pattern is enclosed by the plurality of insulation patterns and the plurality of cell gate patterns, and*

*wherein the blocking insulation layer includes an insulation material having a higher dielectric constant than the tunnel insulation layer.*

*18. The semiconductor memory device of claim 17, wherein the blocking insulation layer includes a plurality of layers, and includes metal oxide.*

*19. The semiconductor memory device of claim 17, wherein a cross section of the active pattern is square-shaped, circle-shaped, oval-shaped, or polygon-shaped.*

* * * * *